(12) United States Patent
Takahashi et al.

(10) Patent No.: US 8,498,766 B2
(45) Date of Patent: Jul. 30, 2013

(54) CONTROL SYSTEM OF VEHICLE

(75) Inventors: Kenji Takahashi, Toyota (JP); Yuji Nishi, Nagoya (JP); Shuji Tomura, Nagoya (JP); Takeshi Takemoto, Nagoya (JP); Nobuyasu Haga, Seto (JP); Tetsuya Fuchimoto, Nagoya (JP); Tetsuya Sugimoto, Chiryu (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/381,701

(22) PCT Filed: Jul. 1, 2010

(86) PCT No.: PCT/IB2010/001604
§ 371 (c)(1),
(2), (4) Date: Dec. 30, 2011

(87) PCT Pub. No.: WO2011/001266
PCT Pub. Date: Jan. 6, 2011

(65) Prior Publication Data
US 2012/0109443 A1 May 3, 2012

(30) Foreign Application Priority Data
Jul. 1, 2009 (JP) ................................ 2009-157056

(51) Int. Cl.
*B60L 9/00* (2006.01)
(52) U.S. Cl.
USPC ........................................................ 701/22

(58) Field of Classification Search
USPC ............................................................ 701/22
See application file for complete search history.

(56) References Cited

U.S. PATENT DOCUMENTS

| | | | | |
|---|---|---|---|---|
| 6,158,541 A | * | 12/2000 | Tabata et al. | 180/165 |
| 2008/0059035 A1 | * | 3/2008 | Siddiqui et al. | 701/93 |
| 2008/0300768 A1 | * | 12/2008 | Hijikata | 701/102 |
| 2009/0043467 A1 | * | 2/2009 | Filev et al. | 701/57 |

FOREIGN PATENT DOCUMENTS

| | | |
|---|---|---|
| EP | 2 124 288 A1 | 11/2009 |
| FR | 2 691 019 A1 | 11/1993 |
| JP | 2007-259612 A | 10/2007 |

(Continued)

OTHER PUBLICATIONS

Gregory L. Plett, "Advances in EKF SOC Estimation for LiPB HEV Battery Packs", Copyright 2003 EVS20, pp. 1-12.

(Continued)

*Primary Examiner* — Hussein A. Elchanti
(74) *Attorney, Agent, or Firm* — Sughrue Mion, PLLC

(57) ABSTRACT

A hybrid vehicle (1) includes a battery (10-1), a motor-generator (32-2) operable to produce driving force using electric power of the battery (10-1), a charger (28) operable to charge the battery (10-1) by means of an external power supply, and an ECU (40). The ECU (40) stores a given parameter used in battery model expressions. The parameter varies according to the status of the battery (10-1). During running of the hybrid vehicle (1) and during charging of the battery (10-1) with the external power supply, the ECU (40) collects data related to the status of the battery (10-1), corrects the parameter based on the data, and calculates a value of charging rate (SOC) of the battery (10-1). The ECU (40) controls charge/discharge of the battery (10-1), based on the calculated SOC value.

10 Claims, 28 Drawing Sheets

FOREIGN PATENT DOCUMENTS

| | | |
|---|---|---|
| JP | 2007-2549612 A | 10/2007 |
| JP | 2008-083022 A | 4/2008 |
| WO | WO 99/32323 A1 | 7/1999 |
| WO | WO 2008/026525 A | 3/2008 |
| WO | WO 2008/026525 A1 | 3/2008 |

OTHER PUBLICATIONS

Gregory L. Plett: "Dual and Joint EKF for Simultaneous SOC and SOH Estimation", Copyright 2005 EVS21, pp. 1-13.

Gregory L. Plett: "Extended Kalman filtering for battery management systems of LiPB-based HEV battery packs Part 1. Background", Journal of Power Source 134 (2004), pp. 252-261.

Gregory L. Plett: "Extended Kalman filtering for battery management systems of LiPB-based HEV battery packs Part 2. Modeling and identification", Journal of Power Source 134 (2004), pp. 262-276.

Gregory L. Plett: "Extended Kalman filtering for battery management systems of LiPB-based HEV battery packs Part 3. State and parameter estimation", Journal of Power Source 134 (2004), pp. 277-292.

Gregory L. Plett: "Kalman-Filter SOC Estimation for LiPB HEV Cells", Copyright 2002 EVS19, pp. 1-12.

Gregory L. Plett: "LiPB Dynamic Cell Models for Kalman-Filter SOC Estimation", Copyright 2002 EVS19, pp. 1-12.

Gregory L. Plett: "Results of Temperature-Dependent LiPB Cell Modeling for HEV SOC Esimation", Copyright 2005 EVS21, pp. 1-10.

International Search Report and Written Opinion for corresponding International Patent Application No. PCT/IB2010/001604 mailed Oct. 14, 2011.

* cited by examiner

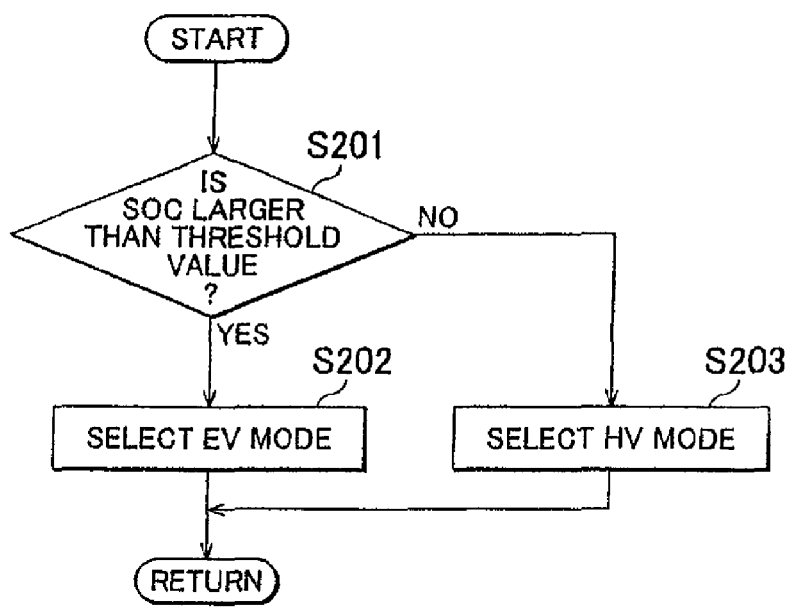
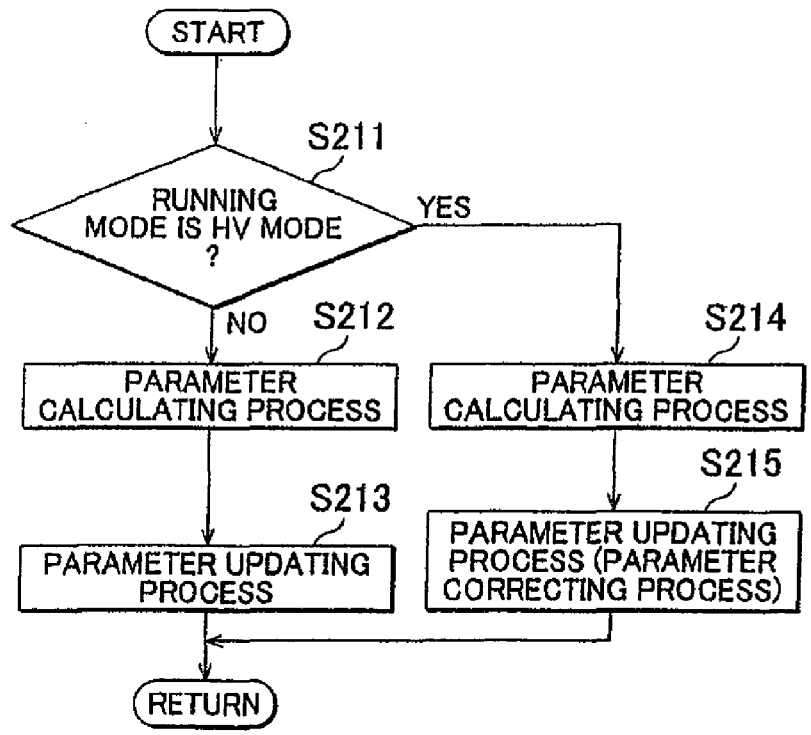

F I G . 22
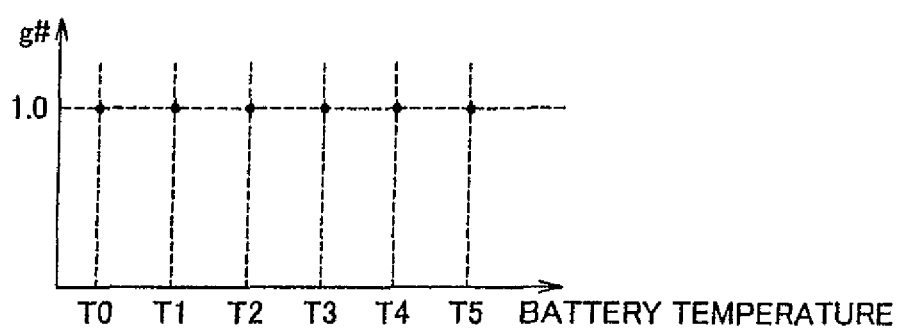

CONTROL SYSTEM OF VEHICLE

FIELD OF THE INVENTION

The invention relates to a control system of a vehicle, and particularly relates to charge/discharge control of a vehicle having a battery, and an electric motor that receives electric power from the battery and produces driving force.

BACKGROUND OF THE INVENTION

In recent years, electrically operated vehicles, such as electric vehicles, hybrid vehicles, and fuel-cell vehicles, have been developed and put to practical use, as environmentally friendly vehicles. The electrically operated vehicles generally include a motor for generating driving force or power, and a storage device that supplies electric power to the motor. In many cases, a secondary battery is used as the storage device of the electrically operated vehicle.

It has also been proposed to charge the storage device (battery) installed on the electrically operated vehicle, using a power supply located outside the vehicle. The electrically operated vehicle having this arrangement will be called "plug-in vehicle". Also, charging the storage device installed on the vehicle by means of the external power supply will be called "plug-in charge".

For the plug-in vehicle, it is desired to extend or increase the driving range or distance over which the vehicle is able to run using electric power stored in the storage device. To this end, two or more batteries, for example, are installed on the plug-in vehicle. For example, Japanese Patent Application Publication No. 2007-259612 (JP-A-2007-259612) discloses a control system for controlling a power supply having a plurality of batteries. The power-supply control system includes a detecting means for detecting the state of charge of each battery, and a charging/discharging means that determines a degradation condition of each battery, based on the output of the detecting means. The charging/discharging means controls a plurality of switches for connection between the respective batteries and a load, based on the degradation condition of each battery. The charging/discharging means controls the plurality of switches so as to equalize the degradation conditions of the respective batteries.

Japanese Patent Application Publication No. 2008-83022 (JP-A-2008-83022) discloses an evaluation system that evaluates a degradation condition of a battery installed on a plug-in vehicle. The evaluation system collects data while the battery is being charged by means of an external power supply located outside the vehicle, and evaluates a degradation condition of the battery, using the data.

For a plug-in vehicle having a plurality of secondary batteries, it is desired to appropriately control charge/discharge of the batteries, based on a degradation condition of each battery. For example, charge/discharge current of each battery, or the amount of electric power that can be supplied to or from the battery, is controlled according to the degradation condition of the battery. However, JP-A-2007-259612 discloses only the technique to select a battery to be used, from the plurality of batteries.

According to JP-A-2008-83022, a degradation condition of the secondary battery is evaluated during plug-in charge. During running of an electrically operated vehicle, frequent switching occurs between discharge and charge of the battery, and, furthermore, the magnitude of battery current varies frequently. It is, therefore, not easy to evaluate a degradation condition of the secondary battery during running of the electrically operated vehicle. On the other hand, the battery is in stable conditions during plug-in charge. Therefore, a degradation condition of the battery can be determined with high accuracy during plug-in charge.

However, when the interval between plug-in charges is long (for example, when there is little chance that the user puts the battery on charge), a deviation or difference between the degradation condition evaluated during plug-in charge and the current condition of the battery may be increased. In this case, too, it is difficult to appropriately control charge/discharge of the battery according to the current battery condition.

SUMMARY OF THE INVENTION

The invention provides a control system that controls charge/discharge of a secondary battery installed on a vehicle, in view of current conditions of the secondary battery.

A first aspect of the invention is concerned with a control system of a vehicle. The vehicle includes an electric motor operable to produce driving force, at least one secondary battery that supplies electric power to the electric motor, and a charging mechanism operable to charge the at least one secondary battery using a power supply located outside the vehicle. The control system includes a data collecting unit, storing unit, first parameter updating unit, second parameter updating unit, charging rate estimating unit, and a discharge control unit. The data collecting unit collects data used in a battery model for estimating the status of the at least one secondary battery. The storing unit stores a given parameter which is used in the battery model and varies according to the status of the at least one secondary battery. The first parameter updating unit calculates the given parameter based on the data collected by the data correcting unit during running of the vehicle, and corrects the given parameter stored in the storing unit, based on a result of the calculation. The second parameter updating unit calculates the given parameter based on the data collected by the data correcting unit when the vehicle is at rest and the at least one secondary battery is charged, and corrects the given parameter stored in the storing unit, based on a result of the calculation. The charging rate estimating unit calculates an estimated value of charging rate of the at least one secondary battery, using the battery model, based on the data collected by the data collecting unit and the given parameter stored in the storing unit. The discharge control unit controls discharge of the at least one secondary battery based on the estimated value of charging rate, during running of the vehicle.

The vehicle may further include a power generating mechanism operable to charge the at least one secondary battery during running of the vehicle. The control system may further include a running mode control unit. The running mode control unit may select one of a first running mode in which the vehicle runs with electric power discharged from the at least one secondary battery, and a second running mode in which the vehicle runs such that the charging rate of the at least one secondary battery is kept within a specified range. The first parameter updating unit may calculate the given parameter and updates the given parameter stored in the storing unit, while the vehicle is running in each of the first and second running modes.

The vehicle may have a plurality of the secondary batteries. The storing unit may store the given parameter associated with each of the plurality of secondary batteries. The control system may further include a degradation level estimating unit and a charge control unit. The degradation level estimating unit may estimate a degradation level of each of the plurality of secondary batteries, based on the given parameter of each of the plurality of secondary batteries, which is stored in the storing unit. The charge control unit may control charge of the plurality of secondary batteries using the external power supply and the charging mechanism. The charge control unit may charge the plurality of secondary batteries, in an increasing order of the degradation level estimated by the degradation level estimating unit.

The discharge control unit may control discharge of the plurality of secondary batteries, such that the secondary batteries are discharged in a decreasing order of the degradation level estimated by the degradation level estimating unit, The above-indicated plurality of secondary batteries may include one main battery and a plurality of sub-batteries. One sub-battery selected from the plurality of sub-batteries, and the one main battery, may be discharged so as to supply electric power to the electric motor in the first running mode, and only the one main battery may be charged and discharged in the second running mode. The running mode control unit may select the first running mode until all of the charging rate estimated values of the one main battery and the plurality of sub-batteries are reduced down to corresponding control targets, and may select the second running mode after all of the charging rate estimated values are reduced down to the corresponding control targets. The discharge control unit may determine the order in which the plurality of sub-batteries are used, based on the degradation level of each of the plurality of sub-batteries, when the first running mode is selected.

When the charging rate estimated value calculated according to the battery model belongs to a first region having a first value as an upper limit, the charging rate estimating unit may calculate the charging rate estimated value so that the charging rate estimated value becomes smaller than a corresponding value calculated according to the battery model. On the other hand, when the charging rate estimated value calculated according the battery model belongs to a second region having, as a lower limit, a second value that is larger than the first value, the charging rate estimating unit may calculate the charging rate estimated value so that the charging rate estimated value becomes larger than a corresponding value calculated according to the battery model.

When the charging rate estimated value calculated according to the battery model belongs to one of the first and second regions, the charging rate estimating unit may calculate the charging rate estimated value by adding an offset value that varies according to the value calculated according to the battery model, to the charging rate estimated value.

When the charging rate estimated value calculated according to the battery model belongs to one of the first and second regions, the charging rate estimating unit may correct the given parameter stored in the storing unit, based on the value calculated according to the battery model, and re-calculate the charging rate estimated value using the corrected parameter.

The given parameter may be defined by an initial parameter value obtained in the initial state of the at least one secondary battery, and the rate of change of parameter representing the ratio of a parameter value in the current state of the at least one secondary battery to the initial parameter value. The storing unit may store the given parameter as a combination of the initial parameter value and the rate of change of parameter. The first and second parameter updating units may update the rate of change of parameter stored in the storing unit.

A second aspect of the invention is concerned with a method of controlling charge/discharge of a secondary battery of a vehicle. The vehicle includes an electric motor operable to produce driving force, at least one secondary battery that supplies electric power to the electric motor, and a charging mechanism operable to charge the secondary battery using a power supply located outside the vehicle. The control method includes the steps of: collecting data used in a battery model for estimating the status of the secondary battery, storing a given parameter which is used in the battery model and varies according to the status of the secondary battery, calculating a first parameter based on the collected data during running of the vehicle, and correcting the stored given parameter based on the first parameter, calculating a second parameter based on the collected data when the vehicle is at rest and the secondary battery is charged, and correcting the stored given parameter based on the second parameter, calculating an estimated value of charging rate of the secondary battery, using the battery model, based on the collected data and the given parameter, and controlling discharge of the secondary battery based on the estimated value of charging rate, during running of the vehicle.

According to the control system and control method of the first and second aspects of the invention, charge/discharge of the second battery can be controlled in view of the current conditions of the secondary battery installed on the vehicle.

BRIEF DESCRIPTION OF THE DRAWINGS

The foregoing and further features and advantages of the invention will become apparent from the following description of preferred embodiments with reference to the accompanying drawings, wherein like numerals are used to represent like elements and wherein:

FIG. 9 is a flowchart illustrating a process of selecting a running mode of the hybrid vehicle according to the first embodiment;

FIG. 10 is a flowchart illustrating a process of updating parameters during running of the vehicle;

FIG. 22 is a view showing an example of parameter change rate map in which map values are set with respect to battery temperatures T0-T5;

DETAILED DESCRIPTION OF EMBODIMENTS

Figure 1:
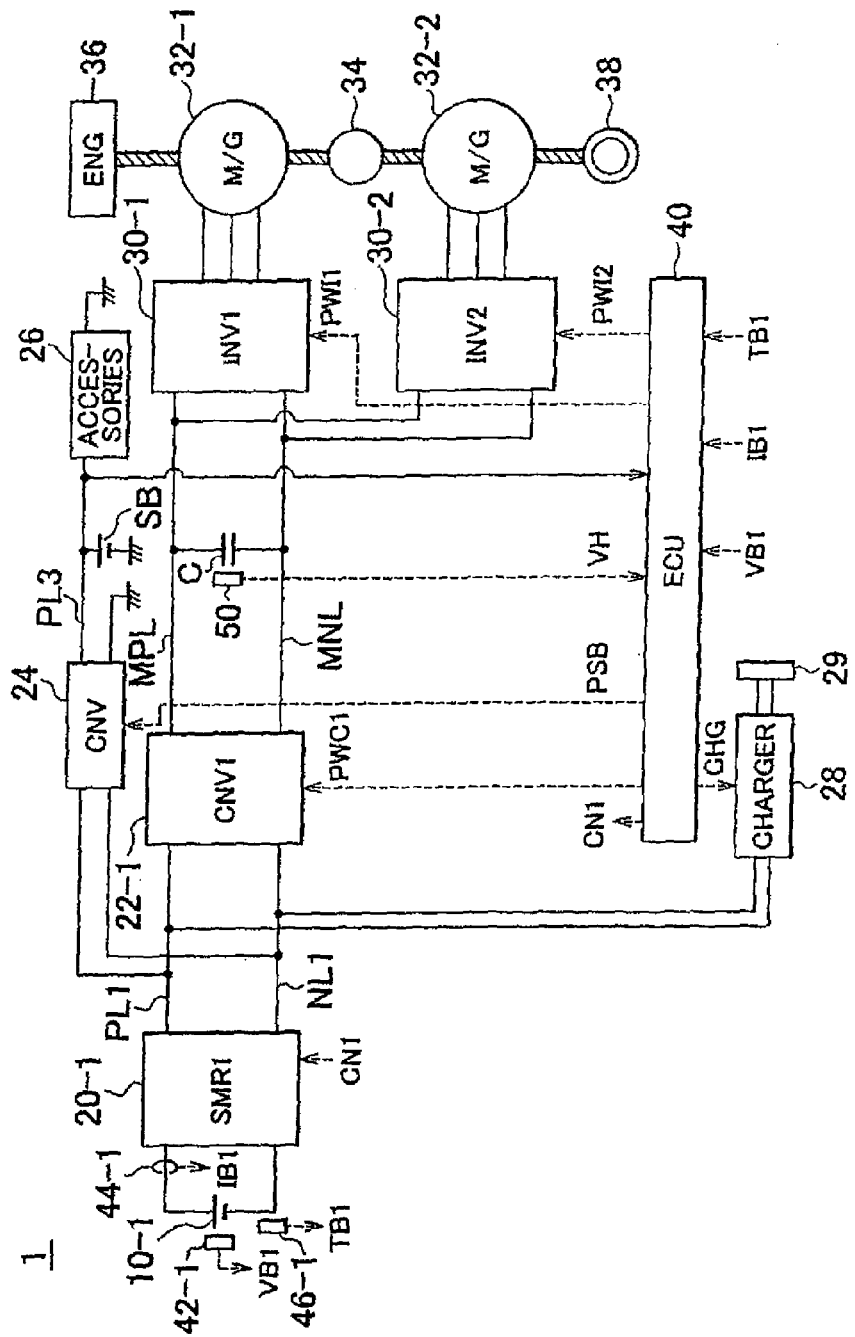
FIG. 1 is a general block diagram of a hybrid vehicle illustrated as one example of vehicle including a control system according to a first embodiment of the invention.

Some embodiments of the invention will be described in detail with reference to the drawings. In the drawings, the same reference numerals are assigned to the same or corresponding portions or elements, of which explanation will not be repeated.

[First Embodiment] FIG. 1 is a general block diagram of a hybrid vehicle illustrated as one example of vehicle having a control system according to a first embodiment of the invention. Referring to FIG. 1, the hybrid vehicle 1 includes a battery 10-1, SMR (system main relay) 20-1, converter 22-1, positive line PLI, negative line NL, main positive bus MPL, main negative bus MNL, and a capacitor C. The hybrid vehicle 1 further includes first and second inverters 30-1, 30-2, first and second motor-generators (which will be called "first MG and second MG", respectively) 32-1, 32-2, power divider 34, engine 36, driving wheels 38, ECU (Electronic Control Unit) 40, voltage sensor 42-1, current sensor 44-1, and a temperature sensor 46-1. The hybrid vehicle 1 further includes a DC/DC converter 24, accessories 26, accessory battery SB, charger 28, and an inlet 29.

The battery 10-1 that serves as a rechargeable DC power supply is installed on the hybrid vehicle 1. Electric power generated by the first MG 32-1 and the second MG 32-2, and electric power supplied from a power supply (not shown) located outside the vehicle via the charger 28, are stored in the battery 10-1.

More specifically, the battery 10-1 is a secondary battery, such as a nickel metal hydride (NiMH) battery or a lithium-ion battery. In this embodiment, the battery 10-1 is a lithium-ion battery.

The SMR 20-1 is a relay for electrically connecting the battery 10-1 to the positive line PL1 and the negative line NU. The SMR 20-1 opens and closes in response to a signal CN1 received from the ECU 40.

The converter 22-1 is provided between the positive line PL1 and negative line NL1, and the main positive bus MPL and main negative bus MNL. The converter 22-1 steps up the voltage between the main positive bus MPL and the main negative bus MNL, to be larger than the voltage between the positive line PL1 and the negative line NL1, based on a signal PWC1 received from the ECU 40.

The capacitor C is connected between the main positive bus MPL and the main negative bus MNL, and operates to smooth fluctuations in voltage between the main positive bus MPL and the main negative bus MNL.

The first inverter 30-1 is provided between the main positive bus MPL and main negative bus MNL, and the first MG 32-1. The first inverter 30-1 drives the first MG 32-1 for regeneration, based on a signal PWI1 received from the ECU 40. At this time, the first inverter 30-1 converts AC power generated by the first MG 32-1 into DC power, and outputs the DC power to the main positive bus MPL and main negative bus MNL. Also, the first inverter 30-1 drives the first MG 32-1 for power running, based on the signal PWI1, so as to cause the first MG 32-1 to crank the engine 36 when the engine 36 is started.

The second inverter 30-2 is provided between the main positive bus MPL and main negative line MNL, and the second MG 32-2. The second inverter 30-2 drives the second MG 32-2 for power running, based on a signal PWI2 received from the ECU 40, so as to cause the second MG 32-2 to drive the driving wheels 38. During regenerative braking of the vehicle, the second inverter 30-2 drives the second MG 32-2 for regeneration, based on the signal PWI2. At this time the second MG 32-2 generates electric power utilizing rotation of the driving wheels 38. The second inverter 30-2 converts AC power generated by the second MG 32-2 into DC power, and outputs the DC power to the main positive bus MPL and main negative bus MNL Each of the first and second MG 32-1, 32-2 is an AC rotary electric machine, such as a three-phase alternating current synchronous (ACS) motor. The first MG 32-1 is coupled to the engine 36 via the power divider 34, and is operable to generate electric power, using power of the engine 36. For example, when the SOC that indicates the charging rate of the battery 10-1 is reduced during running of the vehicle, the engine 36 starts, and the first MG 32-1 generates electric power. The second MG 32-2 generates driving force or power for running the hybrid vehicle 1, using at least one of electric power stored in each battery and electric power generated by the first MG 32-1.

In this embodiment, the SOC is defined as the ratio of the current capacity of the battery to the capacity of the battery when it is fully charged, which ratio is expressed as a percentage.

The power divider 34 is in the form of a planetary gear set including a sun gear, a pinion gear, a carrier and a ring gear. The crankshaft of the engine 36 is coupled to the carrier, and a rotating shaft of the first MG 32-1 is coupled to the sun gear. Further, a rotating shaft of the second MG 32-2 is coupled to the ring gear, and the ring gear is coupled to the driving wheels 38.

With the above-described arrangement, the hybrid vehicle 1 runs with driving force from at least one of the engine 36 and the second MG 32-2. The power generated by the engine 36 is split into two paths by means of the power divider 34. Namely, the power of the engine 36 is directly transmitted in part to the driving wheels 38 via one of the two paths, and is transmitted in part to the first MG 32-2 via the other path.

The DC/DC converter 24 is connected to the positive line PL1 and negative line NL1. The DC/DC converter 24 steps down the voltage between the positive line PL1 and the negative line NL1, and outputs the voltage to a positive line PL3, based on a signal PSB received from the ECU 40. The accessories 26 and accessory battery SB are connected to the positive line PL3.

The accessories 26 generally represent various types of accessories installed on the vehicle. The accessory battery SB is a rechargeable battery, such as a lead storage battery. Electric power stored in the accessory battery SB is supplied to the accessories 26 and the ECU 40.

The charger 28 and the inlet 29 are provided in the hybrid vehicle I for charging the battery 10-1 with electric power from a power supply (which will also be called "external power supply") located outside the vehicle. The input end of the charger 28 is connected to the inlet 29, and the output end of the charger 28 is connected to the positive line PL1 and negative line NL1.

The charger 28 converts the voltage of electric power received via the inlet 29, into a voltage suitable for charging the battery 10-1, based on a signal CHG received from the ECU 40, and outputs the voltage to between the positive line PL1 and the negative line NL1. The inlet 29 is a power interface for receiving electric power from the external power supply. The inlet 29 is arranged to be connected to a charging cable (not shown) through which electric power is transferred from the external power supply to the vehicle.

The voltage sensor 42-1 measures voltage VB1 of the battery 10-1, and outputs measured values to the ECU 40 The current sensor 44-1 measures current 181 that flows into or out of the battery 10-1, and outputs measured values to the ECU 40 The temperature sensor 46-1 measures the temperature TB1 of the battery 10-1, and outputs measured values to the ECU 40. The current 181 assumes a positive value (181>0) when the battery 10-1 is discharged, and assumes a negative value (181<0) when the battery 10-1 is charged.

The ECU 40 may be regarded as the "control system of the vehicle" according to the invention. The ECU 40 receives respective measured values of the voltage sensor 42-1, current sensor 44-1 and the temperature sensor 46-1. The ECU 40 produces the signal CN1 for controlling the SMR 20-1, and outputs the produced signal CN1 to the SMR 20-1. The ECU 40 produces the signal PWC1 for driving the converter 22-1, and outputs the produced signal PWC1 to the converter 22-1. Furthermore, the ECU 40 produces the signals PWI1, PWI2 for driving the first and second MGs 32-1, 32-2, respectively, and outputs the produced signals PWI1, PWI2 to the first and second inverters 30-1, 30-2, respectively.

Also, the ECU 40 produces the signal PSB for driving the DC/DC converter 24, and outputs the produced signal PSB to the DC/DC converter 24. Furthermore, the ECU 40 produces the signal CHG for driving the charger 28 when the external power supply (not shown) is connected to the inlet 29, and outputs the produced signal CHG to the charger 28.

Figure 2:
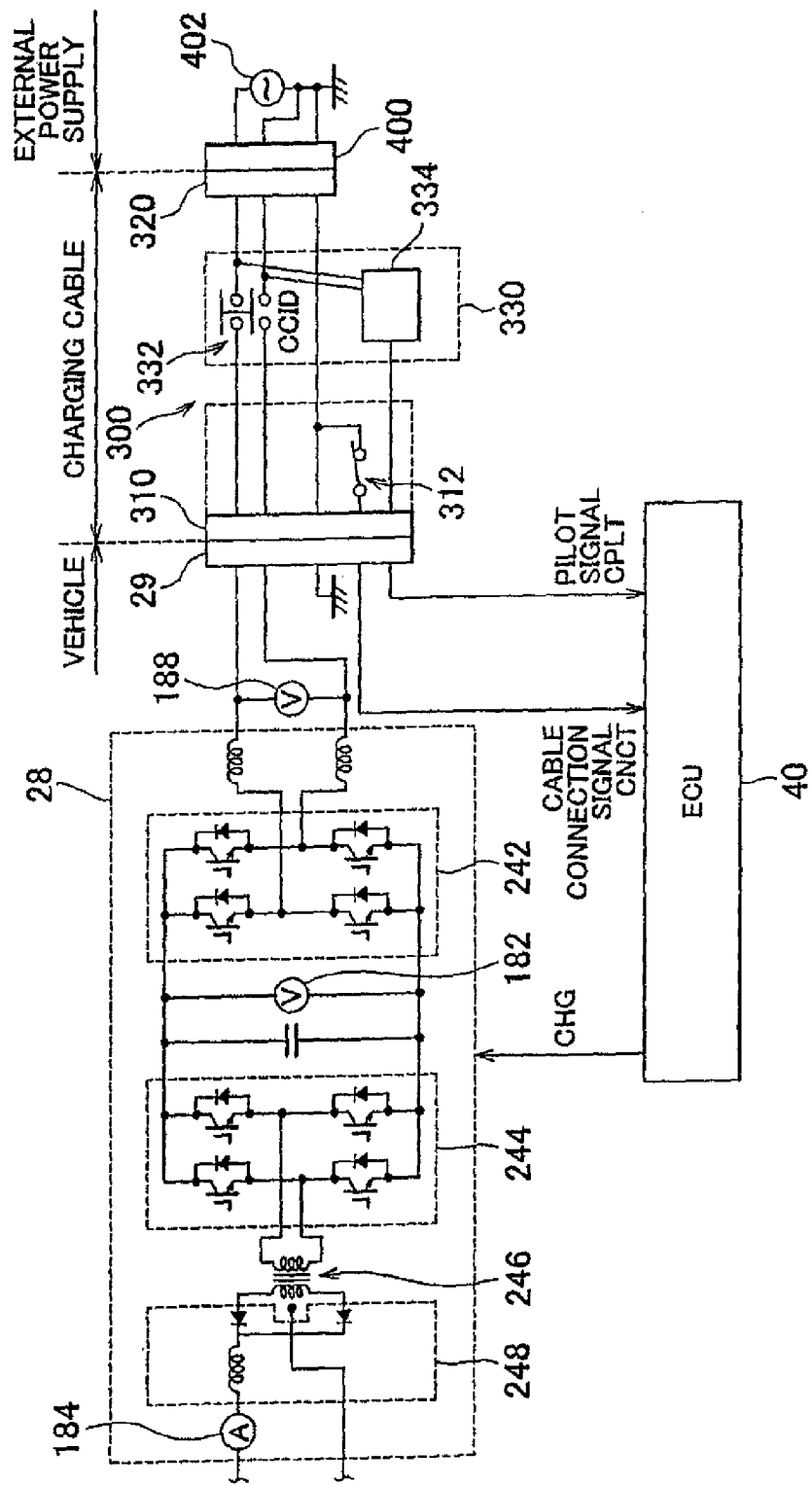
FIG. 2 is a view showing in detail the construction of a charger 28 shown in FIG. 1, and an arrangement for electrically connecting the hybrid vehicle with an external power supply.

FIG. 2 is a view showing in detail the construction of the charger 28 shown in FIG. 1, and an arrangement for electrical connection between the hybrid vehicle and the external power supply.

Referring to FIG. 2, the charger 28 includes an AC/DC converter circuit 242, DC/AC converter circuit 244, isolation transformer 246, and a rectifier circuit 248.

The AC/DC converter circuit 242 consists of a single-phase bridge circuit. The AC/DC converter circuit 242 converts AC power into DC power, based on the signal CHG from the ECU 40 The AC/DC converter circuit 242 also functions as a step-up chopper circuit, by using coils as reactors.

The DC/AC converter circuit 244 consists of a single-phase bridge circuit. The DC/AC converter circuit 244 converts DC power into high-frequency AC power, and outputs the AC power to the isolation transformer 246, based on the signal CHG from the ECU 40.

The isolation transformer 246 includes a core formed of a magnetic material, and primary coil and secondary coil wound around the core. The primary coil and the secondary coil are electrically isolated from each other, and are connected to the DC/AC converter circuit 244 and the rectifier circuit 248, respectively. The isolation transformer 246 converts the voltage of AC power received from the DC/AC converter circuit 244, into a voltage commensurate with the turn ratio of the primary coil and the secondary coil, and outputs the converted voltage to the rectifier circuit 248. The rectifier circuit 248 rectifies AC power generated from the isolation transformer 246, into DC power.

A voltage sensor 182 measures the voltage (terminal voltage of a smoothing capacitor) between the AC/DC converter circuit 242 and the DC/AC converter circuit 244, and outputs a signal indicative of the measurement result to the ECU 40. Also, a current sensor 184 measures the output current of the charger 28, and outputs a signal indicative of the measurement result to the ECU 40.

When the battery 10-1 is charged by means of the power supply 402 located outside the vehicle, the ECU 40 produces the signal GIG for driving the charger 28, and outputs the signal MG to the charger 28. The ECU 40 has the function of detecting a failure of the charger 28, as well as the function of controlling the charger 28. A failure of the charger 28 is detected when the voltage measured by the voltage sensor 182 and the current measured by the current sensor 184 are equal to or larger than threshold values thereof.

For example, the inlet 29 is disposed on one side of the hybrid vehicle. A connector 310 of a charging cable 300 that connects the hybrid vehicle with the external power supply 402 is connected to the inlet 29.

The charging cable 30 that connects the hybrid vehicle with the external power supply 402 includes a connector 310, a plug 320, and a CCI (Charging Circuit Interrupt device) 330.

The connector 310 of the charging cable 300 is connected to the inlet 29 provided on the hybrid vehicle. The connector 310 is provided with a switch 312. The switch 312 opens and closes in accordance with the movement of an engaging member or fitting (not shown) that engages the connector 310 of the charging cable 300 with the inlet 29 of the hybrid vehicle.

The switch 312 closes when the connector 310 of the charging cable 300 is connected to the inlet 29. Upon closing of the switch 312, the ECU 40 receives a signal CNCT that indicates that the connector 310 of the charging cable 300 is connected to the inlet 29 provided on the vehicle.

The plug 320 of the charging cable 300 is connected to a receptacle 400. The receptacle 400 is, for example, a household receptacle (e.g., wall outlet) installed in a house. AC power is supplied from the power supply 402 to the receptacle 400.

The CCID 330 has a relay 332 and a control pilot circuit 334. When the relay 332 is in an open position, a path through which electric power is supplied from the power supply 402 to the hybrid vehicle is cut off. When the relay 332 is in a closed position, electric power can be supplied from the power supply 402 to the hybrid vehicle. The position of the relay 332 is controlled by the ECU 40 in a condition where the connector 310 of the charging cable 300 is connected to the inlet 29 of the hybrid vehicle.

The control pilot circuit 334 sends a pilot signal (square-wave signal) CPLT to a control pilot line, in a condition where the plug 320 of the charging cable 300 is connected to the receptacle 400, namely, to the external power supply 402, and the connector 310 is connected to the inlet 29. An oscillator provided in the control pilot circuit 334 periodically changes the pilot signal CPLT.

When the plug 320 of the charging cable 300 is connected to the receptacle 400, and the connector 310 of the charging cable 300 is connected to the inlet 29, the control pilot circuit 334 produces a pilot signal CPLT having a predetermined pulse width (duty cycle).

The pulse width of the pilot signal CPLT enables the hybrid vehicle to be informed of current capacity indicative of the amount of current that can be supplied to the vehicle. For example, the hybrid vehicle is informed of the current capacity of the charging cable 300. The pulse width of the pilot signal CPLT can be determined for each type of charging cable.

In this embodiment, the battery 10-1 is charged in a condition in which the vehicle is at rest, and the hybrid vehicle is connected to the power supply 402 via the charging cable 300. The AC voltage (alternating voltage) VAC of the power supply 402 is measured by a voltage sensor 188 provided within the hybrid vehicle. The measured voltage VAC is transmitted to the ECU 40.

Figure 3:
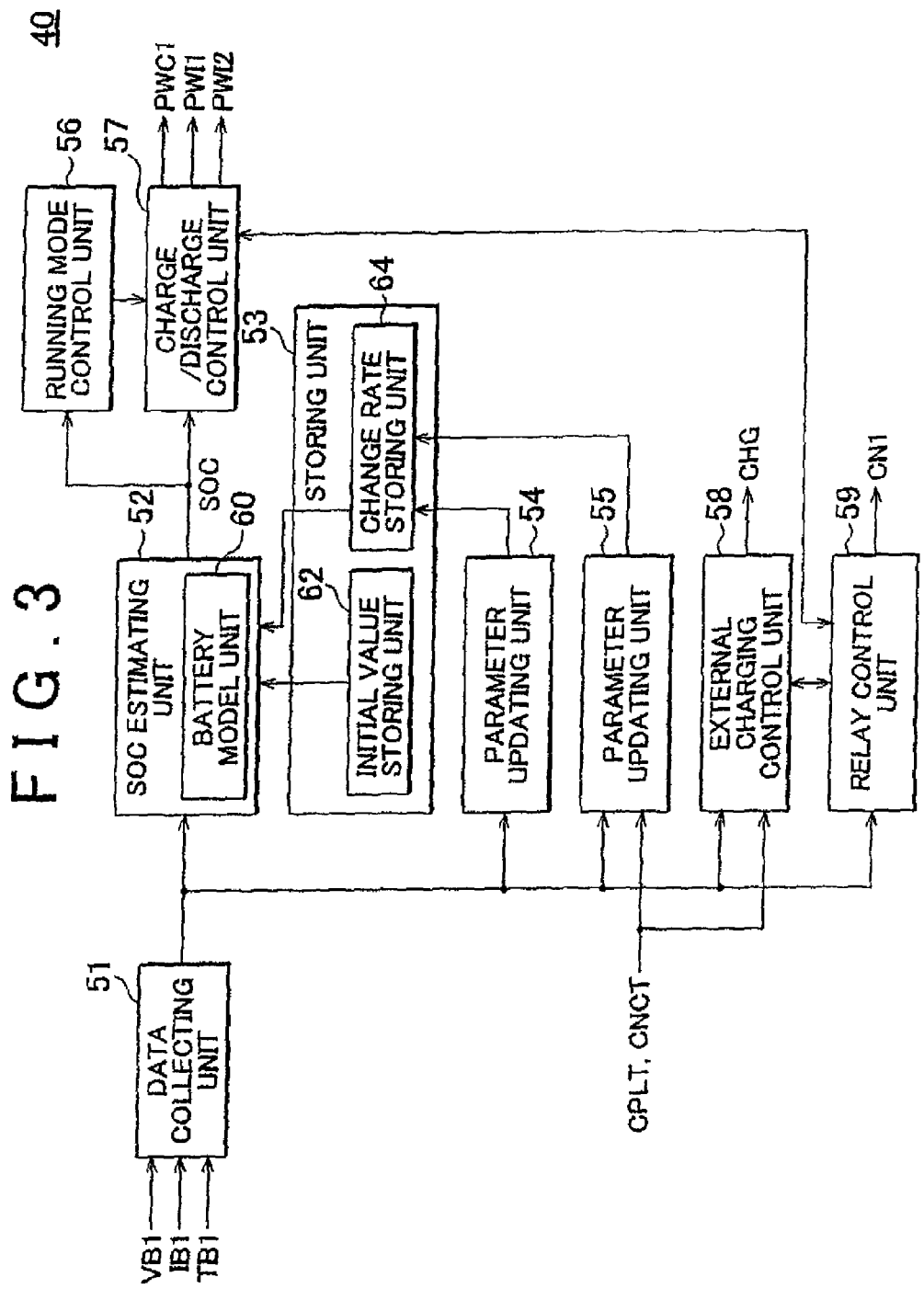
FIG. 3 is a functional block diagram useful for explaining the configuration of an ECU 40 shown in FIG. 1.

FIG. 3 is a functional block diagram useful for explaining the configuration of the ECU 40 as shown in FIG. 1. In particular, FIG. 3 shows the configuration related to charge/discharge control of the battery 10-1.

Referring to FIG. 3, the ECU 40 includes a data collecting unit 51, SOC estimating unit 52, storing unit 53, parameter updating units 54, 55, running mode control unit 56, charge/discharge control unit 57, external charging control unit 58, and a relay control unit 59.

The data collecting unit Si collects data used in a battery model for estimating the status of the battery 10-1. More specifically, the data collecting unit 51 acquires measured values of voltage VB1, measured values of current IB1, and measured values of temperature TB1, from the voltage sensor 42-1, current sensor 44-1 and the temperature sensor 46-1, respectively.

The SOC estimating unit 52 includes a battery model unit 60 for estimating internal conditions of the battery 10-1. The SOC estimating unit 52 carries out a process which will be described later, using data (e.g., voltage VB1 and temperature TB1) acquired by the data collecting unit 51, so as to estimate the internal conditions (behavior) of the battery 10-1. Then, the SOC estimating unit 52 estimates. the charging rate (SOC) of the battery 10-1, based on the result of the estimation.

The storing unit 53 stores parameters used for calculations performed in the battery model unit 60. More specifically, the storing unit 53 includes an initial-value storing unit 62 that stores parameter values (initial values) in the initial state of the battery 10-1, and a change rate storing unit 64 that stores the rates of change of parameters (which will also be called "parameter change rates").

The above-mentioned parameter change rates indicate the rates of change of parameter values caused by degradation of the battery 10-1 with use. More specifically, the parameter change rate is defined as the ratio of the current value of a certain parameter, to the initial value of the parameter. The parameter change rate is equal to 1 when the battery is in the initial state, and gradually decreases from 1 as the battery degrades.

In this embodiment, parameter values in the current state of the battery are obtained by multiplying the initial values by the parameter change rates. Therefore, the parameter updating units 54, 55 calculate the parameter change rates, and also correct (update) the parameter change rates, using the calculation results. As the parameter updating units 54, 55 update the parameter change rates, the parameter change rates are gradually reduced from 1 as the battery degrades.

The parameter updating unit 54 calculates the parameter change rates, using data (e.g., voltage VB1 and current 1B1) acquired by the data collecting unit 51 during running of the hybrid vehicle 1. The parameter updating unit 54 corrects the parameter change rates stored in the change rate storing unit 64, using the calculated parameter change rates.

The parameter updating unit 55 calculates the parameter change rates, using data (e.g., voltage VB1) acquired by the data collecting unit 51 when the hybrid vehicle 1 is at rest, and the battery 10-1 is charged by means of the external power supply. The parameter updating unit 55 corrects the parameter change rates stored in the change rate storing unit 64, using the calculated parameter change rates. The corrected parameter change rates are then stored in the change rate storing unit 64. The parameter updating unit 55 detects that the hybrid vehicle 1 is at rest and that the battery 10-1 is charged by means of the external power supply, based on the signals CPLT and CNCT.

It is to be understood that the parameter updating units 54, 55 may calculate the current parameter values (namely, values equal to the products of the initial values and the parameter change rates).

The running mode control unit 56 selects one of a first running mode (EV mode) in which the hybrid vehicle 1 runs using electric power stored in the battery 10-1, and a second running mode (HV mode) in which the battery 10-1 is charged and discharged so that the SOC varies within a specified range, based on the estimated value of charging rate (SOC) calculated by the SOC estimating unit 52. Through plug-in charging, the SOC of the battery 10-1 reaches a value (e.g., 80%) approximately equal to the SOC of the battery 10-1 when it is in a fully charged state. In this case, the EV mode is selected when the vehicle starts running.

During running of the hybrid vehicle 1, the charge/discharge control unit 57 controls the converter 22-1, first inverter 30-1, and the second inverter 30-2, so as to discharge or charge the battery 10-1, based on the running mode selected by the running mode control unit 56, the SOC calculated by the SOC estimating unit 52, a measured value (not shown) indicative of the accelerator pedal position, and so forth. More specifically, the charge/discharge control unit 57 produces the signal PWC1 for controlling the converter 22-1, signal PWI1 for controlling the first inverter 30-1, and the signal PW12 for controlling the second inverter 30-1. Then, the charge/discharge control unit 57 sends the signals PWC1, PWI1 and PWI2 to the converter 22-1, first inverter 30-1 and the second inverter 30-2, respectively.

When the EV mode is selected, the charge/discharge control unit 57 controls the converter 22-1, first inverter 30-1 and the second inverter 30-2, so that electric power is continuously supplied from the battery 10-1 to the second MG 32-2 until the SOC of the battery 10-1 reaches a control target value. If the SOC of the battery 10-1 is reduced down to the control target value, the HV mode is selected by the running mode control unit 56. In this connection, the control target value of the SOC is not particularly limited, but is determined according to the full-charge capacity of the battery 10-1. For example, the control target value is 30(%).

In the HV mode, the charge/discharge control unit 57 controls charge/discharge of the battery 10-1, so that the SOC is kept within a specified range. For example, when it is required to increase the SOC, the charge/discharge control unit 57 controls the converter 22-1, first inverter 30-1 and the second inverter 30-2 so as to charge the battery 10-1 with electric power generated by the first MG 32-1 or the second MG 32-2. On the other hand, when it is required to reduce the SOC, the charge/discharge control unit 57 controls the converter 22-1, first inverter 30-1 and the second inverter 30-2, so that electric power is supplied from the battery 10-1 to the second MG 32-2, as described above.

The control range of the SOC in the HV mode is, for example, a specified range (e.g., 25-35%) around the above-mentioned control target value (30%).

When the hybrid vehicle 1 is at rest, and the battery 10-1 is charged by means of the external power supply, the external charging control unit 58 produces a signal CHG for controlling the charger 28, and transmits the signal CHG to the charger 28. The external charging control unit 58 detects that the hybrid vehicle 1 is at rest, the external power supply and the inlet 29 are connected to each other, and that electric power is supplied from the external power supply to the charger 28, based on the signals CPLT and CNCT. Then, the external charging control unit 58 controls charge of the battery 10-1 so that the voltage VB1 reaches a predetermined value (e.g., a value achieved when the SOC is 80%). The above-mentioned voltage VB1 is OCV (which will also be called "open-circuit voltage").

The external charging control unit 58 temporarily changes charging current based on the current value IB1 received from the data collecting unit 51, for estimation of the rates of change of parameters by the parameter updating unit 55.

The relay control unit 59 produces a signal CN1 so as to place the SMR 20-1 in the ON position during charge of the battery 10-1 and during running of the vehicle. It is, however, to be noted that the relay control unit 59 produces a signal CN1 so as to place the SMR 20-1 in the OFF position when the above-mentioned OCV is measured.

[Estimation of Charging Rate using Battery Model]. Next, one example of battery model used for estimation of the status of the battery 10-1 will be described. The battery model as described below, which includes a nonlinear model, is constructed so that the internal behavior can be dynamically estimated in view of electrochemical reactions within the secondary battery. While the secondary battery is not limited to any particular type, a lithium-ion battery is employed in the battery model as described below.

Figure 4:
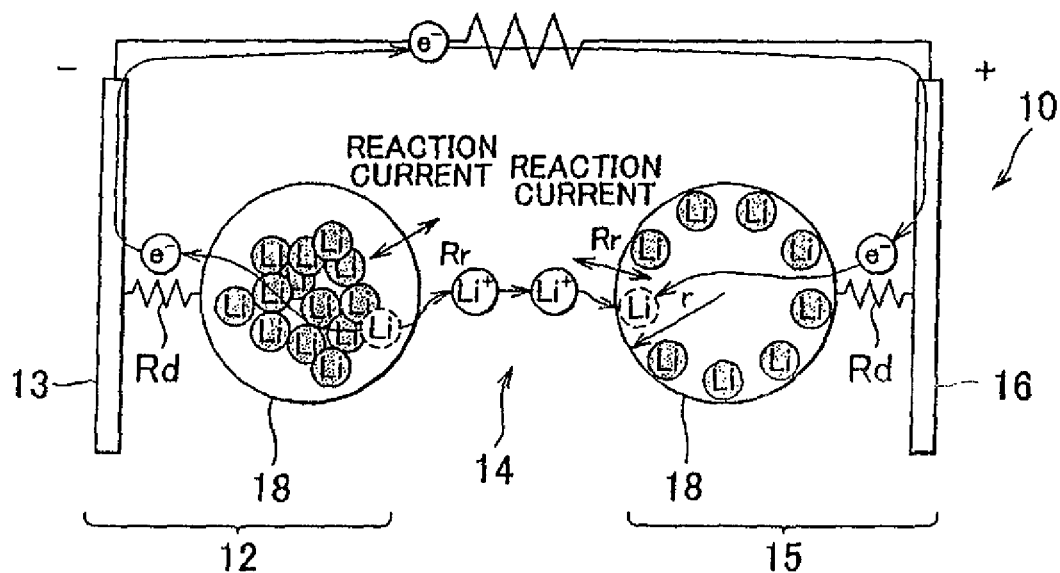
FIG. 4 is a conceptual view schematically illustrating the internal construction of a secondary battery expressed by a battery model.

FIG. 4 is a conceptual view schematically illustrating the internal construction of a secondary battery expressed by a battery model Referring to FIG. 4, the secondary battery 10 includes a negative electrode 12, a separator 14, and a positive electrode 15. The separator 14 is formed by impregnating a resin provided between the negative electrode 12 and the positive electrode 15 with a liquid electrolyte.

Each of the negative electrode 12 and the positive electrode 15 consists of an aggregate of spherical masses of active material 18. When the secondary battery 10 is discharged, chemical reaction to discharge lithium ions $Li^+$ and electrons $e^-$ occurs on the interface of the active material 18 of the negative electrode 12. On the other hand, chemical reaction to absorb lithium ions $Li^+$ and electrons $e^-$ occurs on the interface of the active material 18 of the positive electrode 15. When the secondary battery 10 is charged, chemical reactions reverse to the above-described reactions occur in connection with discharge and absorption of electrons $e^-$.

The negative electrode 12 is provided with a current collector 13 for absorbing electrons $e^-$, and the positive electrode 15 is provided with a current collector 16 for discharging electrons $e^-$. The current collector 13 of the negative electrode is typically formed of copper, and the current collector 16 of the positive electrode is typically formed of aluminum. The current collector 13 is provided with a negative terminal, and the current collector 16 is provided with a positive terminal. Through transfer of Lithium ions $Li^+$ via the separator 14, the secondary battery 10 is charged or discharged, giving rise to charging current or discharge current.

Namely, the charge/discharge status within the secondary battery varies depending on the distribution of lithium concentration in the active materials 18 of the electrodes (the negative electrode 12 and the positive electrode 15). The lithium corresponds to a reaction involved material of the lithium-ion battery.

The sum of purely electric resistance (pure resistance) Rd to the movement of electrons $e^-$ in the negative electrode 12 and the positive electrode 15, and charge transfer resistance (reaction resistance) Rr that acts equivalently as electric resistance upon occurrence of reaction current on the interface of the active material, correspond to DC resistance of the secondary battery 10 when viewed macroscopically. The macroscopic DC resistance will also be denoted "DC resistance Ra" in the following description. Also, the diffusion of lithium Li in the active material 18 is governed by the diffusion coefficient Ds.

The explanation of one example of battery model used in the battery model unit 60 will be continued. In battery model expressions which will be described below, an influence of an electric double layer capacitor is ignored in the battery model constructed, in view of the fact that the influence of the electric double layer capacitor is small at room temperature. Furthermore, the battery model is defined as a model per unit plate area of electrode. The use of the model per unit plate area of electrode makes it possible to generalize the model with respect to the design capacity.

Initially, with regard to the battery voltage V as the output voltage of the secondary battery 10, Equation (1) as indicated below is established in which the battery temperature T, battery current I, open-circuit voltage (OCV) U, and the above-mentioned macroscopic DC resistance Ra of the secondary battery 10 as a whole are used. Here, the battery current I represents a current value per unit plate area. Namely, the battery current I is defined as I=Ib/S, where Ib is battery current (a current value that can be measured by an ammeter) that passes through the positive and negative terminals, and S is the area of the opposite electrode plates of the battery. In the following description, "current" and "estimated current value" mentioned in connection with the battery model refer to current per unit plate area, unless otherwise specified.

$$V = OCV(\theta_1, \theta_2) - Ra(\theta_1, \theta_2, T) \times I = U_1(\theta_1) - U_2(\theta_2) - Ra(\theta_1, \theta_2, T) \times I \quad (1)$$

In Equation (1), $\theta_1$ and $\theta_2$ represent local SOC at a surface of the positive-electrode active material, and local SOC at a surface of the negative-electrode active material, respectively. The open-circuit voltage OCV is represented as a potential difference between an open-circuit potential $U_1$ of the positive electrode and an open-circuit potential $U_2$ of the negative electrode.

Figure 5:
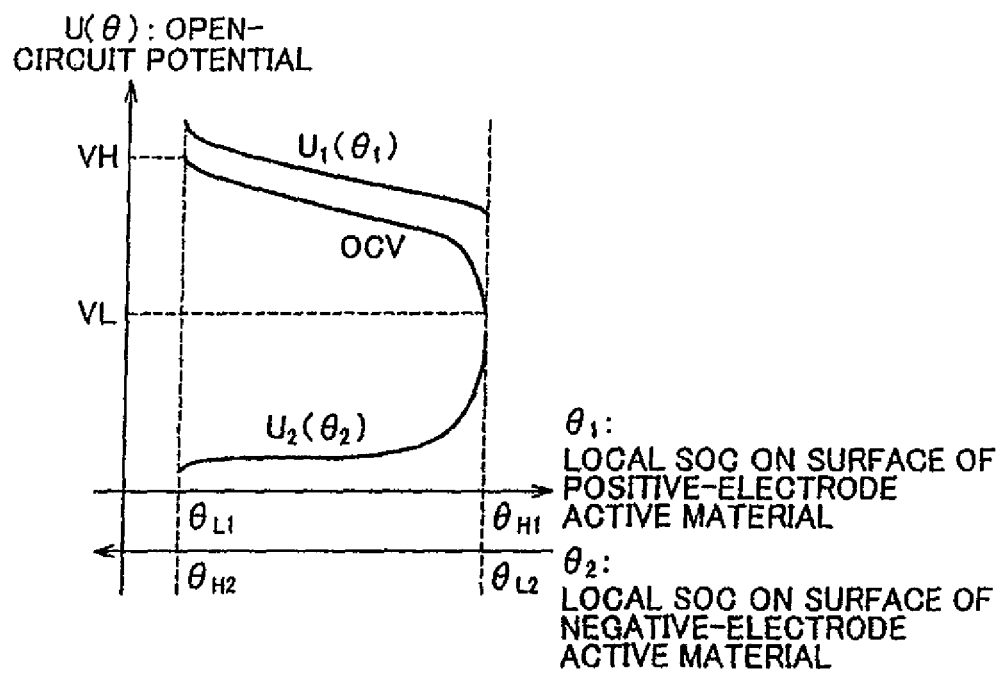
FIG. 5 is a graph showing an example of map indicating characteristics of change of open-circuit voltage with respect to change of local SOC.

As shown in FIG. 5, the positive-electrode open-circuit potential $U_1$ and the negative-electrode open-circuit potential $U_2$ have a characteristic that they vary depending on the local $SOC\theta_1$ and the local $SOC\theta_2$, respectively. Accordingly, by measuring the relationship between the local $SOC\theta_1$ and the positive-electrode open-circuit potential $U_1$ and the relationship between the local $SOC\theta_2$ and the negative-electrode open-circuit potential $U_2$, in the initial state of the secondary battery 10, it is possible to create a characteristic map in which characteristics of changes in the positive-electrode open-circuit potential $U_1$ ($\theta_1$) with respect to changes in the local $SOC\theta_1$ and characteristics of changes in the negative-electrode open-circuit potential $U_2$ ($\theta_2$) with respect to changes in the local $SOC\theta_2$ are stored in advance.

The DC resistance $R_a$ has a characteristic that it varies according to changes in the local $SOC(\theta_1)$, local $SOC(\theta_2)$ and the battery temperature T. Namely, the DC resistance $R_a$ is expressed as a function of the local $SOC(\theta_1, \theta_2)$ and the battery temperature T. Accordingly, a characteristic map (DC resistance map) for determining a value of DC resistance $R_a$ corresponding to a combination of the local $SOC(\theta_1, \theta_2)$ and the battery temperature T can be created, based on actual measurement results or experimental results in the initial state of the secondary battery 10.

As described above, in the spherical active material model of each of the negative electrode 12 and positive electrode 15, the local $SOC\theta_i$ (i=1, 2) at the active material surface (interface with an electrolyte) is defined by Equation (2) as indicated below. In the following description, a subscript denoted "i" represents a positive electrode when i is 1, and represents a negative electrode when i is 2, as is the case with the local $SOC\theta_i$.

$$\theta_i = \frac{c_{se,i}}{c_{s,i,max}} (i = 1, 2) \quad (2)$$

In Equation (2), $c_{se,i}$ is the average concentration of lithium at the active material interface, and $c_{s,i,max}$ is the limiting or maximum lithium concentration in the active material.

In the active material treated as a spherical model, the lithium concentration $c_{s,i}$ has a radial distribution. Namely, the lithium concentration distribution in the active material that is assumed to be spherical is defined by a diffusion equation of a polar coordinate system as indicated by Equation (3) as follows.

$$\frac{\partial c_{s,i}}{\partial t} = D_{s,i}(T) \left[ \frac{\partial^2 c_{s,i}}{\partial r^2} + \frac{2}{r} \frac{\partial c_{s,i}}{\partial r} \right] (i = 1, 2) \quad (3)$$

Figure 6:
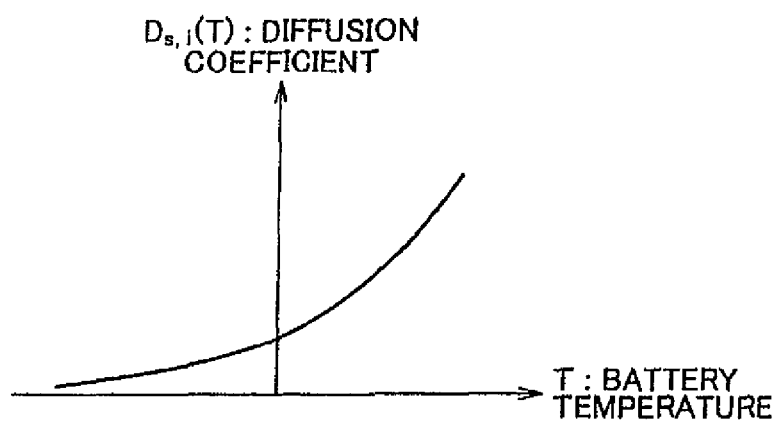
FIG. 6 is a graph showing characteristics of change of the diffusion coefficient with respect to change of the battery temperature.

In Equation (3), $D_{s,i}$ is a diffusion coefficient of lithium in the active material. As shown in FIG. 6, the diffusion coefficient $D_{s,i}$ has a characteristic that it varies depending on the battery temperature. Accordingly, with regard to the diffusion coefficient $D_{s,i}$, too, a characteristic map (diffusion coefficient map) that defines, in advance, characteristics of changes in the diffusion coefficient $D_{s,i}$ (T) with respect to changes in the battery temperature, as shown in FIG. 6, can be created, based on the actual measurement results obtained when the secondary battery 10 is in the initial state, like the DC resistance $R_a$ as described above.

Also, boundary conditions of the diffusion equation Eq. (3) are set as indicated in Equation (4) and Equation (5) as follows.

$$\frac{\partial c_{s,i}}{\partial r} = 0 \quad (4)$$
$$(r = 0, i = 1, 2)$$

$$\frac{\partial c_{s,i}}{\partial t} = \frac{\partial c_{se,i}}{\partial t} = -\frac{j_i^{Li}}{\varepsilon_{s,i} a_{s,i} F} \quad (5)$$
$$(r = r_{s,i}, i = 1, 2)$$

Equation (4) indicates that the concentration gradient at the center of the active material is equal to 0. Equation (5) means that the lithium concentration at the interface of the active material with the electrolyte changes as lithium moves into or out of the active material through its surface.

In Equation (5), $r_{s,i}$ represents the radius of the active material, and $\varepsilon_{s,i}$ represents the volume fraction of the active material, while $a_{s,i}$ represents the surface area of the active material per unit electrode volume. These values are determined from measurement results obtained by various electrochemical measuring methods. In the same equation, F is the Faraday constant Also in Equation (5), $j^{Li}$ represents the amount of lithium produced per unit volume and unit time. Assuming that the reaction is consistent in the thickness direction of the electrode, for the sake of simplicity, $j^{Li}$ is expressed by Equation (6), using the electrode thickness $L_i$ and the battery current I per unit plate area.

$$j_2^{Li} L_2 = -j_1^{Li} L_1 \quad (6)$$

Using the battery current I or battery voltage V as an input, the above Equations (1) through (6) as a system of simultaneous equations are solved, so that an estimated voltage value or estimated current value is calculated, and at the same time, the charging rate can be estimated by estimating the internal conditions of the secondary battery 10.

Figure 7:
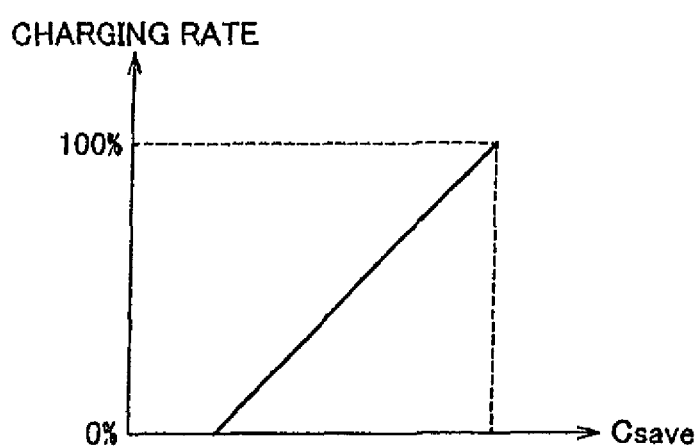
FIG. 7 is a graph showing an example of map indicating the relationship between the average lithium concentration in an active material model, and the charging rate.

The use of the above-described battery model makes it possible to estimate the charging rate of the secondary battery, using the battery voltage V as an input, When the battery voltage V is used as an input, the charging rate is calculated by using a map indicating the relationship between the average lithium concentration in the active material model and the charging rate, as shown in FIG. 7.

In the following, a method of calculating an estimated value of the charging rate (SOC) of the battery and an estimated current value, using the above-described battery model, while using the voltage VB1 measured by the voltage sensor 42-1 and the temperature TB1 measured by the temperature sensor 46-1 as inputs, will be explained.

Figure 8:
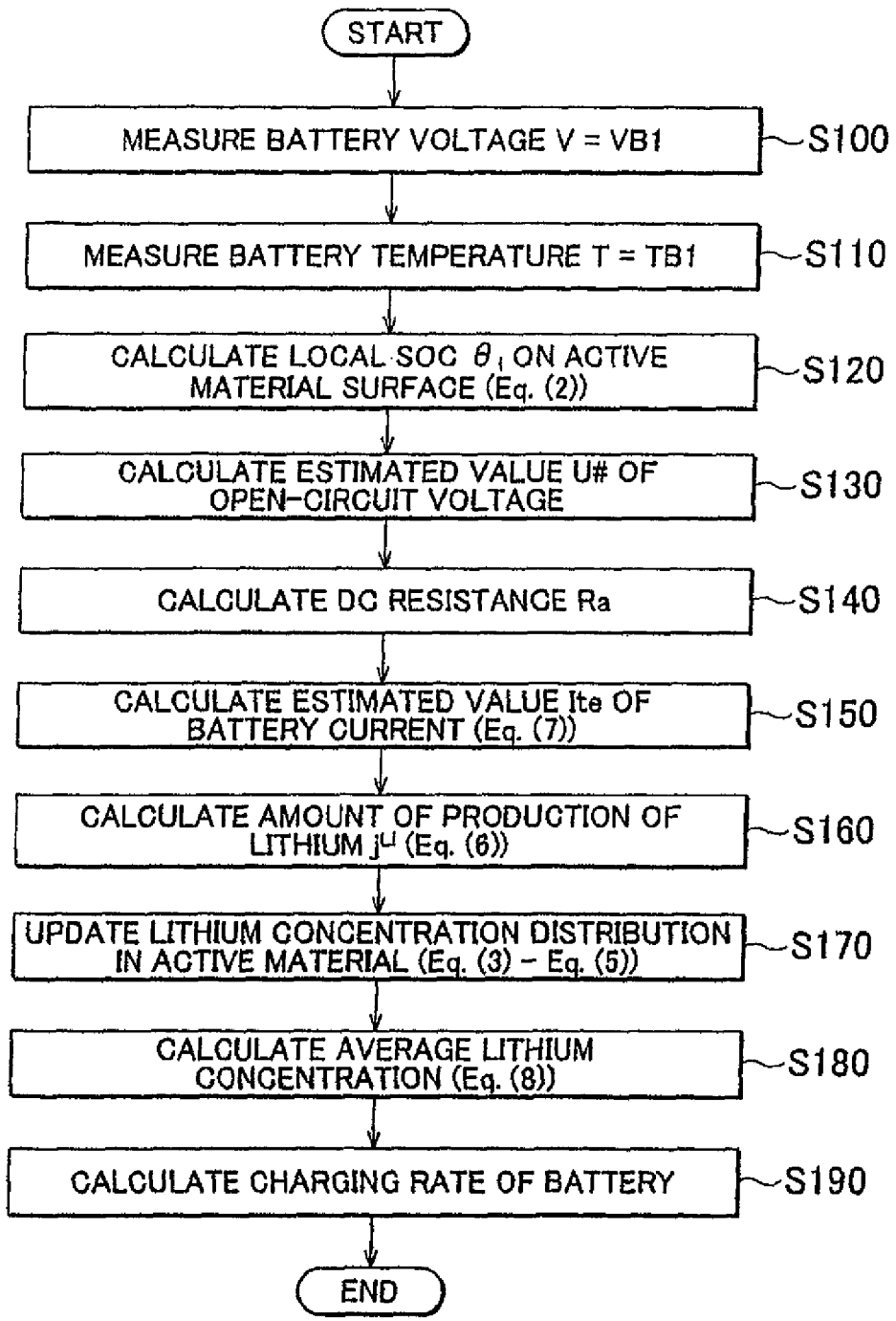
FIG. 8 is a flowchart illustrating a method of estimating the charging rate, using battery model expressions, according to the first embodiment of the invention.

FIG. 8 is a flowchart illustrating a process of estimating the charging rate, using the battery model expressions according to this embodiment of the invention. The ECU 40 (mainly, the SOC estimating unit 52) calls and executes the process as shown in FIG. 8 at given computation intervals.

Referring to FIG. 8, the ECU 40 causes the voltage sensor 42-1 to measure the voltage VB1 in step S100. In step S110, the ECU 40 causes the temperature sensor 46-1 to measure the temperature TB1. The ECU 40 (data collecting unit 51) collects data of voltage VB1 and temperature TB1 obtained by measurements. The voltage VB1 is used as the battery voltage V in the battery model expressions, and the temperature TB1 is used as the battery temperature T in the battery model expressions.

In step S120, the ECU 40 calculates the local SOC$\theta_1$ ($\theta_1$ and $\theta_2$) of the active material surface according to Equation (2), based on the lithium concentration distribution $c_{se,i}$ obtained in the last cycle of the routine. Then, in step S130, the SOC estimating unit 52 calculates the open-circuit potential $U_1$ ($U_1$ and $U_2$), from the characteristic map of the open-circuit potential $U_1$ ($\theta_i$) with respect to the local SOC$\theta_i$, as shown in FIG. 5, and calculates an estimated value U# of open-circuit voltage as a difference between the calculated open-circuit potentials $U_1$ and $U_2$.

In step S140, the ECU 40 calculates the DC resistance $R_a$ according to the DC resistance map stored in advance in the storing unit 53, based on the calculated local SOC $\theta_1$ and the measured battery temperature T. Then, in step S150, the SOC estimating unit 52 calculates an estimated value $I_{te}$ of battery current according to Equation (7) below, using the measured voltage VB1, estimated value U# of open-circuit voltage calculated in step S130, and the DC resistance $R_a$.

$$I_{te} = \frac{U\# - Vb}{R_a} \quad (7)$$

Subsequently, the ECU 40 executes step S160 to calculate the amount $j^{Li}$ of lithium produced per unit volume and unit time, by substituting the estimated battery current value $I_{te}$ for the battery current I in Equation (6). The diffusion equation of Eq. (3) is solved, using the calculated amount $j^{Li}$ of lithium produced per unit volume and unit time in the boundary condition of Eq. (5), so as to determine the lithium concentration distribution in the active material of each of the positive and negative electrodes. The diffusion coefficient $D_{s,i}$ in Eq. (3) can also be calculated based on the measured temperature TB1, according to the diffusion coefficient map defining the relationship between the diffusion coefficient and the battery temperature as shown in FIG. 6.

When solving the diffusion equation of Eq. (3), the ECU 40 updates the lithium concentration distribution $c_{s,i,k}(t+\Delta t)$ (where $\Delta t$ denotes a discrete time step (corresponding to the computation cycle or interval), and k denotes the number of discrete position when radially discretized) within the active material (step S170), using the diffusion equation discretized in terms of position and time. The method of discretizing the diffusion equation in terms of position and time is known in the art, and therefore detailed description thereof will not be repeated.

Next, the ECU 40 calculates the average lithium concentration within the active material according to Equation (8) below in step S180.

$$c_{save} = \frac{1}{N} \sum_{k=1}^{N} c_{s,k} \quad (8)$$

In Equation (8), N is the number of segments or sections into which the spherical active material is radially discretized.

Then, the SOC estimating unit 52 calculates the charging rate in step S190, using the pre-stored map (stored in the storing unit 53) indicative of the relationship between the average lithium concentration $C_{save}$ within the active material and the charging rate (SOC) of the secondary battery 10, as shown in FIG. 7.

In this manner, the SOC estimating unit 52 is able to calculate the charging rate (SOC) of the secondary battery 10, estimated value U# of open-circuit voltage, and the estimated value of battery current per unit plate area, from the battery voltage (VB1) (and the battery temperature (TB1)) measured by the sensors. Also, the estimated value of current flowing through the whole battery is calculated by multiplying the estimated value of current per unit plate area by the areas of the opposite electrode plates of the battery, according to the above-described equation for defining the battery current I.

In the battery model expressions as described above, separate spherical active material models corresponding to the negative electrode 12 and the positive electrode 15, respectively, are set. However, a single spherical model having averaged characteristics of the negative electrode 12 and the positive electrode 15 may be used as a common active material model for the positive electrode and negative electrode.

[Updating of Parameters] Some of the parameters used in or associated with the battery model expressions change as the secondary battery (which may be simply called "battery") degrades with use. For example, the DC resistance, such as reaction resistance or pure resistance, gradually increases as the battery degrades. When there is a large difference between the DC resistance $R_a$ in the initial state (typically, when the battery is a new product), which is stored in the DC resistance map for use in the battery model, and the actual DC resistance, an error in estimation of the charging rate is likely to occur.

Similarly, as the battery degrades, the diffusion speed of the reaction involved material in the active material is reduced (i.e., the diffusion coefficient is reduced), resulting in an increase in so-called diffusion resistance. The increase of the diffusion resistance has a large influence on the battery performance and current-voltage characteristics particularly in the case where the battery is kept charged or discharged at a large current. Accordingly, it is preferable to estimate changes in the diffusion resistance, i.e., changes in the diffusion coefficient in the active material, in an electrically operated vehicle (such as hybrid vehicle or an electric vehicle) in which the battery is charged or discharged at a large current.

Similarly, the full-charge capacity of the battery decreases as the battery degrades. With the full-charge capacity thus reduced, electric energy that can be received by the battery is reduced. Furthermore, as the full-charge capacity decreases, electric energy stored in the battery is reduced even with the same SOC. In this embodiment, charge/discharge of the battery is controlled based on the estimated SOC; therefore, if the full-charge capacity of the battery is reduced while the control range of the SOC is not changed, the amount of electric power that is actually supplied to or delivered from the battery is reduced. As a result, the driving force generated by a motor, for example, or the amount of energy recovered during regenerative braking, is reduced.

For the above reasons, in the first embodiment, the ECU calculates the reaction resistance, diffusion coefficient, and the capacity maintenance factor. The capacity maintenance factor is the ratio of the current full-charge capacity to the full-charge capacity in the initial state of the battery. The calculated reaction resistance, diffusion coefficient and the capacity maintenance factor are stored in the ECU (storing unit 53), and are used for estimation of the battery status according to the battery model expressions, or estimation of the SOC.

In the first embodiment, the parameters (the above-mentioned reaction resistance, diffusion coefficient and the capacity maintenance factor) used in the battery model are calculated during plug-in charge and during running of the vehicle. The parameters calculated during running of the vehicle are corrected by the parameters calculated during plug-in charge.

When a degradation condition of the battery is estimated, it is desirable to create a condition where the battery is completely relaxed, namely, a condition where no current passes through the battery. The degradation condition of the battery can be estimated with high accuracy, by measuring the open-circuit voltage (OCV) when the battery is completely relaxed, or measuring a voltage drop when current begins to be passed through the battery from the condition where the battery is completely relaxed.

Since the battery is charged or discharged during running of the vehicle, it is difficult to create a condition where absolutely no current flows during running of the vehicle. For example, even when the vehicle is stopped for a moment, a part of electric power stored in the battery 10-1 may be supplied to the accessories 26 via the DC/DC converter 24. By using the battery model as described above, a degradation condition of the battery can be estimated with high accuracy, even if the battery cannot be brought into a completely relaxed condition. It is thus possible to estimate a degradation condition of the battery even during running of the vehicle.

However, the following problems may occur when a degradation condition of the battery is estimated during running of the vehicle. First of all, it is difficult to establish a condition in which the battery is completely relaxed, during running of the vehicle, and therefore, an estimation error may arise even if the above-described battery model is used.

Next, it is preferable that the SOC (or the battery current) be within a specified range, for estimation of the battery degradation condition. However, the SOC varies by great degrees (e.g., over a range from 80% to 30%) during running of the vehicle (particularly when the vehicle runs in the EV mode). Accordingly, when a degradation condition of the battery is estimated during running of the vehicle, conditions may differ each time the estimation is made. This means that it is difficult to compare degradation conditions under the same conditions.

Furthermore, a chance to estimate a degradation condition cannot be obtained when the SOC is outside the specified range. Accordingly, it is necessary to bring the SOC into the specified range during running of the vehicle, so as to estimate the degradation condition. Namely, the battery is forced to be charged or discharged. In this case, however, the operating efficiency of the engine may be reduced, or a change may arise in the behavior of the vehicle.

For the vehicle of the first embodiment, which is a plug-in vehicle, it is possible to estimate a degradation condition even during plug-in charge as well as during running. Since the charging current can be controlled as desired during plug-in charge, the charging current is controlled to 0 so as to create a condition where the battery is completely relaxed. During plug-in charge, therefore, the degradation condition of the battery can be estimated with high accuracy.

Furthermore, during plug-in charge, the same conditions can be established each time; therefore, the degradation condition can be evaluated under the same conditions. As a result, variations in the estimation results can be reduced (in other words, the result is less likely to vary largely each time the estimation is made). Namely, the estimation accuracy can be improved.

However, it is determined by the user whether plug-in charge is carried out or not. Accordingly, if the internal conditions of the battery are estimated only during plug-in charge, a deviation or difference between the status of the battery estimated during plug-in charge and the current status of the battery is more likely to arise as the time interval between plug-in charges increases. Namely, a situation may occur in which the degradation condition estimated in the past does not correctly reflect the current status of the battery.

Therefore, in the first embodiment, the parameters relating to the internal conditions of the battery (battery 10-1) are calculated during running of the vehicle, and the parameters are updated based on the calculation results. The parameters are applied to the battery model, so that a degradation condition of the battery can be estimated with high accuracy. Furthermore, a degradation condition can be estimated during running of the vehicle; therefore, the battery model can reflect the current status of the vehicle in real time. In addition, a chance to estimate a degradation condition of the battery can be obtained even when plug-in charge has not been performed for a long period of time.

Also, in the first embodiment, the parameters are calculated during plug-in charge, and the parameters are updated based on the calculation results. If a degradation condition is estimated only during running of the vehicle, estimation errors may gradually accumulate, resulting in a reduction of the estimation accuracy. On the other hand, the degradation condition can be estimated during plug-in charge with higher accuracy than that during running of the vehicle. Thus, the parameters calculated during plug-in charge are used for correcting the parameters calculated during running of the vehicle, so as to improve the accuracy in estimation of the degradation condition of the battery during running of the vehicle.

In the first embodiment as described above, the ECU 40 calculates the parameters for use in the battery model during plug-in charge and during running of the vehicle, and updates the stored parameters, based on the calculation results. It is thus possible to provide a sufficiently large number of chances to estimate a degradation condition of the battery, even if the user uses the vehicle in different manners. Furthermore, the accuracy with which a degradation condition of the secondary battery is estimated can be kept at a high level. Thus, according to the first embodiment, charge/discharge of the battery during running of the vehicle can be controlled in view of the thus estimated degradation condition of the vehicle.

Next, a process of estimating the internal conditions of the battery and charge/discharge control will be described with respect to the case where the vehicle is running and the case where plug-in charge is carried out.

FIG. 9 is a flowchart illustrating a process of selecting a running mode of the hybrid vehicle according to the first embodiment. The process illustrated in the flowchart is called from the main routine and executed at given time intervals or when a certain condition or conditions are satisfied.

Referring to FIG. 9, when the process is started, the ECU 40 determines in step S201 whether the SOC is larger than a threshold value. The threshold value, which is determined in advance, is equal to the control target value (e.g., 30%). The SOC estimated by the SOC estimating unit 52 is used in step S201.

If it is determined that the SOC is larger than the threshold value (YES in step S201), the control proceeds to step S202. In step S202, the ECU 40 selects the EV mode. In the EV mode, the engine 36 is basically stopped, and electric energy stored in the battery 10-1 is supplied to the second MG 32-2, so as to drive the second MG 32-2.

On the other hand, if it is determined that the SOC is equal to or smaller than the threshold value (NO in step S201), the control proceeds to step S203. In step S203, the ECU 40 selects the HV mode. In the HV mode, the battery 10-1 is charged or discharged so that the SOC of the battery 10-1 is kept within a specified range. After execution of step S202 or step S203, the process of FIG. 9 ends, and the ECU 40 returns to the main routine.

In this connection, the ECU 40 estimates the SOC according to the flowchart shown in FIG. 8, during running of the vehicle.

FIG. 10 is a flowchart illustrating a process of updating parameters during running of the vehicle. Referring to FIG. 10, upon a start of the process, the ECU 40 determines in step S211 whether the current running mode is the HV mode. If the current running mode is the EV mode (NO in step S211), the control proceeds to step S212.

In step S212, the ECU 40 carries out a parameter calculating process.

In this case, the ECU 40 calculates the diffusion coefficient, reaction resistance, and the capacity maintenance factor as a parameter relating to the capacity of the battery. The capacity maintenance factor is defined as the ratio of the full-charge capacity of the secondary battery when it is in the initial state, to the current full-charge capacity.

In step S213, the ECU 40 carries out a parameter updating process. More specifically, the ECU 40 (parameter updating unit 54) updates the previously stored parameters, using the parameters calculated in step S212. If, on the other hand, the current running mode is the HV mode (YES in step S211), the process proceeds to step S214.

In step S214, the ECU 40 carries out a parameter calculating process similar to that of step S212. It is, however, to be noted that the ECU 40 calculates only the diffusion coefficient and the reaction resistance. In step S215, the ECU 40 carries out a parameter updating process, using the parameters calculated in step S214. At this time, the ECU 40 corrects the parameters calculated in the EV running mode, and stores the corrected parameters. In this manner, the previously stored parameters are updated. This process will be described in detail later.

It is preferable that the SOC varies over a large range when the capacity maintenance factor is calculated. In this embodiment, the maximum range of variation of the SOC in the EV running mode is from 80% to 30%. On the other hand, the range of variation of the SOC in the HV mode is smaller than the range of variation of the SOC in the EV running mode. In the above-described example, the maximum range of variation of the SOC in the HV mode is 10% (namely, the SOC varies within the range of 25% to 35%). In this embodiment, therefore, the capacity maintenance rate is calculated in the EV running mode.

The diffusion coefficient represents the degree of diffusion of lithium in the active material of the battery after the battery current is passed through the battery and then stopped. Accordingly, the diffusion coefficient is calculated based on changes in the battery voltage after the battery current becomes equal to 0, for example, when the user operates the brake pedal so as to once bring the vehicle to a stop. Thus, the diffusion coefficient is calculated when a chance to make the battery current equal to 0 occurs.

The reaction resistance is estimated within a region in which the battery voltage changes linearly with respect to the battery current (but except for the case where the battery current is equal to 0). Accordingly, the reaction resistance can be calculated both in the EV running mode and the HV running mode. Also, the timing of calculating the reaction resistance is not particularly limited.

It is, however, to be noted that the battery basically keeps being discharged in the EV running mode. Thus, the estimation of the diffusion coefficient and reaction resistance is influenced by diffusion of lithium ions in the electrolyte resulting from discharge of the battery. Therefore, in the EV running mode, it is not easy to enhance the accuracy of estimation of the diffusion coefficient and reaction resistance. In the HV running mode, the above-described problem is less likely to occur, since charge and discharge of the battery are repeated. However, the SOC itself is low during running in the HV running mode; it is therefore difficult to enhance the accuracy of estimation of the diffusion coefficient. Furthermore, the reaction resistance can only be estimated when the SOC is in a limited, small range (e.g., 10%). Therefore, the parameters are also calculated during plug-in charge, so as to enhance the estimation accuracy.

Figure 11:
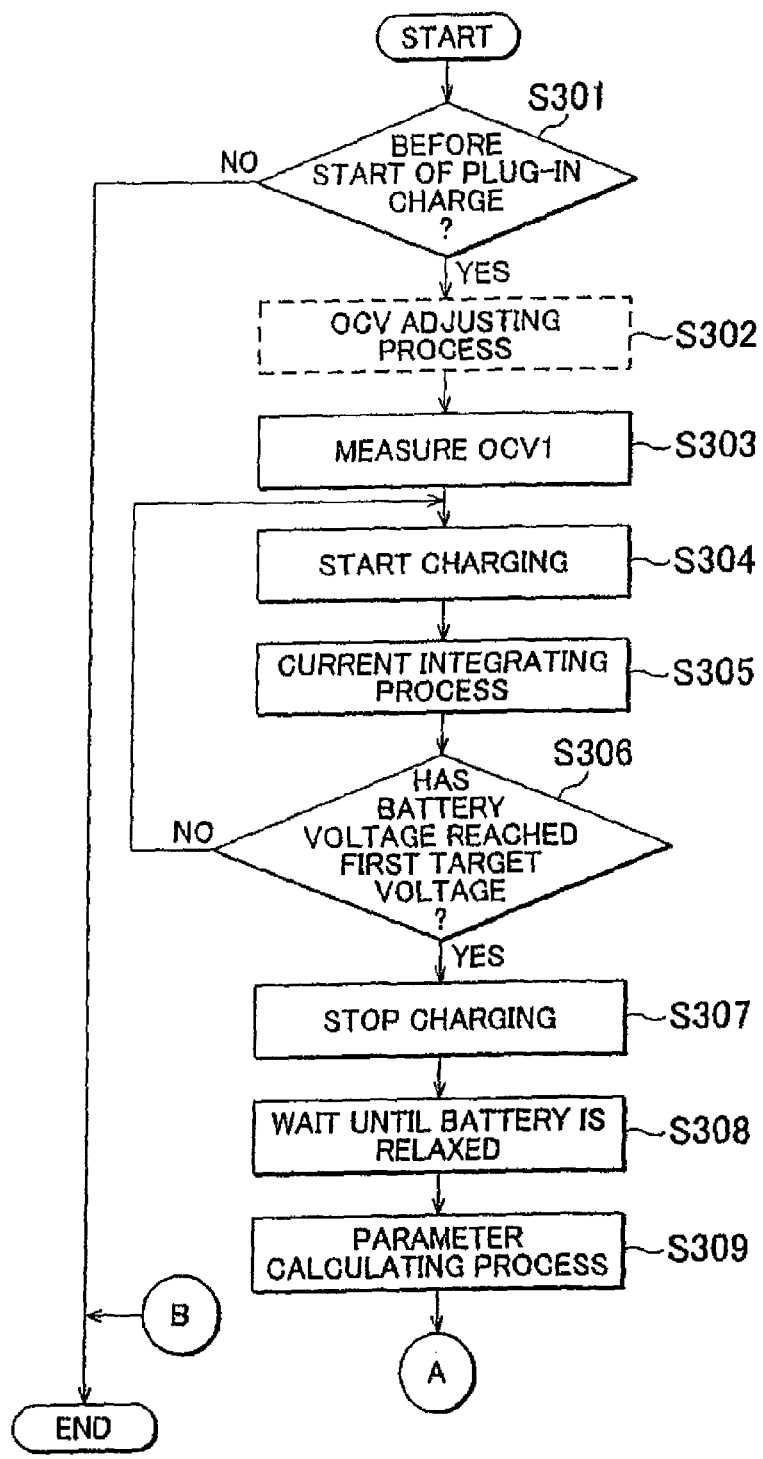
FIG. 11 is a first flowchart illustrating a process of estimating parameters and the full-charge capacity during plug-in charge.
Figure 12:
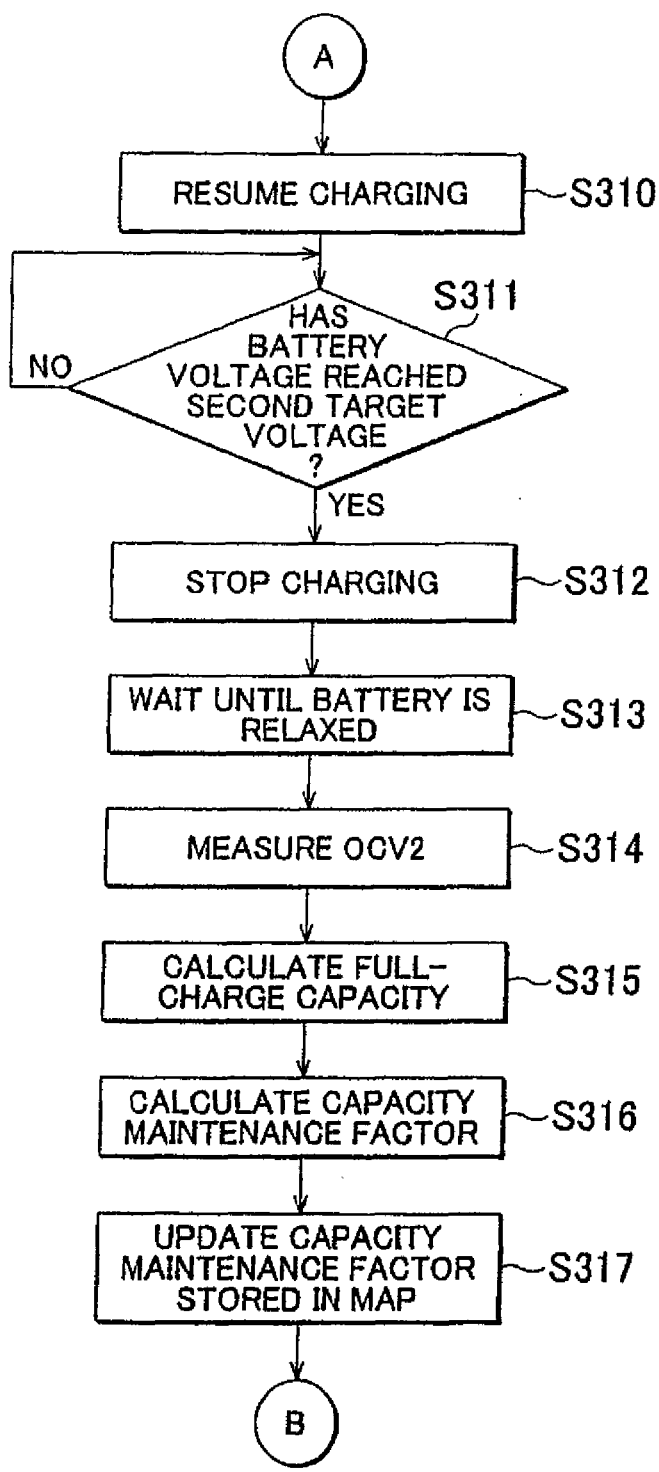
FIG. 12 is a second flowchart illustrating the process of estimating parameters and the full-charge capacity during plug-in charge.

FIG. 11 is a first flowchart useful for explaining a process of estimating the parameters and the full-charge capacity during plug-in charge. FIG. 12 is a second flowchart useful for explaining the process of estimating the parameters and the full-charge capacity during plug-in charge.

Referring to FIG. 11 and FIG. 12, the ECU 40 determines in step S301 whether the current conditions of the vehicle are those preceding a start of plug-in charge, by grasping the status of the charger 28. For example, if the ECU 40 receives signals CNCT, CPLT while the charger 28 has not been started, the ECU 40 determines that the current conditions of the vehicle are those preceding a start of plug-in charge.

If the current conditions of the vehicle are those preceding a start of plug-in charge (YES in step S301), the control, proceeds to step S302. If, on the other hand, the current conditions of the vehicle are not those preceding a start of plug-in charge (NO in step S301), the whole process ends. The vehicle is not in the conditions preceding a start of plug-in charge, for example, when the vehicle is running.

In step S302, the ECU 40 carries out an OCV adjusting process for controlling the open-circuit voltage (OCV) of the battery to a predetermined value (OCV1). In step S303, the ECU 40 measures OCV1. The OCV1 is, for example, a voltage VB1 detected by the voltage sensor 42-1 when the SMR 20-1 is in the OFF position.

The operation of step S302 may be skipped. In this case, the ECU 40 operates to measure the OCV before plug-in charge is started. The ECU 40 acquires the measured value as OCV1.

In step S304, the ECU 40 starts charging the battery 10-1. In step S305, the ECU 40 carries out a current integrating process. Specifically, the ECU 40 integrates the values of battery current (IB1) detected by the current sensor 44-1. More specifically, the data collecting unit 51 shown in FIG. 3 collects values of current IB1 detected by the current sensor

44-1. The SOC estimating unit 52 acquires the values of current IB1 from the data collecting unit 51, and integrates the current values.

In step S306, the ECU 40 determines whether the battery voltage (OCV) detected by the voltage sensor 42-1 has reached a first target voltage. The first target voltage is a given value that is lower than the battery voltage (a voltage obtained when the SOC=80%) at which charge of the battery 10-1 is completed.

If the battery voltage has not reached the first target voltage (NO in step S306), the control returns to step S304. If the battery voltage has reached the first target voltage (YES in step S306), the control proceeds to step S307.

In step S307, the ECU 40 once stops charging the battery 10-1. In step S308, the ECU 40 waits until the battery 10-1 is relaxed, namely, is brought into no-load conditions. The waiting time is determined in advance by experiment, or the like. In step S309, the ECU 40 carries out a parameter calculating process, using the battery 10-1 that is in a relaxed state.

When the parameter calculating process ends, the ECU 40 restarts charging of the battery 10-1 in step S310. In step S311, the ECU 40 determines whether the battery voltage (OCV) detected by the voltage sensor 42-1 has reached a second target voltage. The second target voltage is a battery voltage (a voltage reached when SOC=80%) at which charging of the battery 10-1 is completed. If the battery voltage has not reached the second target voltage (NO in step S311), step S311 is repeatedly executed. If the battery voltage has reached the second target voltage (YES in step S311), the control proceeds to step S312.

In step S312, the ECU 40 stops charging the battery 10-1. In step S312, integration of the current values is also finished. In step S313, the ECU 40 waits until the battery 10-1 is relaxed. The waiting time is also determined in advance by experiment, or the like. In the following step S314, the ECU 40 measures OCV (OCV2) of the battery 10-1 that is in a relaxed state.

In step S315, the ECU 40 calculates the full-charge capacity, based on the integrated current value, OCV1 and OCV2. Then, in step S316, the ECU 40 calculates the capacity maintenance factor by comparing the full-charge capacity calculated in step S315 with the initial value of the full-charge capacity. In step S317, the ECU 40 updates the previously stored value of capacity maintenance factor, by replacing it with the calculated value. In this case, the stored value of capacity maintenance factor is rewritten or replaced with the value calculated in step S316. After the operation of step S317 is finished, the whole process of FIG. 11 and FIG. 12 ends.

Figure 13:
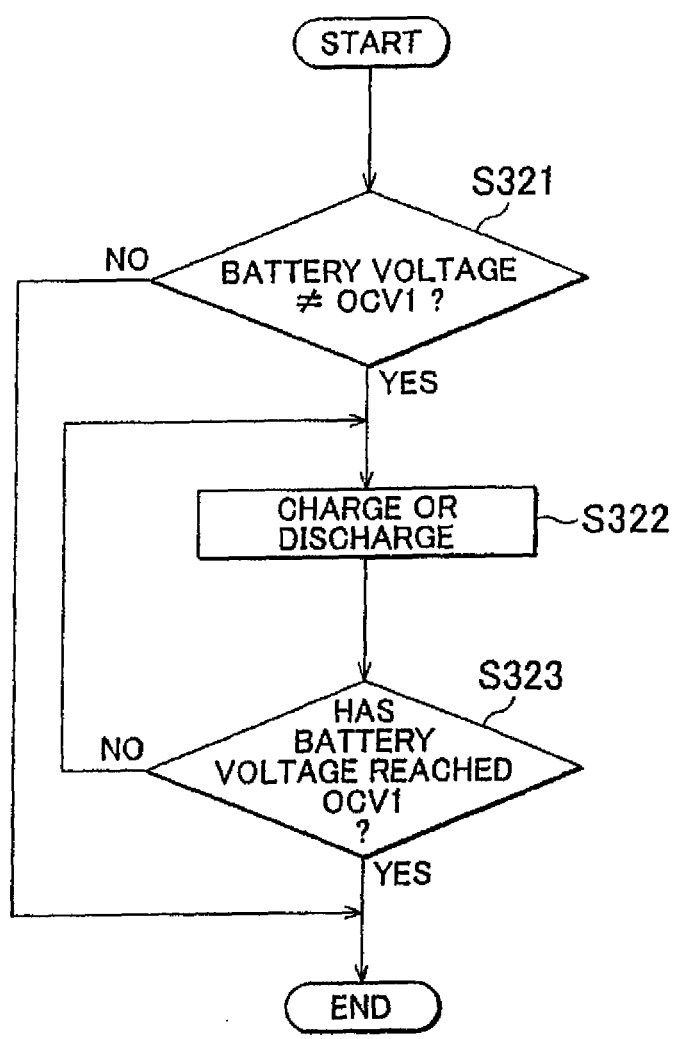
FIG. 13 is a flowchart illustrating in detail a process of adjusting OCV as shown in FIG. 11.

FIG. 13 is a flowchart useful for explaining the OCV adjusting process shown in FIG. 11 in greater detail. Referring to FIG. 13, the ECU 40 determines in step S321 whether the battery voltage (OCV) detected by the voltage sensor 42-1 is different from OCV1. If the battery voltage is different from OCV1 (YES in step S321), the control proceeds to step S322. On the other hand, if the battery voltage is equal to OCV1 (NO in step S321), the whole process ends.

In step S322, the ECU 40 puts the battery 10-1 on charge or discharge. If the battery voltage is larger than OCV1, the ECU 40 puts the battery 10-1 on discharge. If, on the other hand, the battery voltage is smaller than OCV1, the ECU 40 puts the battery 10-1 on charge.

In step S323, the ECU 40 determines whether the battery voltage (in this case, OCV) has reached OCV1. If the battery voltage has not reached OCV1 (NO in step S323), the control returns to step S322. Accordingly, the battery 10-1 is charged or discharged until the battery voltage reaches OCV1. When the battery voltage reaches OCV1 (YES in step S323), the whole process ends.

Figure 14:
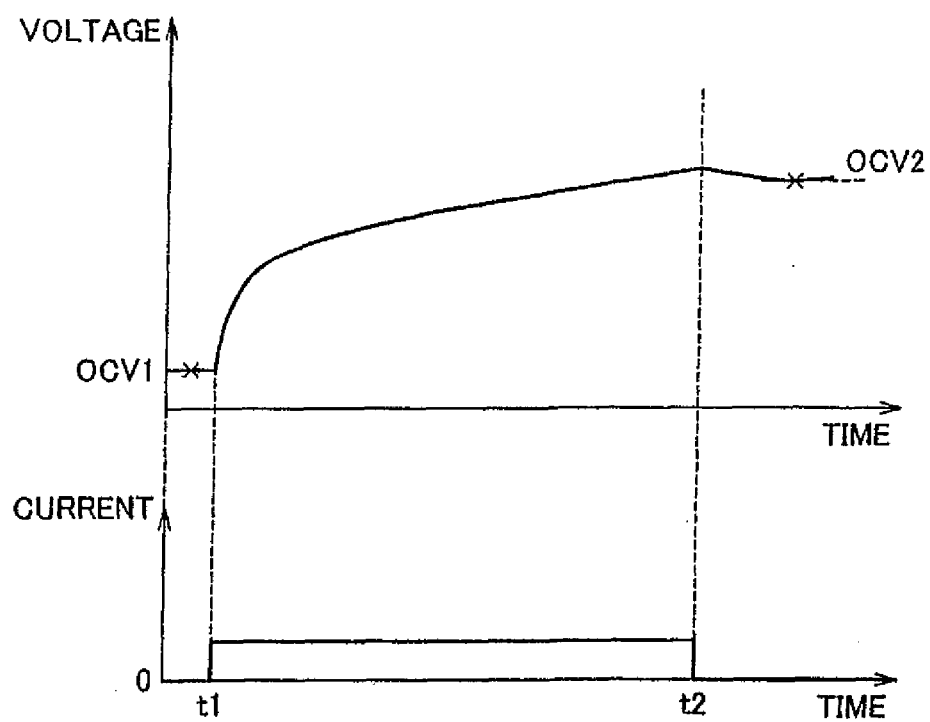
FIG. 14 is a graph useful for explaining changes in battery voltage (OCV) and battery current with time, during plug-in charge.

FIG. 14 is a graph useful for explaining changes in the battery voltage (OCV) and battery current with time during plug-in charge. Referring to FIG. 14, voltage OCV1 is measured before plug-in charge is started (i.e., before time t1. At time t1, plug-in charge is started. The charging current is basically constant during the plug-in charge.

In this embodiment, charging is once stopped in the middle of plug-in charge, for calculation of parameters. However, for the sake of simplicity, changes of voltage and current with time will be explained with reference to FIG. 14, on the assumption that charging is not temporarily stopped or interrupted after plug-in charge is started.

If the battery voltage reaches the second target voltage at time t2, the charging current becomes equal to 0, so that plug-in charge is completed. After a lapse of a certain time from time t2, the ECU 40 determines that the battery 10-1 is in a relaxed condition, and obtains a voltage value (OCV2) at this time.

Thus, during plug-in charge, a condition where no battery current flows can be created, whereby the OCV can be measured with high accuracy. By measuring the OCV with high accuracy, it is possible to estimate the full-charge capacity with high accuracy.

Through the execution of the OCV adjusting process, the full-charge capacity can be estimated each time under the same condition. Furthermore, since the time (charge time) for which the current is integrated can be reduced, an error in the integrated current value, resulting from detection errors of the current sensor, can be reduced. Accordingly, the full-charge capacity can be estimated with further improved accuracy.

Figure 15:
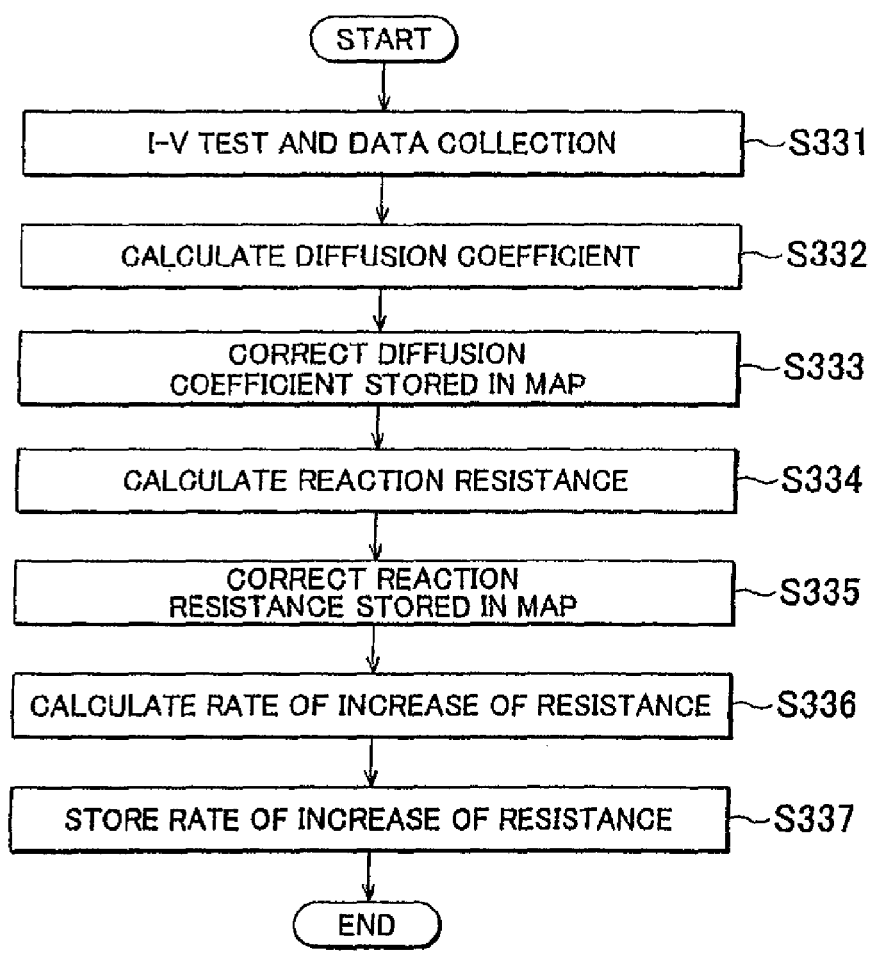
FIG. 15 is a flowchart illustrating a parameter calculating process as shown in FIG. 11.

FIG. 15 is a flowchart for explaining the parameter calculating process shown in FIG. 11. Referring to FIG. 15, the ECU 40 performs an I-V (current-voltage) test, and collects data concerning the test result in step S331. in the I-V test, a given current is applied to or delivered from the battery, and the behavior or change of battery voltage responsive to the application or delivery of the current is measured.

Figure 16:
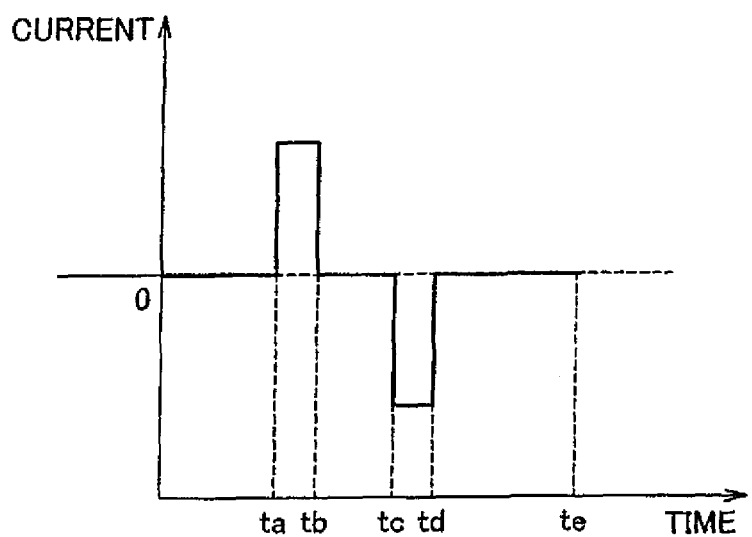
FIG. 16 is a waveform diagram showing a current waveform in an I-V test.

FIG. 16 is a waveform diagram showing a current waveform in the I-V test. Referring to FIG. 16, at time ta or earlier, the current is equal to 0, and the battery is in a relaxed state. Then, a given current is delivered from the battery over a period from time ta to time tb. The current delivered in this period is, for example, 1C, and the period between time ta and time tb is, for example, 10 seconds. 1C is a value of current with which the entire capacity of the battery is charged or discharged within one hour.

The current is equal to 0 over a period from time tb to time tc. This period is a predetermined time required to bring the battery into a relaxed state.

Then, a given current is applied to the battery over a period from time tc to time td. The current applied in this period, for example, 1C, and the period between time tc and time td is, for example, 10 seconds. The current becomes equal to 0 at time td, and is kept at 0 over a period from time td to te. This period is a predetermined time required to bring the battery into a relaxed state. In step S331, the battery voltage is measured when the current is changed in the manner as shown in FIG. 16.

Figure 17:
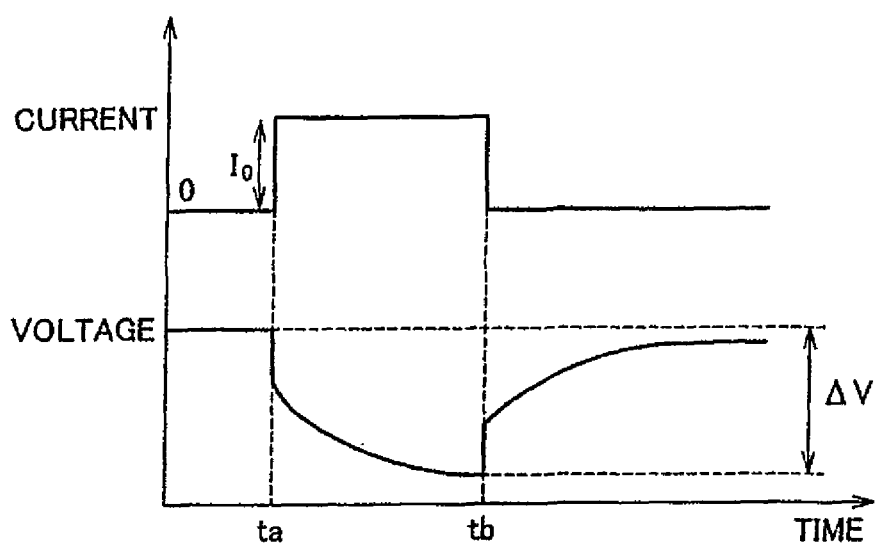
FIG. 17 is a waveform diagram showing a waveform of battery voltage when current is delivered from the battery according to the current waveform as shown in FIG. 16.

FIG. 17 is a waveform diagram showing a waveform of battery voltage when current is delivered from the battery according to the current waveform as shown in FIG. 16. Referring to FIG. 17, the current starts being delivered from the battery at time ta. While the current is delivered from the battery, the battery voltage is reduced. At time tb, the delivery of the current is stopped. As a result, the battery voltage increases toward the level prior to time ta.

Referring back to FIG. 15, the ECU 40 calculates the diffusion coefficient in step S332. More specifically, the ECU 40 calculates the diffusion coefficient, based on the behavior of the battery voltage between time tb and time tc, so that the behavior of the battery voltage in the battery model agrees with the measurement result.

In step S333, the ECU 40 corrects the diffusion coefficient stored in the map, using the value of diffusion coefficient calculated in step S332.

In step S334, the ECU 40 calculates the reaction resistance. More specifically, the ECU 40 applies the diffusion resistance calculated in step S334, to the battery model expressions. Furthermore, the reaction resistance is calculated so that the I-V characteristics according to the battery model agree with the behavior of the battery voltage between time to and time tb.

In step S335, the ECU 40 corrects the reaction resistance stored in the map, using the value of reaction resistance calculated in step S335.

In step S336, the ECU 40 carries out a process of estimating the rate of increase of internal resistance of the battery (or the rate of increase of resistance). More specifically, the ECU 40 performs a simulated I-V test (see FIG. 17), using a battery model that reflects the diffusion coefficient estimated in step S332 and the reaction resistance estimated in step S334. The ECU 40 calculates the rate of increase of resistance, based on the result of the I-V test. As shown in FIG. 17, the amount of change of battery voltage in the I-V test is denoted as $\Delta V$, and the battery current is denoted as I. From the I-V test, the estimated value of the internal resistance of the battery is calculated as $\Delta V/I_0$. The rate of increase of resistance represents the ratio of the estimated value of the internal resistance to the initial value of the internal resistance. The initial value of the internal resistance is stored in advance in the ECU 40.

In step S337, the ECU 40 stores the rate of increase of resistance calculated in step S336. After execution of step S337, the parameter calculating process as shown in FIG. 15 ends.

The operations of the above-indicated steps S333, S335 and S337 may be carried out in a single step or at a time.

[Details of Updating of Parameters] (1) Calculation of the Rates of Change of Parameters In this embodiment, the parameters are updated by updating the rates of change of parameters. With regard to the DC resistance $R_a$ as one of the parameters, the rate of change gr from a parameter value $R_{an}$ of the battery that is in the initial state is defined by Equation (9) as follows.

$$gr = R_s/R_{an} \quad (9)$$

The parameter updating units 54, 55 estimate the rate of change gr of the DC resistance $R_a$, using a recursive least square method with a forgetting fact, which will be described later. Initially, the recursive lease square method with a forgetting factor will be explained.

According to the recursive least square method, in a system represented by a linear regression model indicated by Equation (10) below, parameter $\Theta$ in Eq. (10) is estimated through sequential calculations according to time update equations indicated by Equation (11) through Equation (13), using the initial conditions of Equation (14) and Equation (15). In each equation, the estimated value of parameter $\Theta$ is denoted as $\Theta\#$.

$$Y = Z^T \Theta \quad (10)$$

$$\Theta\#(k) = \Theta\#(k-1) + \frac{P(k-1)Z(k)}{\lambda + Z^T(k)P(k-1)Z(k)} \varepsilon(k) \quad (11)$$

$$\varepsilon(k) = Y(k) - Z^T(k)\Theta\#(k-1) \quad (12)$$

$$P(k) = \frac{1}{\lambda}\left\{P(k-1) - \frac{P(k-1)Z(k)Z^T(k)P(k-1)}{\lambda + Z^T(k)P(k-1)Z(k)}\right\} \quad (13)$$

$$\Theta\#(0) = \Theta\#_0 \quad (14)$$

$$P(0) = \gamma I \quad (15)$$

In Eq. (11) and Eq. (13), $\lambda$ is a forgetting factor, and, generally, $\lambda$ is smaller than 1.0 ($\lambda<1.0$). Also, P is a covariance matrix, and the initial value $P(0)$ of Eq. (15) is a matrix obtained by multiplying diagonal elements of a unit matrix I by a constant $\gamma$, where a large value around $10^2$-$10^3$ is generally used for $\gamma$. The initial value $\Theta\#_0$ of the parameter $\Theta\#$ is generally a zero vector.

Using the recursive least square method with the forgetting factor, as described above, the rate of change gr of the DC resistance is estimated in the following manner.

The DC resistance $R_a$ of the secondary battery that has changed (degraded) with time from a new-product condition is represented by $R_a = gr \cdot R_{an}$, according to the definition of Eq. (9). This equation is substituted into Eq. (1), and is further rewritten into the form of Eq. (10), so that Equation (16) as indicated below is obtained as a linear regression model based on the battery model expression.

$$\underbrace{U(\theta) - V}_{Y} = \underbrace{R_{an}(\theta, T) \cdot I}_{Z} \times \underbrace{gr}_{\theta} \quad (16)$$

During plug-in charge, Y can be calculated by using a measured value obtained when the battery is in a relaxed state, as the open-circuit voltage $U(\theta)$ on the left side of Eq. (16), and using voltage VB1 measured when the battery voltage is changed (in the period from time to to time tb in FIG. 17), as V. Also, with regard to the right side of Eq. (16), the initial-state parameter value $R_{an}$ of the DC resistance is obtained by referring to a map stored in the storing unit 53 in which the battery temperature (TB1) and the local SOC $\theta_1$ and SOC $\theta_2$ are arguments. Also, Z can be calculated by substituting a current value per unit plate area, which is calculated from the current measured value IB1, as the battery current I.

During running of the vehicle, Y can be calculated by using a value estimated in the course of the charging rate estimating process, as the open-circuit voltage $U(\theta)$ on the left side of Eq. (16), and using a measured battery voltage VB1 as V. The above-described process can be applied to the terms on the right side of Eq. (16).

Thus, the rate of change gr of the DC resistance $R_a$ can be sequentially estimated, as estimated parameter $\Theta$, according to the recursive least square method with the forgetting factor as indicated by Eq. (11)-Eq. (15), using the thus calculated Y and Z. It is, however, to be understood that other types of least square methods, such as batch least-square method, may also be employed.

In the first embodiment, the rate of change of reaction resistance Rr is deemed equal or equivalent to the above-mentioned rate of change gr# of DC resistance. In the following, the rate of change of reaction resistance Rr (values calculated by the parameter updating units 54, 55) will be denoted as gr#.

With regard to the diffusion coefficient $D_s$, too, the rate of change gd of diffusion coefficient is defined as a ratio of the diffusion coefficient $D_s$ to an initial-state parameter value ($D_{sn}$), according to Equation (17) as follows.

$$gd=D_s/D_{sn} \tag{17}$$

The ECU 40 repeatedly acquires data of the voltage VB1, current IB1 and the temperature TB1, over a time range in which an influence of diffusion resistance significantly appears in the battery voltage. The ECU 40 searches a given number of times (repetitions) for the rate of change at which an evaluation function gives the smallest value, using the battery data in the above range, and sets the rate of change. For example, a known GSM method (golden section method) is used as a method for searching for the rate of change of diffusion coefficient at which the evaluation function gives the smallest value.

The GSM method is one type of dichotomy, and is characterized in that a search range and a tolerance are determined so that the optimum value that is within tolerance can be obtained by a known search function. The diffusion coefficient of lithium in the active material of the lithium-km battery that has been used under certain usage conditions for a certain period can be grasped in advance by a degradation test, or the like, and the maximum degree to which the diffusion coefficient changes as compared with that of the initial state can be predicted in advance. Accordingly, if the maximum range over which the rate of change can change is set as the search range, the calculation time required to estimate the rate of change of diffusion coefficient can be advantageously predicted. It follows that this method is suitably applied to secondary batteries installed on hybrid vehicles and electric vehicles. Details of the GSM method are known in the art, and therefore, detailed description of this method will not be repeated herein.

During plug-in charge, the ECU 40 acquires data of voltage VB1 at given intervals in a period subsequent to time tb in FIG. 17, and calculates the rate of change of diffusion resistance, using the data. During running of the vehicle, the ECU 40 acquires data of voltage VB1 at given intervals after the user operates the brake pedal and once stops the vehicle so that the battery current becomes equal to 0, and calculates the rate of change of diffusion resistance, using the data.

During running of the vehicle, the ECU 40 calculates the capacity maintenance factor by the following method, for example. As the secondary battery degrades, not only the full-charge capacity is reduced, but also an open-circuit voltage characteristic changes. These changes in the status of the secondary battery can be modeled as two phenomena. One of the phenomena is reduction of a single-electrode capacity at the positive electrode and the negative electrode, and the other phenomenon is a shift in the correspondence between charging characteristics of the positive electrode and the negative electrode. The shift in the correspondence between charging characteristics means a shift in the correspondence or relationship between the average lithium concentration $c_{save}$ in the active material of the positive electrode and that of the negative electrode, or a shift in the correspondence between the positive electrode and the negative electrode in terms of the average charging rate represented as the ratio of the average lithium concentration $c_{save}$ in the active material to the limiting or maximum lithium concentration ($c_{s,i,max}$) in the active material.

Figure 18:
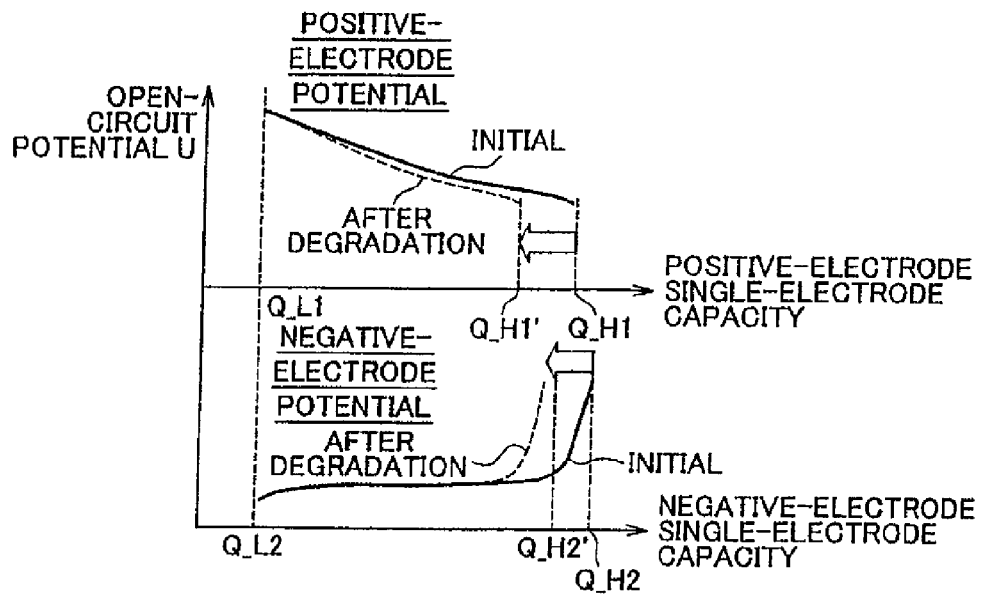
FIG. 18 is a schematic view showing change of the single-electrode open-circuit potential with reduction of the single-electrode capacity.

FIG. 18 is a schematic view showing change of the single-electrode open-circuit potential with reduction of the single-electrode capacity. Referring to FIG. 18, Q_L1 and Q_H1 on the axis of the positive-electrode single-electrode capacity represent capacities corresponding to the local SOC $\theta_{L1}$ and $\theta_{H1}$, respectively, of FIG. 5, in the initial state of the secondary battery. Similarly, Q_L2 and Q_H2 on the axis of negative-electrode single-electrode capacity represent capacities corresponding to the local SOC $\theta_{L2}$ and $\theta_{H2}$, respectively, of FIG. 5, in the initial state of the secondary battery. The "reduction of the single-electrode capacity" means reduction of the ability of each of the positive electrode and negative electrode to receive lithium. This represents a phenomenon, such as a reduction of the active material that works effectively upon charge/discharge in each electrode. At the positive electrode, the reduction in the ability to receive lithium results in a reduction of the capacity corresponding to the local SOC $\theta_{H1}$ from Q_H1 to Q_H1'. Similarly, at the negative electrode, the reduction in the ability to receive lithium results in a reduction of the capacity corresponding to the local SOC $\theta_{H2}$ from Q_H2 to Q_H2'.

Even if the secondary battery degrades, the relationship between the local SOC $\theta_1$ and the positive-electrode open-circuit potential $U_1$ does not change. Therefore, where the relationship between the local SOC$\theta_1$ and the positive-electrode open-circuit potential $U_1$ is converted into the relationship between the positive-electrode single-electrode capacity and the positive-electrode open-circuit potential, the curve representing the relationship between the positive-electrode single-electrode capacity and the positive-electrode open-circuit potential is scaled down or shortened as the secondary battery degrades, as shown in FIG. 18. Similarly, where the relationship between the local SOC $\theta_2$ and the negative-electrode open-circuit potential $U_2$ is converted into the relationship between the negative-electrode single-electrode capacity and the open-circuit potential, too, the curve representing the relationship between the single-electrode capacity and the open-circuit potential is scaled down or shortened as the secondary battery degrades, as shown in FIG. 18.

Figure 19:
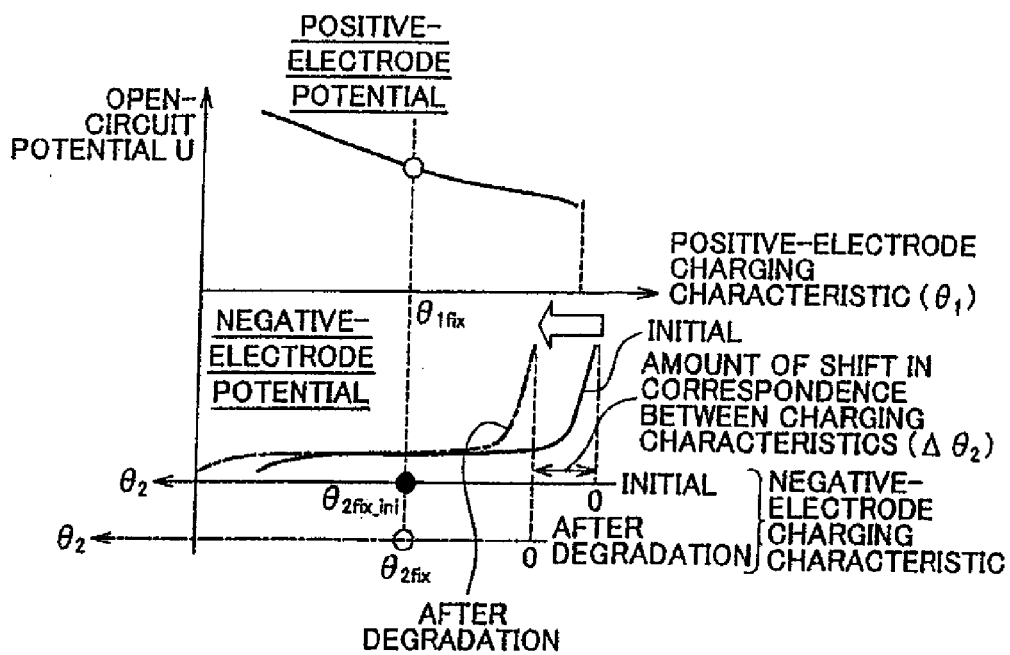
FIG. 19 is a schematic view showing a shift in the correspondence between charging characteristics of positive and negative electrodes.

FIG. 19 is a schematic view showing a shift in the correspondence between charging characteristics of the positive electrode and the negative electrode, Referring to FIG. 19, the "shift in the correspondence between charging characteristics" indicates that, when a pair of positive electrode and negative electrode is used as the battery, the relationship or correspondence between a charging characteristic (the average charging rate in the positive-electrode active material) of the positive electrode and a charging characteristic (the average charging rate in the negative-electrode active material) deviates or shifts from that of the secondary battery when it is in the initial state.

The curve indicating the relationship between the charging characteristic (the average charging rate in the active material) $O_1$ and the open-circuit potential $U_2$ is similar to the curve as shown in FIG. 5. It is, however, to be noted that the axis of the negative-electrode charging characteristic shifts by $\Delta\theta_2$ in a direction in which the positive-electrode charging characteristic $\theta_1$ decreases. As a result, the curve indicating the relationship between the negative-electrode charging characteristic $\theta_2$ and the open-circuit potential $U_2$ also shifts by $\Delta\theta_2$ in the direction in which the positive-electrode charging characteristic $\theta_1$ decreases. While the charging characteristic of the negative electrode corresponding to the charging characteristic $\theta_{1fix}$ is $\theta_{2fix\_}^{ini}$ in the initial state of the secondary battery, it becomes equal to $\theta_{2fix}$ after degradation of the second battery. As one example of reason why such a shift in the correspondence between the charging characteristics occurs, it may be considered that lithium ions discharged from the positive electrode during charge are not taken into the negative electrode, but become a by-product, or the like. In FIG. 19, the negative-electrode charging characteristic $\theta_{L2}$ is equal to 0 ($\theta_{L2}=0$), which means that the negative electrode is completely free from lithium (in other words, lithium is completely released from the negative electrode).

In this embodiment, three parameters, i.e., "positive-electrode capacity maintenance factor", "negative-electrode capacity maintenance factor" and "capacity corresponding to the shift in the correspondence between the charging characteristic of the positive and negative electrodes" (which will be simply called "positive-negative electrodes discrepancy capacity", are introduced, as parameters relating to reduction of the capacity, into the battery model, so that the above-mentioned two phenomena can be modeled. In the following, a method of modeling the two capacity-reducing phenomena (i.e., reduction of the single-electrode capacity, and a shift in the correspondence between charging characteristics) will be specifically described.

The capacity maintenance factor of a single electrode as each of the positive electrode and the negative electrode is represented by the ratio of the single-electrode capacity (after degradation) to the single-electrode capacity (in the initial period). The single-electrode capacity is defined as being reduced by a certain amount from a value obtained in the initial state, after the secondary battery degrades. The positive-electrode capacity maintenance factor $k_1$ and the negative-electrode capacity maintenance factor $k_2$ are determined according to Equation (18) and Equation (19) as follows.

$$k_1 = \frac{Q_{1\_ini} - \Delta Q_1}{Q_{1\_ini}} \quad (18)$$

$$k_2 = \frac{Q_{2\_ini} - \Delta Q_2}{Q_{2\_ini}} \quad (19)$$

$Q_{1\_}{}^{ini}$ and $Q_{2\_}{}^{ini}$ represent the initial-state single-electrode capacities of the positive electrode and the negative electrode, respectively, and $\Delta Q_1$ and $\Delta Q_2$ represent the amounts of reduction of the single-electrode capacities at the positive electrode and the negative electrode, respectively. The single-electrode capacities $Q_{1\_}{}^{ini}$ and $Q_{2\_}{}^{ini}$ are constants obtained in advance by experiment, for example.

Also, the positive-negative electrodes discrepancy capacity corresponding to the amount of relative shift or difference ($\Delta\theta_2$ shown in FIG. 19) between the positive-electrode charging characteristic axis and the negative-electrode charging characteristic axis is denoted as $\Delta Q_s$.

Figure 20:
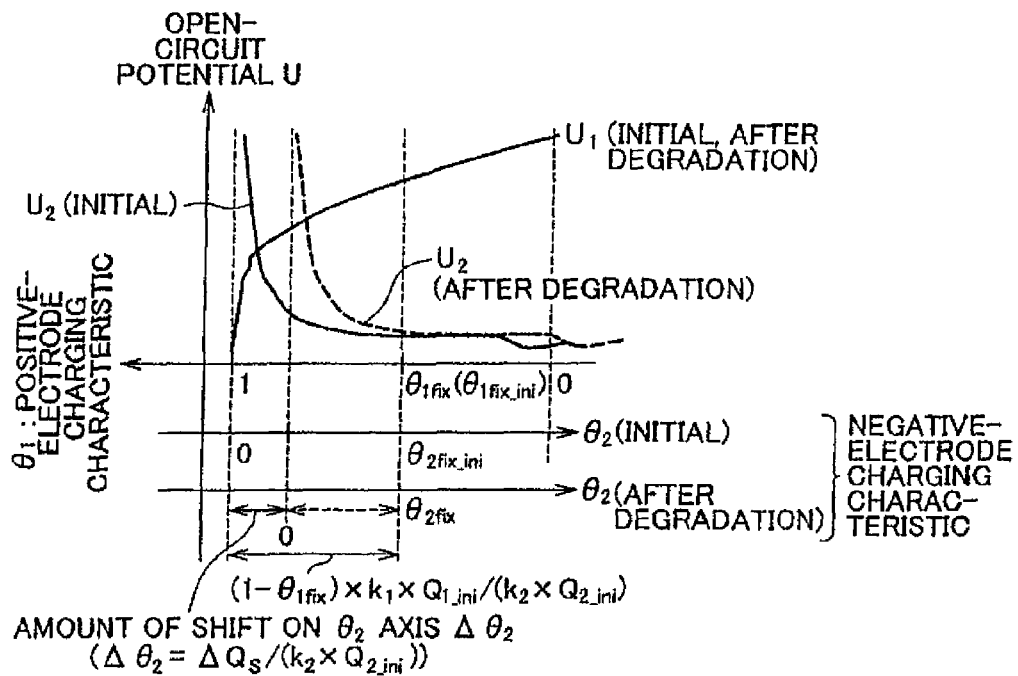
FIG. 20 is a schematic view useful for explaining a shift in the correspondence between charging characteristics of the positive and negative electrodes due to degradation of the battery.

FIG. 20 is a schematic view useful for explaining a shift in the correspondence between the charging characteristics of the positive and negative electrodes due to degradation of the battery. Referring to FIG. 20, after degradation of the secondary battery, the capacity of the negative electrode when its charging characteristic $\theta_2$ is 1 becomes equal to $(Q_{2\_}{}^{ini}-\Delta Q_2)$. Also, the positive-negative electrodes discrepancy capacity $\Delta Q_s$ is the capacity corresponding to the amount of shift $\Delta\theta_2$ of the negative-electrode charging characteristic axis relative to the positive-electrode charging characteristic axis. From these, the relationship that $1: \Delta\theta_2=(Q_{2\_}{}^{ini}-\Delta Q_2): \Delta Q_s$ is established. Accordingly, the positive-negative electrodes discrepancy capacity $\Delta O_s$ after degradation of the secondary battery is calculated according to Equation (20) as follows.

$$\Delta Q_s = (Q_{2\_ini} - \Delta Q_2) \times \Delta\theta_2 \quad (20)$$

$$= k_2 \times Q_{2\_ini} \times \Delta\theta_2$$

The initial negative-electrode charging characteristic corresponding to the initial positive-electrode charging characteristic $\theta_{1fix\_}{}^{ini}$ is denoted as $\theta_{2fix\_}{}^{ini}$, and the negative-electrode charging characteristic corresponding to the positive-electrode charging characteristic $\theta_{1fix}$ after a shift in the charging characteristic due to degradation of the secondary battery occurs is denoted as $\theta_{2fix}$. Also, the initial positive-electrode charging characteristic $\theta_{1fix\_}{}^{ini}$ is used as the reference for the shift. Namely, $\theta_{1fix\_}{}^{ini}$ and $\theta_{1fix}$ are equal to each other. When a relative shift in the correspondence between the charging characteristics of the positive and negative electrodes occurs due to degradation of the secondary battery, the positive-electrode charging characteristic $\theta_{1fix}$ and the negative-electrode charging characteristic $\theta_{2fix}$ are calculated according to Equations (21) and (22) as follows.

$$\theta_{1fix} = \theta_{1fix\_ini} \quad (21)$$

$$\theta_{2fix} = \frac{(1-\theta_{1fix}) \times k_1 \times Q_{1\_ini} - \Delta Q_2}{k_2 \times Q_{2\_ini}} \quad (22)$$

In the battery model of this embodiment, the reductions in the single-electrode capacities of the positive electrode and negative electrode are reflected by thickness of each electrode, and the volume fraction of the active material, as indicated in Equation (23) through Equation (26).

$$L_1 = L_{10} \times \sqrt{K_1} \quad (23)$$

$$L_2 = L_{20} \times \sqrt{k_2} \quad (24)$$

$$\epsilon_{s,1} = \epsilon_{s0.1} \times \sqrt{k_1} \quad (25)$$

$$\epsilon_{s,2} = \epsilon_{s0.2} \times \sqrt{k_2} \quad (b\ 26)$$

In the above equations, $L_{10}$ and $L_{20}$ are the electrode thickness of the positive electrode in the initial state, and the electrode thickness of the negative electrode in the initial state, respectively, and $\epsilon_{s0.1}$ and $\epsilon_{s0.2}$ are the volume fraction of the positive-electrode active material in the initial state, and the volume fraction of the negative-electrode active material, respectively.

The open-circuit voltage OCV that appears when the capacity of each of the positive electrode and negative electrode is reduced and a relative shift in the correspondence between the charging characteristics of the positive and negative electrodes occurs due to degradation is calculated according to Equation (27) as follows.

$$OCV(\theta_{1ave}, \theta_{2ave}) = U(\theta_{1ave}) - U(\theta_{2ave}) \quad (27)$$

In Eq. (27) above, $\theta_{1ave}$ and $\theta_{2ave}$ are the average charging rates in the active materials of the positive electrode and negative electrode, respectively, and are defined by Equation (28) below. In Eq. (28), $c_{save,1}$ is the average lithium concentration in the active material.

$$\theta_{iave} = \frac{c_{save,i}}{c_{a,i,max}}, (i = 1, 2) \quad (28)$$

The relationship according to Equation (29) below is established between $\theta_{1ave}$ and $\theta_{2ave}$.

$$\theta_{2ave} = \theta_{2fix} + (\theta_{1fix} - \theta_{1ave}) \times \lambda \quad (29)$$

Also, $\lambda$ indicated in Eq. (29) is defined by Equation (30) as follows.

$$\lambda = \frac{c_{s,1,max} L_1 \varepsilon_{s,1}}{c_{s,2,max} L_2 \varepsilon_{s,2}} \tag{30}$$

Figure 21:
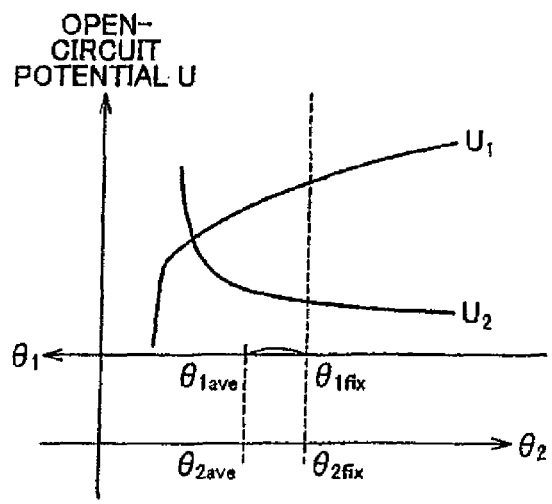
FIG. 21 is a view useful for explaining equations representing the relationship between the average charging rate $\theta_{1ave}$ in a positive-electrode active material and the average charging rate $\theta_{2ave}$ in a negative-electrode active material.

FIG. 21 is a view useful for explaining the equations representing the relationship between the average charging rate $\theta_{1ave}$ in the positive-electrode active material and the average charging rate $\theta_{2ave}$ in the negative-electrode active material. Referring to FIG. 21, the positive-electrode charging characteristic $\theta_{1fix}$ and the negative-electrode charging characteristic $\theta_{2fix}$ are supposed to correspond with each other. Also, when lithium discharged from the negative electrode is entirely adsorbed by the positive electrode, the negative-electrode charging characteristic changes from $\theta_{2fix}$ to $\theta_{2ave}$, and the positive-electrode charging characteristic changes from $\theta_{fix}$ to $\theta_{1ave}$.

Since the amount of change of lithium at the positive electrode is equal to the amount of change of lithium at the negative electrode, the following relationship is established from the above-indicated Eq. (23) through Eq. (26) and Eq. (28), where S represents the plate area of each of the positive electrode and negative electrode. $(\theta_{1fix} - \theta_{1ave}) \times c_{s,1,max} \times L_1 \times \varepsilon_{s,1} \times S = (\theta_{2ave} - \theta_{2fix}) \times c_{s,2,max} \times L_2 \times \varepsilon_{s,2} \times S$ By solving the above equation, the above-indicated Eq. (29) and Eq. (30) are established.

By calculating the average charging rate $\theta_{1ave}$ in the positive-electrode active material and the average charging rate $\theta_{2ave}$ in the negative-electrode active material, it is possible to calculate an open-circuit voltage characteristic when the single-electrode capacity of each of the positive and negative electrodes is reduced and a shift in the correspondence between the charging characteristics of the positive and negative electrodes occurs due to degradation, according to Eq. (27). $\theta_{1ave}$ and $\theta_{2ave}$ are associated with the positive-electrode charging characteristic $\theta_{1fix}$ and the negative-electrode charging characteristic $\theta_{2fix}$, as indicated in Eq. (29). As indicated in Eq. (22), the negative-electrode charging characteristic $\theta_{2fix}$ includes the positive-electrode capacity maintenance factor $k_1$, negative-electrode capacity maintenance factor $k_2$ and the positive-negative electrodes discrepancy capacity $\Delta Q_s$, which are parameters relating to reduction of the capacity. Accordingly, $\theta_{1ave}$ and $\theta_{2ave}$ after degradation of the secondary battery can be estimated by estimating the positive-electrode capacity maintenance factor $k_1$, negative-electrode maintenance factor $k_2$ and the positive-negative electrodes discrepancy capacity $\Delta Q_s$. Thus, the open-circuit voltage characteristic of the secondary battery, which varies with aging of the secondary battery (i.e., degradation of the secondary battery with time), can be estimated.

Next, a method of calculating the full-charge capacity of the battery when the single-electrode capacity of each of the positive and negative electrodes is reduced and a shift in the correspondence between the charging characteristics of the positive and negative electrodes occurs due to degradation will be explained.

Initially, the positive-electrode charging characteristic $\theta_1^{100}$ when the SOC is 100% and the positive-electrode charging characteristic $\theta_1^{0}$ when the SOC is 0% are calculated, according to the equation (Eq. (27)) for calculating the open-circuit voltage OCV of the degraded battery. More specifically, where the open-circuit voltage that defines SOC=100% is denoted as $V_{100}$, and the open-circuit voltage that defines SOC=0% is denoted as $V_0$, the positive-electrode charging characteristic $\theta_1$ (positive-electrode charging characteristic $\theta_1^{100}$) that satisfies OCV($\theta_1$, $\theta_2$)=$V_{100}$ and the positive-electrode charging characteristic $\theta_1$ (positive-electrode charging characteristic $\theta_1^{0}$) that satisfies OCV($\theta_1$, $\theta_2$)=$V_0$ are calculated. In the battery used in this embodiment, $V_{100}$ at SOC=100% is equal to 4.1V, and $V_0$ at SOC=0% is equal to 3.0V.

The full-charge capacity, $Q_d$ per unit plate area after degradation is calculated according to Equation (31) as follows.

$$Q_d = \frac{(\theta_{1\_0} \theta_{1\_100}) c_{s,1,max} L_1 \varepsilon_{s,1} F}{3600} \tag{31}$$

Equation (31) includes the electrode thickness $L_1$ and the volume fraction $\varepsilon_{s,1}$, both of which depend on the positive-electrode capacity maintenance factor $k_1$. Accordingly, the full-charge capacity $Q_d$ varies depending on the positive-electrode maintenance factor $k_1$. Namely, if the positive-electrode capacity maintenance factor $k_1$ decreases due to degradation of the secondary battery, the full-charge capacity $Q_d$ is reduced accordingly. Also, the positive-electrode charging characteristics $\theta_1^{100}$ and $\theta_1^{0}$ vary depending on the positive-electrode capacity maintenance factor $k_1$, negative-electrode capacity maintenance factor $k_2$ and the positive-negative electrodes discrepancy capacity $\Delta Q_s$.

The full-charge capacity $Q_d^{all}$ after degradation is calculated according to Equation (32) as follows, where S denotes the electrode plate area.

$$Q_d^{all} = Q_d \times S \tag{32}$$

Also where the battery capacity per unit plate area of the battery that is in the initial state is denoted as $Q_{ini}$, the full-charge capacity maintenance factor $dQ_{rate}$ after degradation is calculated according to Equation (33) as follows.

$$dQ_{rate} = \frac{Q_d}{Q_{ini}} \tag{33}$$

The parameter updating unit 54 acquires actually measured values IB1 of battery current measured by the current sensor 44-1, charging rates estimated by the SOC estimating unit 52, and battery current estimated values $I_{ic}$ estimated by the battery model unit 60, and calculates the integrated value (actual current integrated value $S_i$) of the measured values (=Ib/S) and the integrated value (estimated current integrated value $S_{ic}$) of the estimated values $I_{ic}$. Furthermore, the parameter updating unit 54 acquires the SOC from the SOC estimating unit 52.

The parameter updating unit 54 starts integration of the actual current and integration of the estimated current when the vehicle starts running in the EV running mode. When running of the vehicle in the EV running mode is finished (i.e., when the running mode switches from the EV mode to the HV mode), the integration of the actual current and the integration of the estimated current are finished.

When the degradation condition of the secondary battery is not appropriately reflected by the battery model, an error arises between the actual current integrated value $S_i$ and the estimated current integrated value $S_{ic}$. Capacity reduction parameters, which make the error equal to 0, are estimated. The parameter updating unit 54 calculates dK as the gradient (rate of change) of a current integration estimation error $\Delta S_1$ with respect to the SOC estimated value. The method of calculating the gradient dK is not particularly limited, but the least square method, for example, may be employed. The use of the least square method makes it possible to calculate the gradient dL with further improved accuracy.

The parameter updating unit 54 corrects the positive-negative electrodes discrepancy capacity $\Delta Q_s$, according to Equation (34) as follows, so as to reduce the gradient dK.

$$\Delta Q_s(\text{after correction})=\Delta Q_s(\text{last value})-\alpha\times dK \qquad (34)$$

In Eq. (34), $\alpha$ is correction coefficient, which is a constant. Also, when the secondary battery is in the initial state (in a condition where there is no degradation), it is assumed that $\Delta Q_s=0$ (namely, there is no shift in the correspondence between the charging characteristics of the positive and negative electrodes), and correction of the positive-negative electrodes discrepancy capacity $\Delta Q_s$ is started on this assumption.

Then, the parameter updating unit 54 calculates the positive-electrode capacity maintenance factor $k_1$ and the negative-electrode capacity maintenance factor $k_2$. In this embodiment, the relationship between the positive-negative electrodes discrepancy capacity $\Delta Q_s$ and the capacity maintenance factors $k_1$, $k_2$ of the positive electrode and negative electrode is obtained in advance by experiment, or the like, and is stored in the form of a map, or the like, in the storing unit 53. Based on the relationship thus stored, $k_1$, $k_2$ are calculated from the estimated $\Delta Q_s$. The parameter updating unit 54 estimates the capacity reduction parameters (positive-negative electrodes discrepancy capacity, positive-electrode capacity maintenance factor, and negative-electrode capacity maintenance factor) during running of the vehicle, and stores the capacity reduction parameters in the storing unit 53. Thus, the capacity reduction parameters are reflected by the battery model when the battery model is initialized next time.

The above-described method of estimating the internal conditions of the secondary battery can be applied to other secondary batteries than the lithium-ion battery. For example, the same method can be equally applied to a nickel metal hydride battery, wherein the concentration distribution of protons as a reaction involved substance within an active material is calculated according to a diffusion equation, and the open-circuit voltage is defined as a function of protons on the surface of the active material. Also, with regard to other types of secondary batteries, substantially the same effects can be obtained if the control system is configured to estimate the rates of change of certain parameters in a similar battery model, from parameter values in the initial state.

(2) Updating of the Rate of Change of Parameter FIG. 22 shows an example of parameter change rate map in which map values are set with respect to battery temperatures T0-T5. The change rate map is stored in the change rate storing unit 64. Referring to FIG. 22 when the secondary battery is in the initial stale, the map value representing the rate of change of parameter g# in each temperature region is 1.0 (i.e., all of the map values are equal to 1.0), namely, the parameter value is equal to the initial value obtained when the battery is in the initial state.

Figure 23:
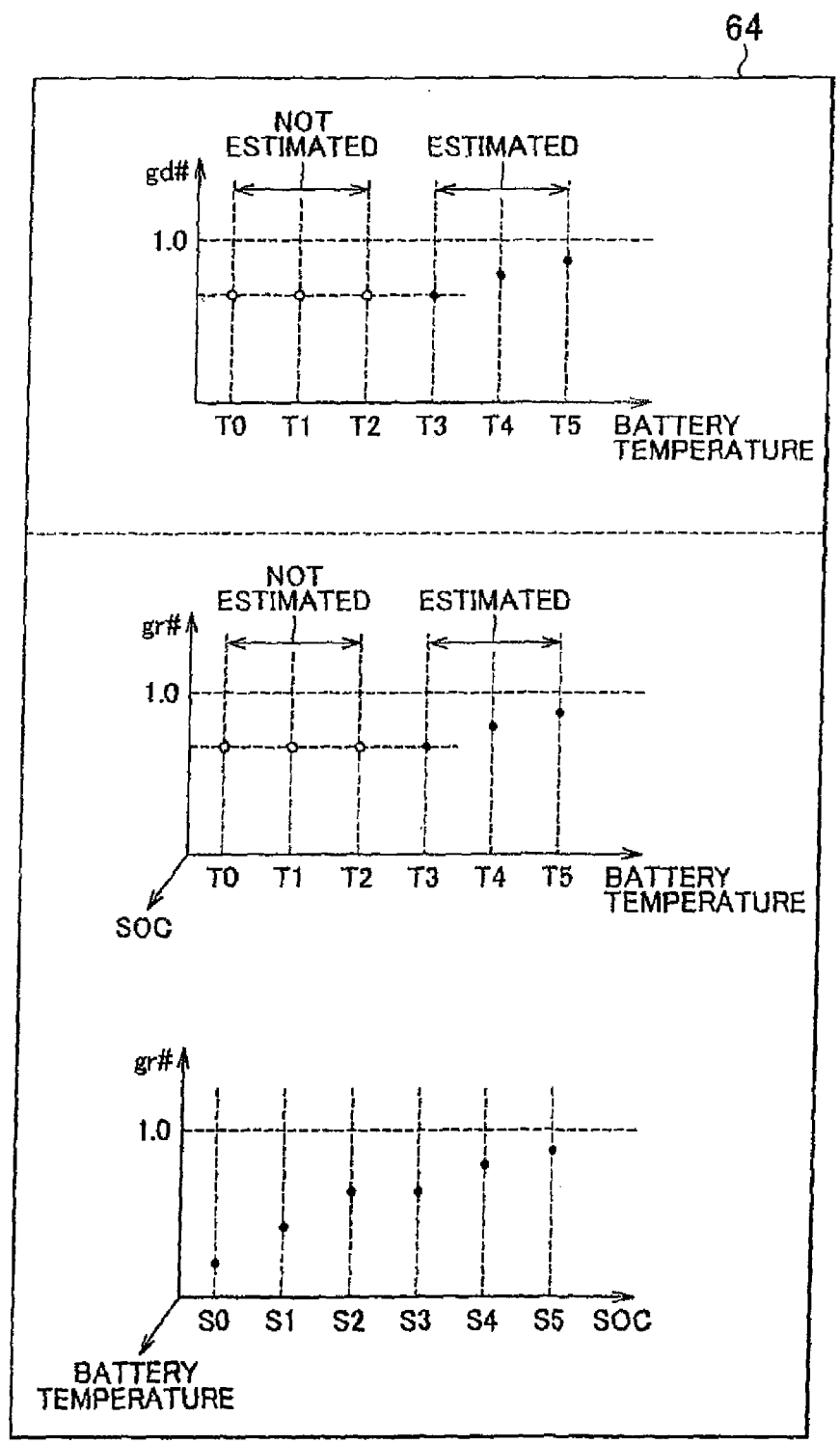
FIG. 23 is a conceptual view explaining an example of updating of change rate maps in the EV running mode.

FIG. 23 is a conceptual view useful for explaining an example of updating of change rate maps in the EV running mode. Referring to FIG. 23, the rate of change of diffusion coefficient gd# is estimated (calculated) at temperatures T3, T4 and T5. In the example shown in FIG. 23, the diffusion coefficient change rate gd# is not estimated at temperatures T0, T1 and T2. This is because the battery temperature, which increases with use of the battery, was not included in the range of temperatures T0-T2. Accordingly, the ECU 40 provisionally sets a diffusion coefficient change rate gd# corresponding to the temperature closest to the range of temperatures T0-T2, out of a plurality of diffusion coefficient change rates gd# that are actually estimated, as the rate of change in the range of temperatures T0-T2. In the example shown in FIG. 23, the diffusion coefficient change rate gd# in the range of temperatures T0-T2 is set to be equal to the diffusion coefficient change rate gd# at temperature T3.

The rate of change of reaction resistance gr# varies depending on both the battery temperature and the SOC. For example, the reaction resistance change rates gr# at temperatures T3, T4, T5 are actually estimated. At each of these temperatures, the reaction resistance change rate gr# is estimated over the SOC range of S0 to S5.

The reaction resistance change rates gr# at temperatures T0, T1, T2 are not estimated. Accordingly, the ECU 40 provisionally sets a reaction resistance change rate gr# corresponding to the temperature closest to the range of temperatures T0-T2, out of a plurality of actually estimated rates of change of reaction resistance gr#, as the rate of change in the range of temperatures T0-T2.

Figure 24:
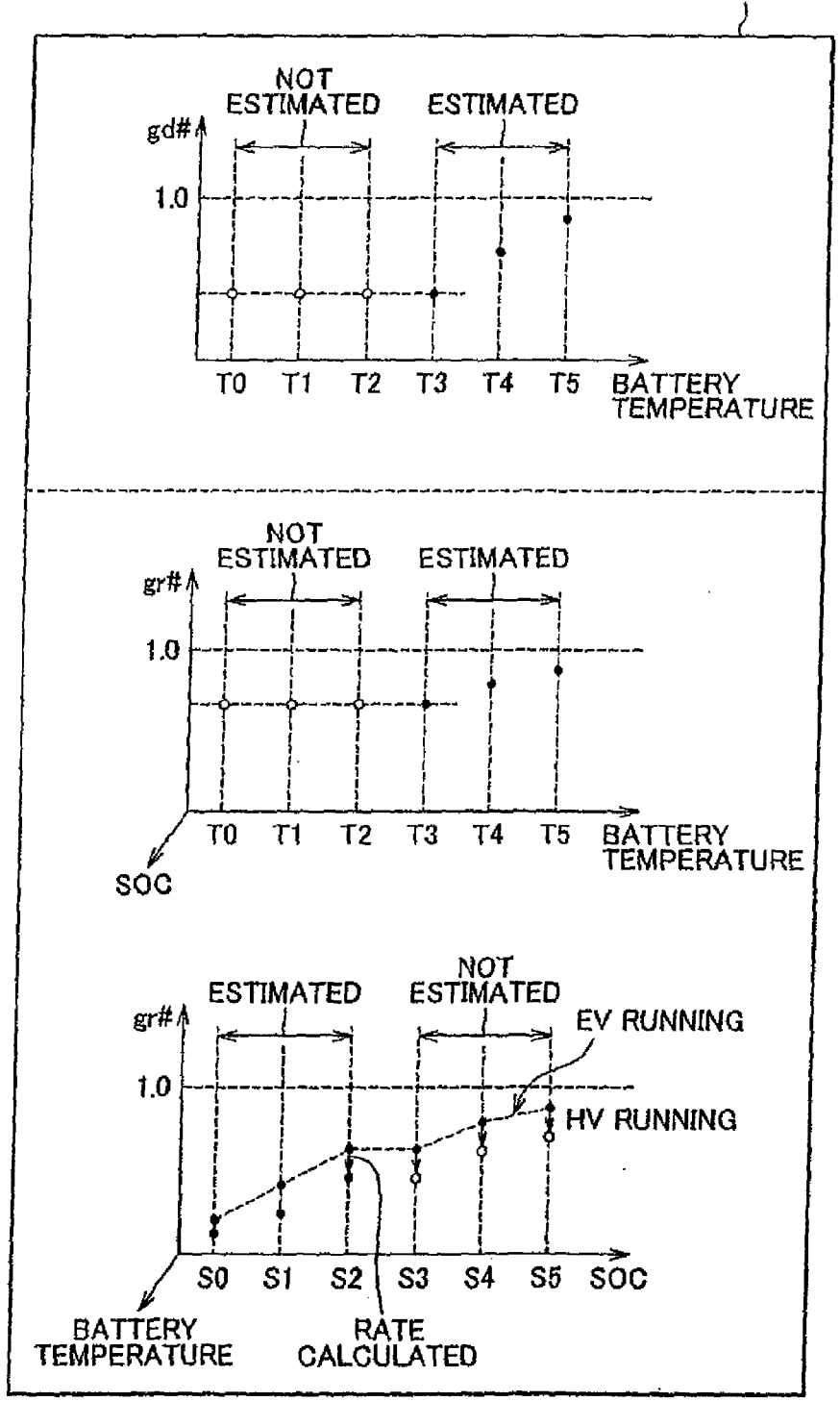
FIG. 24 is a conceptual view explaining an example of updating of change rate maps in the HV running mode.

FIG. 24 is a conceptual view useful for explaining an example of updating of change rate maps in the HV running mode. Referring to FIG. 24, in the HV running mode, the rates of change of diffusion coefficient stored in the storing unit 53 are basically replaced by the rates of change of diffusion coefficient estimated during running in the HV running mode. However, in a temperature range (range of temperatures T0-T2) in which the rate of change of diffusion coefficient was not estimated, a diffusion coefficient change rate gd# corresponding to the temperature closest to this range, out of a plurality of actually estimated rates of change of diffusion coefficient gd#, is provisionally set as the rate of change of diffusion coefficient for the temperature range in which the diffusion coefficient change rate was not estimated, in the same manner as in the case of updating of the change rate map in the EV running mode, The updating of the reaction resistance change rate map is conducted in the same manner as that of the diffusion coefficient change rate map. When the rates of change of reaction resistance gr# at temperatures T3, T4 and T5 are actually estimated, the rates of change of reaction resistance gr# at temperatures T0, T1 and T2 are set to be equal to the rate of change of reaction resistance gr# at the temperature t3.

In the HV running mode, the SOC varies in a relatively low range, and the range of variation of the SOC is smaller than the range of variation in the EV running mode. Accordingly, the rate of change of reaction resistance gr# is estimated in the range of S0 to S2, as shown in FIG. 24. In this range, the reaction resistance change rates gr# stored in the map are replaced by the reaction resistance change rates gr# estimated when the vehicle runs in the HV mode.

In an overlapping range as the boundary between the range of variation of SOC in the EV running mode and the range of variation of SOC in the HV running mode, the reaction resistance change rate gr# is corrected so as to be equal. More specifically, when the SOC is equal to S2, the ratio (rate) of the reaction resistance change rate in the HV running mode to the reaction resistance change rate in the EV running mode is calculated. When SOC S2, a value obtained by multiplying the reaction resistance change rate in the EV running mode by the above-indicated ratio or coefficient is equal to the reaction resistance change rate in the HV running mode. In the SOC range of S3 to S5, the reaction resistance change rate in the HV running mode is provisionally set by multiplying the reaction resistance change rate in the EV running mode by the above-indicated ratio or coefficient.

Figure 25:
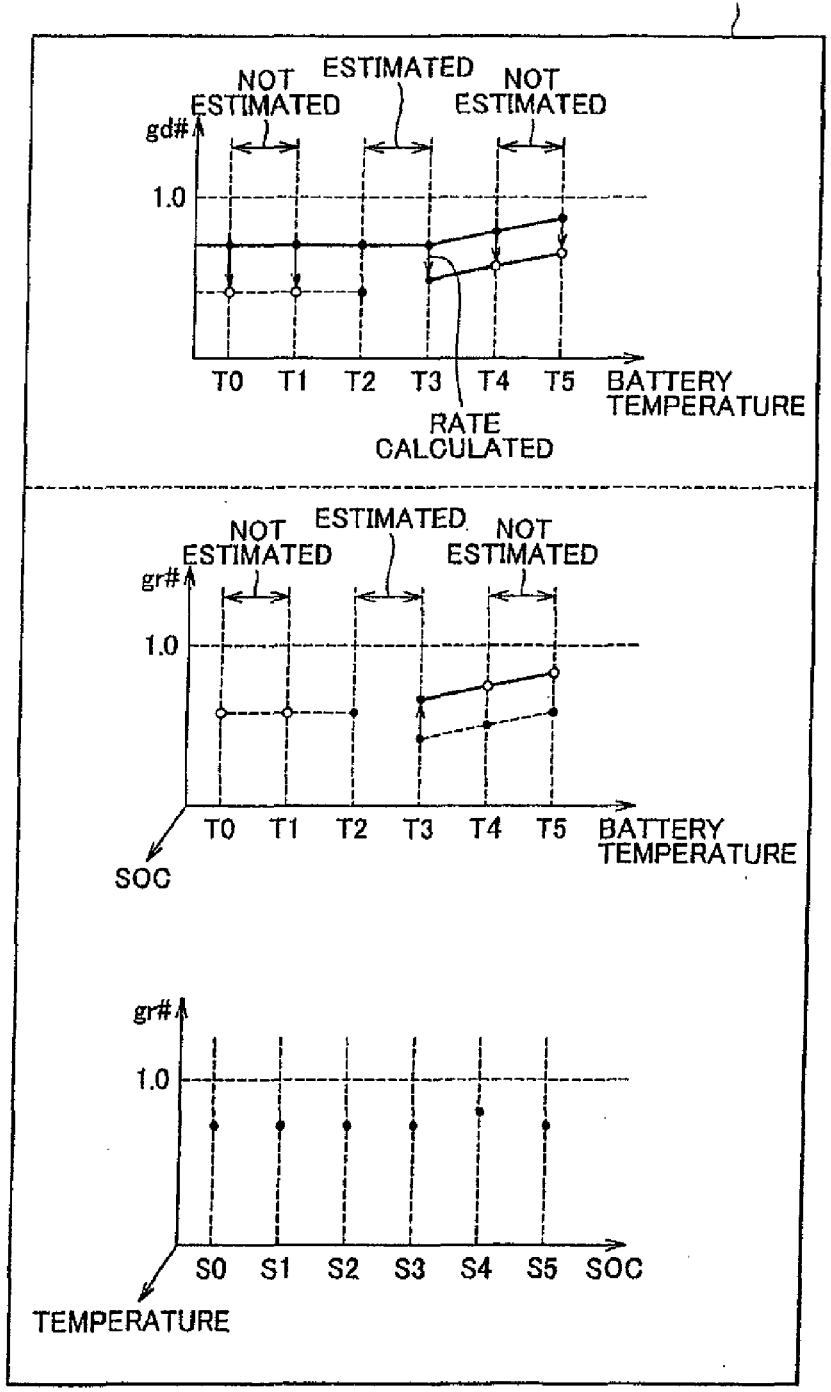
FIG. 25 is a conceptual view explaining an example of updating of change rate maps during plug-in charge.

FIG. 25 is a conceptual view useful for explaining an example of updating of change rate maps during plug-in charge. Referring to FIG. 25, during plug-in charge, too, the rates of change of diffusion coefficient stored in the storing unit 53 are replaced by the rates of change of diffusion coefficient estimated during plug-in charge, as in the case where the vehicle runs in the HV running mode In a temperature range (range of temperatures T0-T2) that is lower than the range of change of temperature during plug-in charge, as one of temperature ranges in which the diffusion coefficient change rate was not estimated, a diffusion coefficient change rate gd# corresponding to the temperature closes to the temperature range, out of a plurality of actually estimated diffusion coefficient change rates gd#, is provisionally set as the diffusion coefficient change rate in the temperature range in which the diffusion coefficient change rate was not estimated. Accordingly, the diffusion coefficient change rates at temperatures T0, T1 are provisionally set to be equal to the diffusion coefficient change rate at temperature T2. On the other hand, in a temperature range (range of temperatures T4-T5) that is higher than the range of temperature change during plug-in charge, the diffusion coefficient change rate in this region is provisionally set by multiplying the value stored in the map by a given rate. More specifically, the rate of the estimated value to the value stored in the map is calculated at temperature T3. At temperature T4, T5, the diffusion coefficient change rate is set by multiplying the corresponding value stored in the map, by the above-mentioned rate.

The reaction resistance change rate map is updated in substantially the same manner as that in which the diffusion coefficient change rate map is updated. The reaction resistance change rate is estimated at temperatures T2 and T3. The reaction resistance change rates stored in the storing unit 53 are replaced by the change rates estimated during plug-in charge. The reaction resistance change rate in a temperature range (temperatures T0, T1) that is lower than the range of temperature change during plug-in charge is set to be equal to the reaction resistance change rate at temperature T2. On the other hand, in a temperature range (range of temperatures T4-T5) that is higher than the range of temperature change during plug-in charge, the reaction resistance change rate is provisionally set by multiplying a corresponding value stored in the map, by a given rate.

According to the first embodiment as described above, the control system (ECU 40 ) of the vehicle calculates parameters used in the battery model during plug-in charge and during running of the vehicle, and updates the stored parameters, based on the results of calculation. With this arrangement, a sufficiently large number of chances to estimate a degradation condition of the battery and its charging rate can be obtained even if the user uses the vehicle in different manners. Furthermore, the accuracy in connection with the estimation of the degradation condition and charging rate of the secondary battery can be kept at a high level. Accordingly, charge and discharge of the battery during running of the vehicle can be controlled in view of the degradation condition of the secondary battery.

[Second Embodiment] The construction of a vehicle according to a second embodiment of the invention is substantially the same as that of the vehicle according to the first embodiment, more specifically, is substantially the same as the construction as shown in FIG 1. However, a control system according to the second embodiment is different, in terms of estimation of the SOC, from the control system of the first embodiment.

In the second embodiment, the ECU 40 estimates the SOC at a higher value than a calculated value in a region where the SOC is high, and estimates the SOC at a lower value than the calculated value in a region where the SOC is low.

Figure 26:
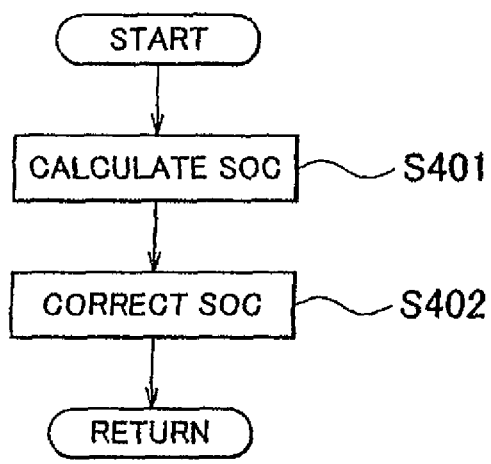
FIG. 26 is a flowchart illustrating a first example of SOC correcting process according to a second embodiment of the invention.

FIG. 26 is a flowchart illustrating a first example of a SOC correcting process according to the second embodiment. Referring to FIG. 26, the ECU 40 calculates the SOC in step S401. The process of calculating the SOC is the same as the process illustrated in the flowchart of FIG. 8, and therefore, its explanation will not be repeated. In step S402, the ECU 40, corrects the calculated SOC, using a map. More specifically, the ECU 40 adds an offset value specified by the map, to the calculated SOC. The map is stored in advance in the ECU 40 (for example, the storing unit 53).

Figure 27:
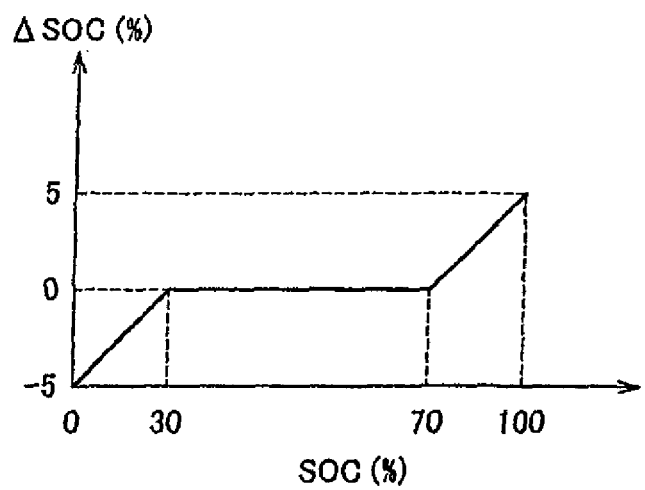
FIG. 27 is a graph showing a map used in the SOC correcting process.

FIG. 27 is a graph showing the map used in the SOC correcting process. Referring to FIG. 27, when the SOC is in the range of 0 to 30 (%), the offset value (ΔSOC) is a negative value. When the SOC is in the range of 70 to 100 (%), the offset value is a positive value. When the SOC is in the range of 30 to 70 (%), the offset value is equal to 0. The SOC is corrected so as to be lower than the calculated value when the SOC is in the range of 0 to 30 (%), and is corrected so as to be higher than the calculated value when the SOC is in the range of 70 to 100%. When the SOC is in the range of 30 to 70 (%), the calculated SOC is used as it is for charge/discharge control of the battery (the battery 10-1 shown in FIG. 1).

According to the map of FIG. 27, when the SOC is in the range of 0 to 30 (%), the absolute value of the offset value increases as the SOC decreases. In the above-indicated range, the SOC is corrected so as to be reduced by a larger degree as the calculated SOC is smaller. On the other hand, when the SOC is in the range of 70 to 100 (%), the absolute value of the offset value increases as the SOC increases. In this range, therefore, the SOC is corrected so as to be increased by a larger degree as the calculated SOC is larger.

Figure 28:
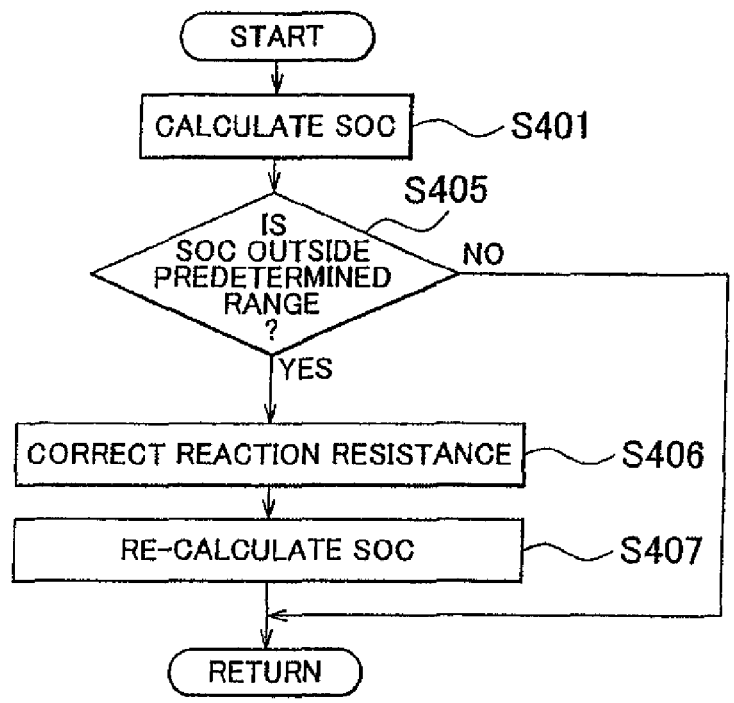
FIG. 28 is a flowchart illustrating a second example of SOC correcting process according to the second embodiment of the invention.

FIG. 28 is a flowchart illustrating a second example of SOC correcting process according to the second embodiment. Referring to FIG. 28 and FIG. 26, the flowchart of FIG. 28 is different from the flowchart of FIG. 26 in that steps S405 to S407 are executed in place of step S402.

In step S405, the ECU 40 determines whether the SOC calculated in step S401 is outside a predetermined range (e.g., the range of 20 to 80%). If the calculated SOC is outside the predetermined range (YES in step S405), the ECU 40 multiplies the reaction resistance (the product of the initial value stored in the storing unit 53 and the rate of change of reaction resistance) by a given coefficient (>1) in step S406. Then, the ECU 40 re-calculates the SOC in step S407. In step S407, the SOC is calculated according to the flowchart of FIG. 8. Upon completion of the operation of the step S407, the ECU 40 returns to the main routine. If, on the other hand, it is determined in step S401 that the calculated SOC is within the predetermined range (NO in step S405), the whole process of FIG. 28 ends, and the ECU 40 returns to the main routine. In this case, re-calculation of the SOC is not performed.

Figure 29:
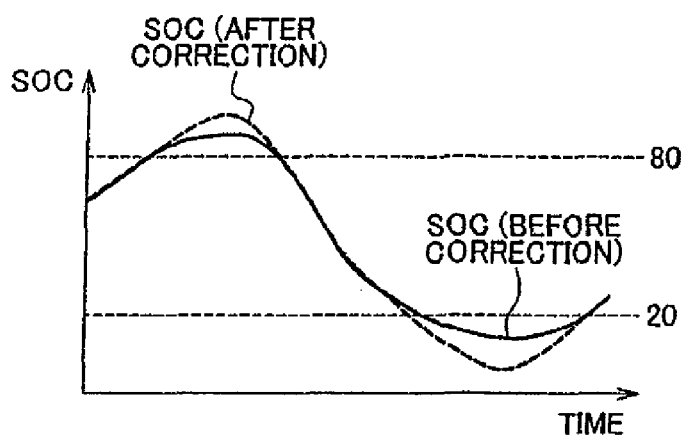
FIG. 29 is a graph useful for explaining the result of the SOC correcting process according to the flowchart of FIG. 28.

FIG. 29 is a graph useful for explaining the result of the SOC correcting process according to the flowchart of FIG. 28. Referring to FIG. 29, when the SOC before it is corrected is higher than 80%, the SOC is corrected so as to be a higher value by re-calculation. On the other hand, when the SOC before it is corrected is lower than 20%, the SOC is corrected so as to be a lower value by re-calculation.

While the reaction resistance is multiplied by the coefficient (>1) for correction of the SOC in the example of FIG. 28, the SOC may be corrected by multiplying the reaction resistance by a coefficient (<1). In this case, too, the SOC can be corrected as shown in FIG. 29.

As described above, the battery is used in a wide SOC region or range in the EV running mode. From the viewpoint of preventing degradation of the battery, it is desired to control the SOC so that the SOC does not exceed a specified upper limit, or does not fall below a specified lower limit. According to the second embodiment, the SOC is estimated to be higher than the actual SOC in a region where the SOC is high, and the SOC is estimated to be lower than the actual SOC in a region where the SOC is low. Accordingly, even in the case where an error in estimation of SOC occurs in the estimation process according to the flowchart of FIG. 8, for example, overcharge or over discharge of the battery can be prevented. Thus, according to the second embodiment, degradation of the battery can be suppressed.

[Third Embodiment] Two or more secondary batteries are installed on a vehicle according to a third embodiment of the invention. The installation of the two or more secondary batteries on the vehicle enables the vehicle to run over an extended driving range or distance in the EV running mode. Each of the two or more secondary batteries can be charged with an external power supply.

Figure 30:
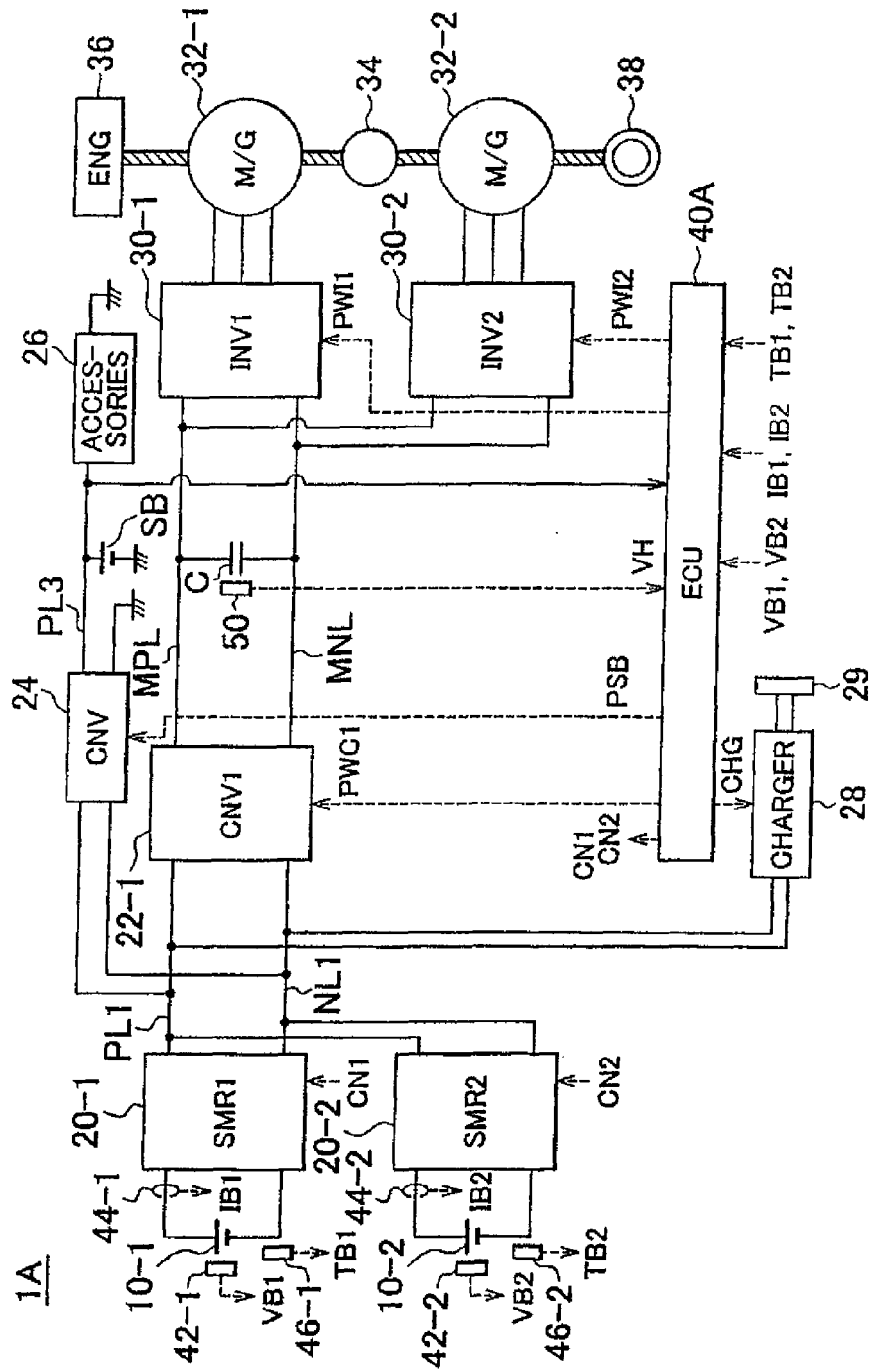
FIG. 30 is a general block diagram of a hybrid vehicle illustrated as one example of vehicle including a control system according to a third embodiment of the invention.

FIG. 30 is a general block diagram of a hybrid vehicle illustrated as one example of vehicle having a control system according to the third embodiment of the invention.

Referring to FIG. 30 and FIG. 1, the hybrid vehicle 1A of the third embodiment is different from the hybrid vehicle 1 of the first embodiment in that the hybrid vehicle 1A further includes a battery 10-2, a SMR 20-2, a voltage sensor 42-2, a current sensor 44-2, and a temperature sensor 46-2. The hybrid vehicle 1A is also different from the hybrid vehicle 1 in that the vehicle 1A includes an ECU 40A instead of the ECU 40 The construction of the other portion of the hybrid vehicle 1A is substantially the same as that of the corresponding portion of the hybrid vehicle 1, and therefore, its explanation will not be repeated.

The battery 10-2 is a rechargeable DC power supply, more specifically, a secondary battery, such as a nickel metal hydride (NiMH) battery or a lithium-ion battery. In this embodiment, both of the batteries 10-1, 10-2 are lithium-ion batteries. However, both of the batteries 10-1, 10.2 may be nickel metal hydride batteries, or one of the batteries 10-1, 10-2 may be a lithium-ion battery while the other battery may be a nickel metal hydride battery.

The SMR 20-2 is a relay for electrically connecting the battery 10-2 to the positive line PL1 and the negative line NL1. The SMR 20-2 opens and closes in response to a signal CN2 received from the ECU 40A. The voltage sensor 42-2 measures voltage VB2 of the battery 10-2, and outputs measured values to the ECU 40A. The current sensor 44-2 measures current IB2 that flows into or out of the battery 10-2, and outputs measured values to the ECU 40A. The temperature sensor 46-2 measures the temperature TB2 of the battery 10-2, and outputs measured values to the ECU 40A. The current IB2 assumes a positive value when the battery 10-2 is discharged, and assumes a negative value when the battery 10-1 is charged.

The SMR 20-2 is placed in the ON position when the battery 10-2 is charged with the external power supply, or when electric power is supplied to the second MG 32-2 for running of the vehicle. It is, however, to be noted that the SMRs 20-1, 20-2 will not be placed in the ON positions at the same time, so as to avoid shorting of the batteries 10-1, 10-2. Accordingly, the batteries 10-1, 102 are used in turn in the EV running mode. In the HV running mode, one of the batteries 10-1, 10-2 (for example, the one that was used later) is kept electrically connected to the converter 22-1.

Figure 31:
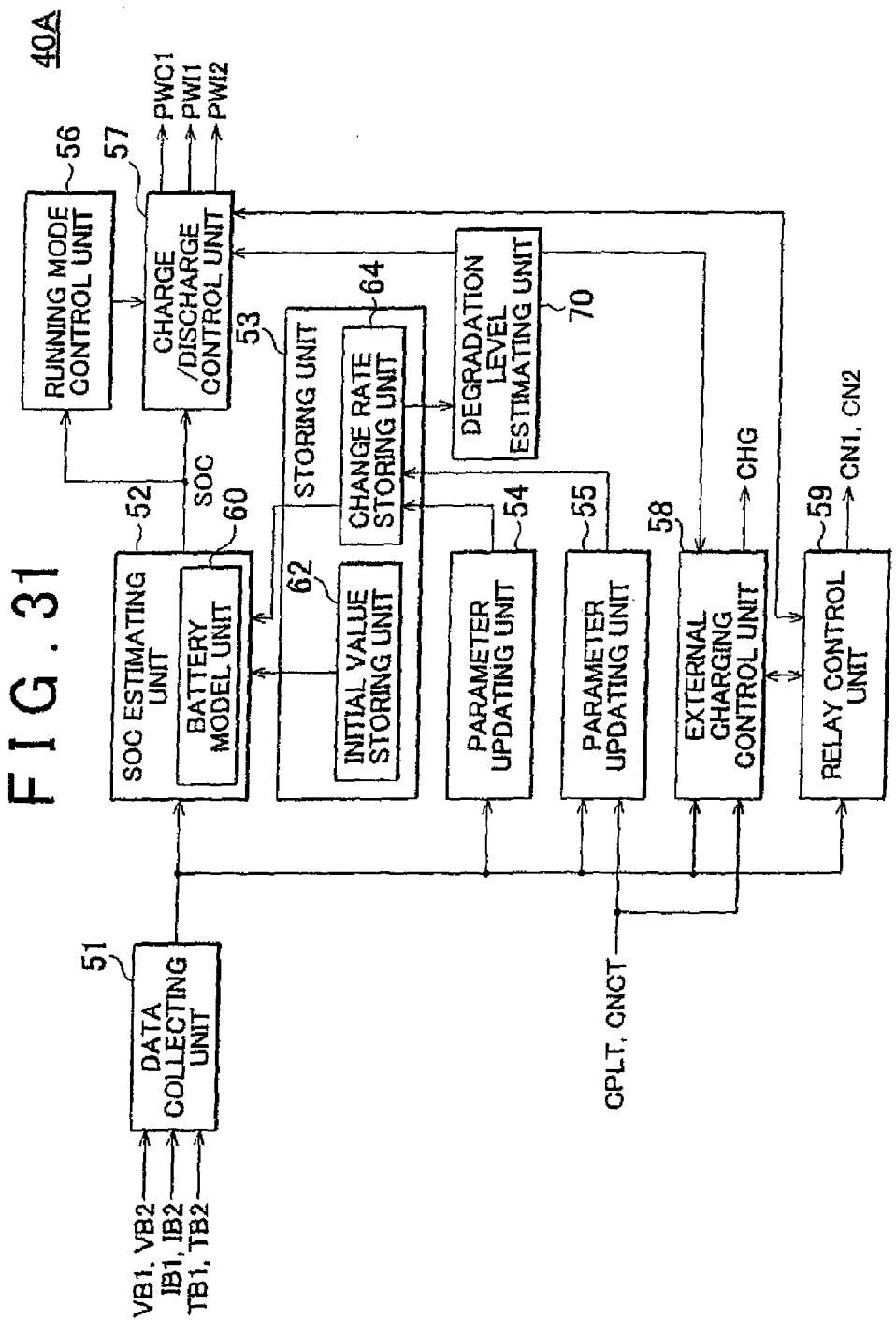
FIG. 31 is a functional block diagram explaining the configuration of an ECU 40A shown in FIG. 30.

FIG. 31 is a functional block diagram useful for explaining the configuration of the ECU 40A as shown in FIG. 30. Referring to FIG. 31, the ECU 40A is different from the ECU 40 in that the ECU 40A further includes a degradation level estimating unit 70. The configuration of the other portion of the ECU 40A is substantially identical with that of the corresponding portion of the ECU 40. Also, the ECU 40A estimates internal conditions of each of the batteries 10-1, 10-2, according to a battery model thereof. Thus, the storing unit 53 stores parameters (initial values and rates of change of parameters) used in the battery model, with respect to each of the batteries 10-1, 10-2.

The degradation level estimating unit 70 estimates the level of degradation of each of the batteries 10-1, 10-2, based on the parameters (more specifically, the rates of change of parameters) stored in the storing unit 53. The estimation result is transmitted to the charge/discharge control unit 57 and the external charging control unit 53. More specifically, the degradation level estimating unit 70 sets the degradation level of the battery to a higher level as the rate of change of parameter (e.g., the rate of change of diffusion resistance) is smaller. The higher level of degradation indicates that the battery is in an advanced stage of degradation or aging.

The charge/discharge control unit 57 and the relay control unit 59 control discharge of the batteries 10-1, 10-2 during running of the vehicle, such that the battery having the higher degradation level is discharged with the higher priority over the battery having the lower degradation level.

The charge/discharge control unit 57 and the relay control unit 59 control charge of the batteries 10-1, 10-2 during plug-in charge, such that the battery having the lower degradation level is charged prior to or ahead of the battery having the higher degradation level.

Figure 32:
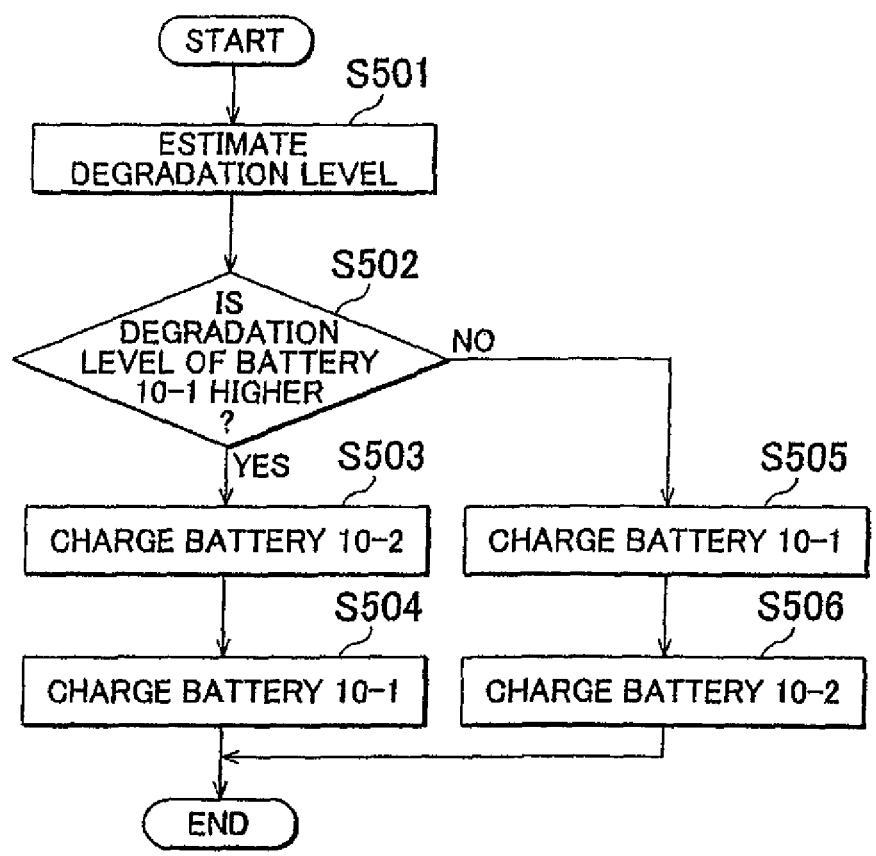
FIG. 32 is a flowchart explaining plug-in charge according to the third embodiment.

FIG. 32 is a flowchart useful for explaining plug-in charge according to the third embodiment. Referring to FIG. 32, the ECU 40A estimates the level of degradation of each of the batteries 10-1, 10-2 in step S501. In step S502, the ECU 40 determines whether the degradation level of the battery 10-1 is higher than that of the battery 10-2.

When the degradation level of the battery 10-1 is higher than that of the battery 10-2, i.e., the battery 10-1 is degraded by a larger degree than the battery 10-2, (YES in step S502), the battery 10-2 is charged prior to the battery 10-1. More specifically, in step S503, the relay control unit 59 initially places the SMR 20-2 in the ON position. Then, the external charging control unit 58 puts the battery 10-2 on charge. When the voltage of the battery 10-2 reaches a second target voltage (voltage established when the SOC is 80%), the external charging control unit 58 stops charging the battery 10-2. Then, in step S504, the relay control unit 59 places the SMR 20-2 in the OFF position, and places the SMR 20-1 in the ON position. The external charging control unit 58 charges the battery 10-1 until the voltage of the battery 10-1 reaches the second target voltage.

When the battery 10-1 or 10-2 is charged with the external power supply, the processes of estimating the parameters and the SOC, as illustrated in FIG. 11-FIG. 13 and FIG. 15, are carded out.

When the degradation level of the battery 10-2 is higher than that of the battery 10-1 (NO in step S502), the battery 10-1 is charged prior to the battery 10-2. In step S505, the ECU 40A puts the battery 10-1 on charge. In step S506, the ECU 40A puts the battery 10-2 on charge. The operation of step S505 is the same as that of step S504, and the operation of step S506 is the same as that of step S503.

When the operation of step S504 or step S506 is finished, the whole process of FIG. 32 ends.

Figure 33:
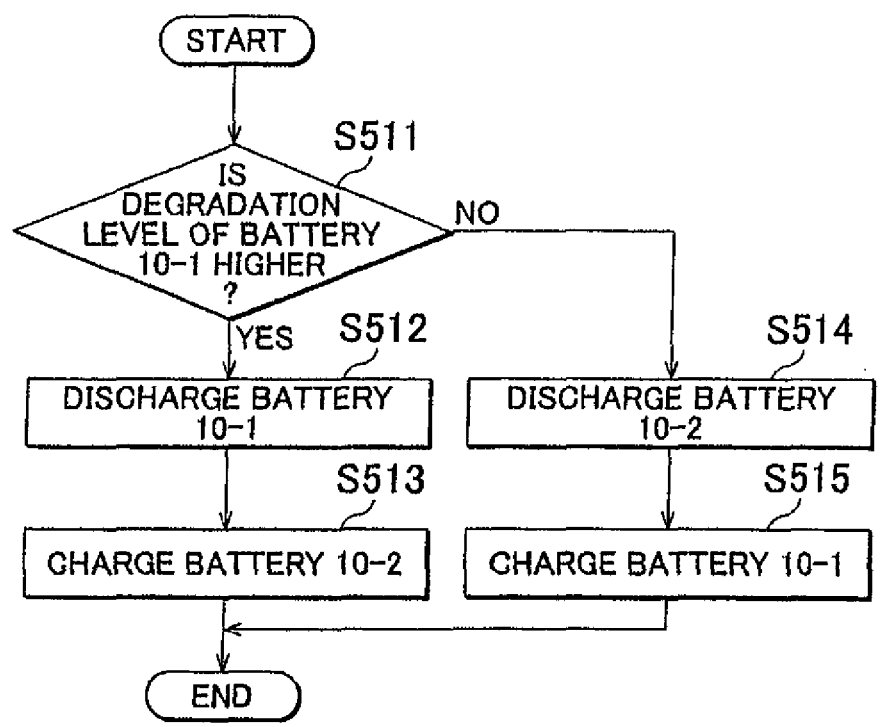
FIG. 33 is a flowchart illustrating a process of discharging a plurality of batteries according to the third embodiment.

FIG. 33 is a flowchart useful for explaining a process of discharging the two or more batteries according to the third embodiment. This process is initiated when the vehicle starts running (when the EV running mode is selected). Referring to FIG. 33, the ECU 40A determines in step S511 whether the degradation level of the battery 10-1 is higher than that of the battery 10-2.

While the degradation level estimated at the time of start of plug-in charge (i.e., the degradation level estimated in step S501) is used in the determination of step S511, an operation to estimate the degradation level of each of the batteries 10-1, 10-2 may be carried out prior to the operation of step S511.

If the degradation level of the battery 10-1 is higher than that of the battery 10-2 (YES in step S511), the ECU 40A controls discharge of the batteries 10-1, 10-2, such that the battery 10-1 is discharged prior to the battery 10-2. In step S512, the relay control unit 59 places the SMR 20-1 in the ON position. The charge/discharge control unit 57 controls the converter 22-1, inverter 30-2, and so forth, so as to discharge the battery 10-1. When the SOC of the battery 10-1 reaches a given threshold value (for example, 20%), the charge/discharge control unit 57 stops discharge of the battery 10-1.

In step S513, the relay control unit 59 places the SMR 20-1 in the OFF position, and places the SMR 20-2 in the ON position. The charge/discharge control unit 57 controls the converter 22-1, inverter 30-2, and so forth, so as to discharge the battery 10-2.

If the degradation level of the battery 10-2 is higher than that of the battery 10-1 (NO in step S511), the ECU 40A controls discharge of the batteries 10-1, 10-2, such that the battery 10-2 is discharged prior to the battery 10-1. In step S514, the ECU 40A puts the battery 10-2 on discharge. When the SOC of the battery 10-2 reaches a given threshold value (for example, 20%), the charge/discharge control unit 57 stops discharging the battery 10-2. In step S515, the ECU 40A puts the battery 10-1 on discharge. The operation of step S514 is the same as that of step S513, and the operation of step S515 is the same as that of step S512.

Thus, according to the third embodiment, the battery having the higher degradation level is charged at a later time. Accordingly, the SOC of the battery having the higher level of degradation is kept at a high level for a reduced period of time, as compared with the battery having the lower level of degradation.

If the SOC of the battery having the higher degradation level is kept at a high level for a long period of time, the degradation of the battery may be brought into an advanced stage. It is thus possible to, retard the progression of degradation, by reducing the length of time for which the SOC is kept at a high level Furthermore, according to the third embodiment, the battery having the higher degradation level is discharged prior to or ahead of the battery having the lower degradation level. Accordingly, the SOC of the battery having the higher degradation level is kept at a high level for a reduced period of time, so that the progression of degradation can be retarded or suppressed.

Also, according to this embodiment, a degradation condition can be estimated in real time during running of the vehicle. Therefore, even when degradation of a particular battery (one of the two or more batteries) is rapidly advanced at a certain point in time, the order of charge or discharge of the two or more batteries is controlled, so that a burden on the particular battery can be reduced (for example, the length of time for which the SOC is kept at a high level is reduced to be as shortest as possible). Thus, further progression of degradation of the battery is retarded or suppressed.

In the construction as shown in FIG. 30, two batteries are connected in parallel to the converter 22-1. However, three or more batteries may be connected in parallel to the converter 22-1, and a SMR may be provided for each of the batteries.

With this arrangement, too, a battery having a higher level of degradation may be discharged with higher priority over a battery having a lower level of degradation, based on the degradation level of each battery estimated by the degradation level estimating unit 70. Also, a battery having a lower level of degradation may be charged prior to a battery having a higher level of degradation, based on the degradation level of each battery.

Figure 34:
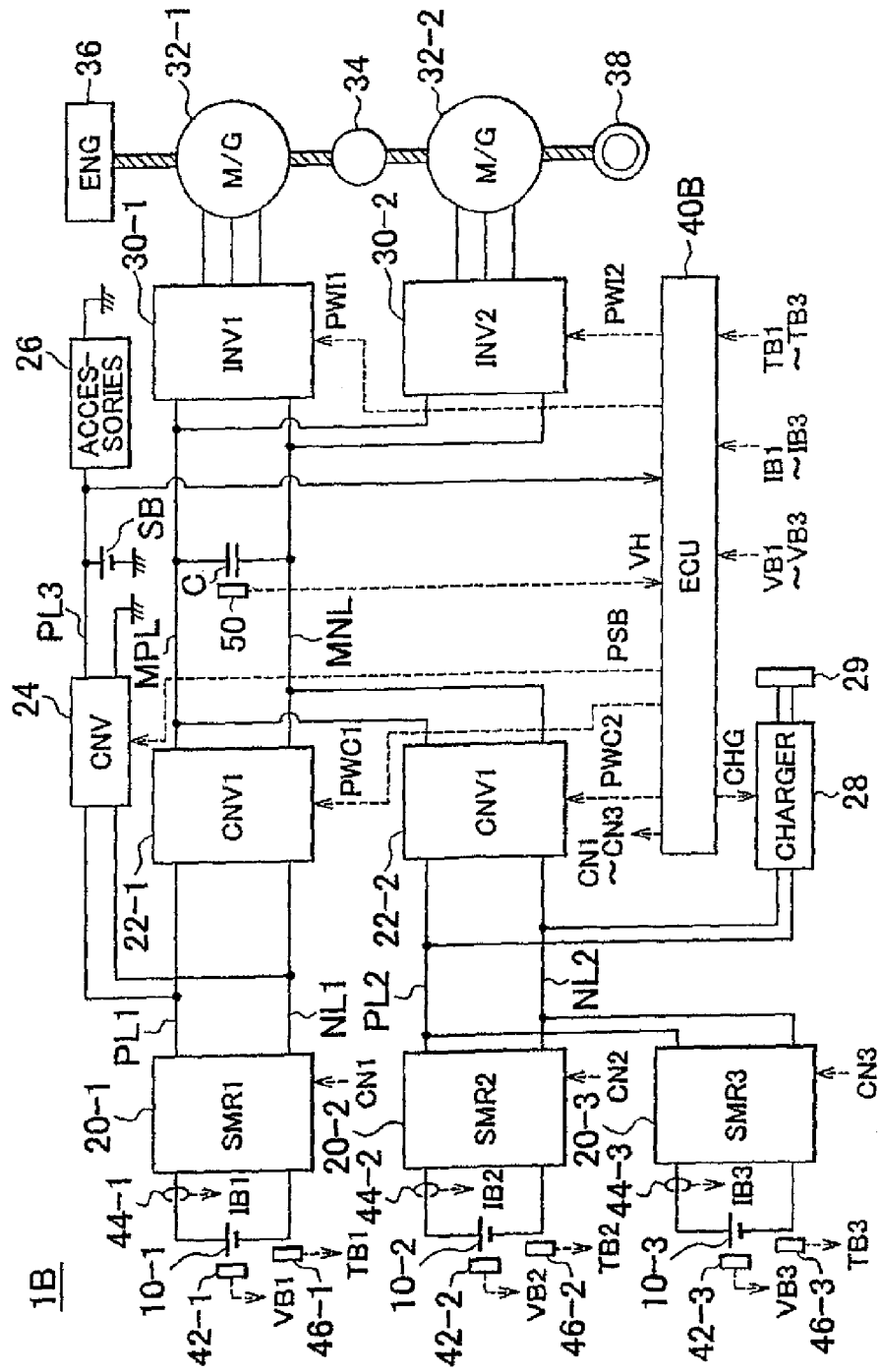
FIG. 34 is a general block diagram of another example of hybrid vehicle including a control system according to the third embodiment of the invention.

FIG. 34 is a general block diagram showing the construction of another example of hybrid vehicle including the control system according to the third embodiment of the invention. Referring to FIG. 34, the hybrid vehicle 1B is different from the hybrid vehicle 1A in that the vehicle 1B further includes a battery 10-3, a SMR 20-3, a voltage sensor 42-3, a current sensor 44-3, a temperature sensor 46-3, a converter 22-2, a positive line PL1 and a negative line PL2.

The hybrid vehicle 1B is different from the hybrid vehicle 1A in that the vehicle 1B includes an ECU 40B in place of the ECU 40A. The hybrid vehicle 1B is further different from the hybrid vehicle 1A in that the battery 10-3 is connected to the positive line PL2 and the negative line NL2 via the SMR 20-3, and that the output terminals of the charger 28 are connected to the positive line PL2 and the negative line NL2. The construction of the other portion of the hybrid vehicle 1B is substantially identical with that of the corresponding portion of the hybrid vehicle 1A, and therefore, its explanation will not be repeated.

The battery 10-3 is a rechargeable DC power supply, more specifically, a secondary battery, such as a nickel metal hydride (NiMH) battery or a lithium-ion battery. In this embodiment, all of the batteries 10-1, 10-2, 10-3 are lithium-ion batteries. However, all of the batteries 10-1-10-3 may be nickel metal hydride batteries, or one or two of the batteries 10-1-10-3 may he a nickel metal hydride battery or batteries, while the remaining battery or batteries may be a lithium-ion battery or batteries.

The SMR 20-3 is a relay for electrically connecting the battery 10-3 to the positive line PL2 and the negative line NL2. The SMR 20-3 opens and closes in response to a signal CN3 received from the ECU 40B.

In the arrangement as shown in FIG. 34, the battery 10-1 is connected to the converter 22-1, and the batteries 10-2 and 10-3 are connected in parallel to the converter 22-2. In the following, the battery 10-1 electrically connected to the converter 22-1 will be called "main battery", and a battery electrically connected to the converter 22-2 will be called "sub-battery". The sub-battery is selected from the batteries 10-2 and 10-3.

The voltage sensor 42-3 measures voltage VB3 of the battery 10-3, and outputs measured values to the ECU 40B. The current sensor 44-3 measures current IB3 that flows into or out of the battery 10-3, and outputs measured values to the ECU 40B. The temperature sensor 46-3 measures the temperature TB3 of the battery 10-3, and outputs measured values to the ECU 40B. The current TB3 assumes a positive value when the battery 10-3 is discharged, and assumes a negative value when the battery 10-3 is charged.

The converter 22-2 is provided between the positive tine PL2 and negative line NL2, and the main positive bus MPL and main negative bus MNL. The converter 22-2 steps up the voltage between the main positive bus MPL and the main negative bus MNL, to be larger than the voltage between the positive line PL2 and the negative line NL2, based on a signal PWC2 received from the ECU 40B.

The ECU 40B controls the running mode of the hybrid vehicle 1B. More specifically, after each battery is charged by means of the charger 28, the ECU 40B sets the initial running mode to the EV mode. When the SOC of each battery is reduced down to a corresponding control target value during running of the vehicle in the EV mode, the ECU 40B switches the running mode from the EV mode to the HV mode.

Figure 35:
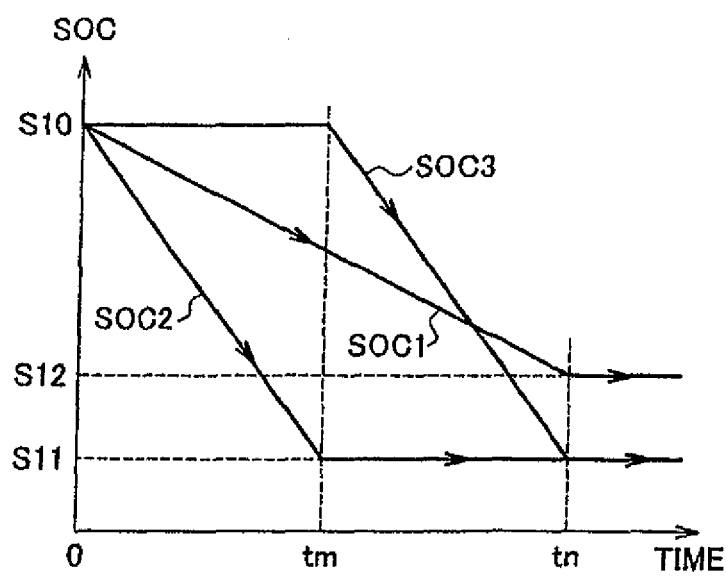
FIG. 35 is a view showing an example of usage pattern of batteries installed on the vehicle shown in FIG. 34.

FIG. 35 shows an example of usage patterns of the batteries installed on the vehicle shown in FIG. 34. Referring to FIG. 35, the control target value of the SOC (which will also be called "SOC control target") of the battery 10-1 is set to S12. On the other hand, the SOC control target of each of the batteries 10-2, 10-3 is set to S11, where S12 is larger than S11 (S12>S11).

Before the hybrid vehicle 1B starts running, the batteries 10-1 through 10-3 are charged using an external power supply. As a result, the SOC of each of the batteries 10-1 through 10-3 is equal to the initial value S10 when the hybrid vehicle 1B starts running. The initial value S10 is, for example, 80(%).

For a certain period from the start of running (time=0), the hybrid vehicle 1B runs in the EV mode, using electric power of the main battery (battery 10-1) and the sub-battery (battery 10-2). During this period, the electric power of the battery 10-2 is used with higher priority over the electric power of the battery 10-1. As a result, the SOC (SOC2) of the battery 10-2 is reduced down to the control target S11 at time "tm". Upon and after time "tm", the battery 10-3, which replaces the battery 10-2, is connected as a sub-battery to the second converter 22-2.

The electric power distribution ratio between the main battery and the sub-battery until time "tm" is reached is set so that the SOC (SOC1) of the battery 10-1 becomes equal to a predetermined value at time "tm". The predetermined value is, for example, an intermediate value between the initial value S10 (value at time 0) and the control target S12 of the battery 10-1.

From time "tm", the hybrid vehicle 1B runs in the EV mode, using electric power of the battery 10-1 and the battery 10-3. The electric power of the battery 10-3 is used with higher priority over the electric power of the battery 10-1. In a period subsequent to time "tm", the power distribution ratio is set so that the time at which the SOC 1 reaches the control target S12 coincides with the time at which the SOC 3 reaches the control target S11. As a result, at time "tn", the SOC1 reaches the control target S12, and the SOC 3 reaches the control target S11. Accordingly, the running mode switches from the EV mode to the HV mode at time "tn".

In the HV mode, both of the batteries 10-2, 10-3 are electrically disconnected from the second converter 22-2, whereas the battery 10-1 is kept connected to the first converter 22-1. In the HV mode, the hybrid vehicle 1B runs so that the SOC1 is kept equal to the control target S12. Accordingly, the second converter 22-2 may be stopped in the HV mode. Consequently, the efficiency of the power supply system installed on the hybrid vehicle 1B can be improved, and therefore, the fuel efficiency of the vehicle when running in the HV mode can be improved.

Figure 36:
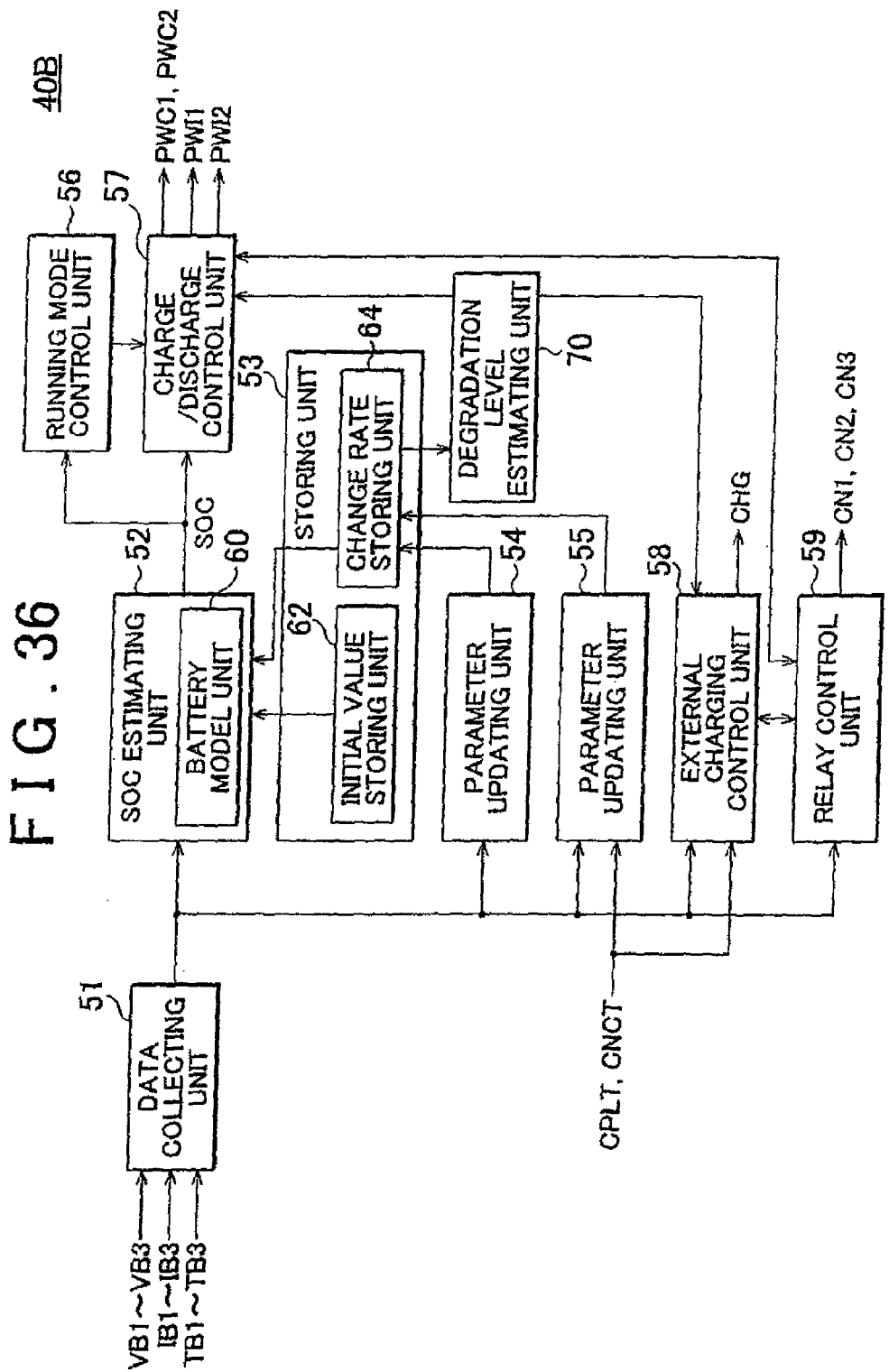
FIG. 36 is a functional block diagram explaining the configuration of an ECU 40B shown in FIG. 34.

FIG. 36 is a functional block diagram useful for explaining the configuration of the ECU 40B as shown in FIG. 34. Referring to FIG. 36, the ECU 40B is different from the ECU 40A as shown in FIG. 31 in that the relay control unit 59 generates a signal CN3 as well as the signals CN1, CN2, and the charge/discharge control unit 57 generates a signal PWC2, as well as the signals PWC1, PWI1, PWI2.

The ECU 40B controls charge (plug-in charge) of the batteries 10-1-10-3 such that a battery having a higher level of degradation is charged at a later time. On the other hand, during running of the vehicle (in the EV running mode), the ECU 40B controls discharge of the batteries 10-2, 10-3, such that one of the batteries 10-2, 10-3 having the higher level of degradation is discharged prior to the other battery having the lower level of degradation. For example, when the degradation level of the battery 10-2 is higher than that of the battery 10-3, the battery 10-2 is initially connected to the second converter 22-2. When the SOC of the battery 10-2 reaches the control target, the battery 10-2 is disconnected from the second converter 22-2, and the battery 10-3 is connected to the second converter 22-2.

Thus, according to the third embodiment, the higher the level of degradation of the battery is, the later time at which the battery is charged. Also, according to the third embodiment, a battery having a higher level of degradation is discharged prior to a battery having a lower level of degradation. In this manner, the length of time for which the battery having the higher level of degradation is kept in a high SOC condition can be reduced, and therefore, the progression of degradation of the battery can be retarded or suppressed. In this connection, only one of charge and discharge may be controlled according to the respective degradation levels of the two or more batteries.

In the third embodiment, too, the SOC estimating process according to the second embodiment may be adopted. In this case, the effect of retarding the progression of degradation of the batteries can be enhanced.

The present invention is applicable to a vehicle on which an electric motor that produces vehicle driving force, a battery that stores electric power for driving the electric motor, and a charging mechanism arranged to enable the battery to be charged by means of an external power supply are installed. Accordingly, the invention is not limitedly applied to a hybrid vehicle, but may also be applied to, for example, an electric vehicle, or the like.

Also, the arrangement that allows the battery or batteries to be charged by means of the external power supply is not limited to the above-described arrangement. For example, the vehicle may be constructed such that a neutral point of a stator coil of the first MG 32-1 and a neutral point of a stator coil of the second MG 32-2 are connectable to an AC power supply. With this arrangement, electric power for charging each battery can be generated through AC-DC conversion by the inverters 30-1, 30-2. Alternatively, the battery may be charged according to a non-contact charging method utilizing electromagnetic coupling between the vehicle and an external power supply. More specifically, a primary coil is provided on the external power supply side, and a secondary coil is provided on the vehicle side. By utilizing the mutual inductance between the primary coil and the secondary coil, the vehicle is able to receive electric power from the external power supply without contacting with the external power supply.

While the invention has been described with reference to example embodiments thereof, it is to be understood that the invention is not limited to the described embodiments or constructions. To the contrary, the invention is intended to cover various modifications and equivalent arrangements. in addition, while the various elements of the disclosed invention are shown in various example combinations and configurations, other combinations and configurations, including more, less or only a single element, are also within the scope of the appended claims.

The invention is claimed is:

1. A control system of a vehicle including an electric motor operable to produce driving force, at least one secondary battery that supplies electric power to the electric motor, and a charging mechanism operable to charge said at least one secondary battery using a power supply located outside the vehicle, comprising:

an electronic control unit, including executable program logic, configured to perform:
  collecting data used in a battery model for estimating the status of said at least one secondary battery;
  storing a given parameter which is used in the battery model and varies according to the status of said at least one secondary battery;
  calculating the given parameter based on the data collected during running of the vehicle, and correcting the stored given parameter based on a result of the calculation;
  calculating the given parameter based on the data collected when the vehicle is at rest and said at least one secondary battery is charged, and correcting the stored given parameter based on a result of the calculation;
  calculating an estimated value of charging rate of said at least one secondary battery, using the battery model, based on the data collected and the stored given parameter; and
  controlling discharge of said at least one secondary battery based on the estimated value of charging rate, during running of the vehicle.

2. The control system according to claim 1, wherein:
the vehicle further includes a power generating mechanism operable to charge said at least one secondary battery during running of the vehicle;
the electronic control unit further configured to perform:
  selecting one of a first running mode in which the vehicle runs with electric power discharged from said at least one secondary battery, and a second running mode in which the vehicle runs such that the charging rate of said at least one secondary battery is kept within a specified range; and
calculating the given parameter and updating the stored given parameter, while the vehicle is running in each of the first and second running modes.

3. The control system according to claim 1, wherein:
the vehicle comprises a plurality of the second batteries;
the given parameter is stored in association with each of said plurality of secondary batteries; and
the electronic control unit further performs:
  estimating a degradation level of each of said plurality of secondary batteries, based on the stored given parameter of each of said plurality of secondary batteries; and
  controlling charge of said plurality of secondary batteries using the external power supply and the charging mechanism, and charging said plurality of secondary batteries, in an increasing order of the estimated degradation level.

4. The control system according to claim 3, wherein the discharge of said plurality of secondary batteries is controlled, such that the secondary batteries are discharged in a decreasing order of the estimated degradation level.

5. The control system according to claim 3, wherein:
said plurality of secondary batteries comprise one main battery and a plurality of sub-batteries;
one sub-battery selected from said plurality of sub-batteries, and said one main battery, are discharged so as to supply electric power to the electric motor in the first running mode, and only said one main battery is charged and discharged in the second running mode;
the first running mode is selected until all of the charging rate estimated values of said one main battery and said plurality of sub-batteries are reduced down to corresponding control targets, and the second running mode is selected after all of the charging rate estimated values are reduced down to the corresponding control targets; and
the order in which said plurality of sub-batteries are used is determined, based on the degradation level of each of said plurality of sub-batteries, when the first running mode is selected.

6. The control system according to claim 1, wherein:
when the charging rate estimated value calculated according to the battery model belongs to a first region having a first value as an upper limit, the charging rate estimated value is calculated so that the charging rate estimated value becomes smaller than a corresponding value calculated according to the battery model; and
when the charging rate estimated value calculated according to the battery model belongs to a second region having, as a lower limit, a second value that is larger than the first value, the charging rate estimated value is calculated so that the charging rate estimated value becomes larger than a corresponding value calculated according to the battery model.

7. The control system according to claim 6, wherein, when the charging rate estimated value calculated according to the battery model belongs to one of the first and second regions, the charging rate estimated value is calculated by adding an offset value that varies according to the value calculated according to the battery model, to the charging rate estimated value.

8. The control system according to claim 6, wherein, when the charging rate estimated value calculated according to the battery model belongs to one of the first and second regions, the stored given parameter is corrected, based on the value calculated according to the battery model, and the charging rate estimated value is re-calculated using the corrected parameter.

9. The control system according to claim 1, wherein:
the given parameter is defined by an initial parameter value obtained in an initial state of said at least one secondary battery, and a rate of change of parameter representing a ratio of a parameter value in a current state of said at least one secondary battery to the initial parameter value;
the given parameter is stored as a combination of the initial parameter value and the rate of change of parameter; and
the rate of change of parameter is updated.

10. A method of controlling charge/discharge of a secondary battery of a vehicle including an electric motor operable to produce driving force, the secondary battery that supplies electric power to the electric motor, and a charging mechanism operable to charge the secondary battery using a power supply located outside the vehicle, comprising:
  collecting data, by an electronic control unit including program logic, used in a battery model for estimating the status of the secondary battery;
  storing, by the electronic control unit including the program logic, a given parameter which is used in the battery model and varies according to the status of the secondary battery;
  calculating, by the electronic control unit including the program logic, a first parameter based on the collected data during running of the vehicle, and correcting the stored given parameter based on the first parameter;
  calculating, by the electronic control unit including the program logic, a second parameter based on the collected data when the vehicle is at rest and the secondary battery is charged, and correcting the stored given parameter based on the second parameter;

calculating, by the electronic control unit including the program logic, an estimated value of charging rate of the secondary battery, using the battery model, based on the collected data and the given parameter; and controlling, by the electronic control unit including the program logic, discharge of the secondary battery based on the estimated value of charging rate, during running of the vehicle.

* * * * *